(12) United States Patent
Watanabe

(10) Patent No.: US 11,871,134 B2
(45) Date of Patent: Jan. 9, 2024

(54) SOLID-STATE IMAGING DEVICE, IMAGING SYSTEM, AND IMAGING METHOD

(71) Applicant: TOPPAN INC., Taito-ku (JP)

(72) Inventor: Takashi Watanabe, Hamamatsu (JP)

(73) Assignee: TOPPAN INC., Taito-ku (JP)

( * ) Notice: Subject to any disclaimer, the term of this patent is extended or adjusted under 35 U.S.C. 154(b) by 253 days.

(21) Appl. No.: 17/598,532

(22) PCT Filed: Feb. 5, 2020

(86) PCT No.: PCT/JP2020/004437
§ 371 (c)(1),
(2) Date: Sep. 27, 2021

(87) PCT Pub. No.: WO2020/202779
PCT Pub. Date: Oct. 8, 2020

(65) Prior Publication Data
US 2022/0182569 A1 Jun. 9, 2022

(30) Foreign Application Priority Data

Mar. 29, 2019 (JP) .................................. 2019-065937

(51) Int. Cl.
*H04N 25/75* (2023.01)
*H04N 25/77* (2023.01)
(Continued)

(52) U.S. Cl.
CPC .......... *H04N 25/75* (2023.01); *H04N 25/705* (2023.01); *H04N 25/77* (2023.01); *H04N 25/46* (2023.01)

(58) Field of Classification Search
CPC ...... H04N 25/75; H04N 25/705; H04N 25/77; H04N 25/46; G01S 7/4816; G01S 17/894;
(Continued)

(56) References Cited

U.S. PATENT DOCUMENTS 7,436,496 B2 10/2008 Kawahito
9,053,998 B2 * 6/2015 Mase ................ H01L 27/14612
(Continued)

FOREIGN PATENT DOCUMENTS

CN 102377952 A 3/2012
CN 102469271 A 5/2012
(Continued)

OTHER PUBLICATIONS

International Search Report dated Apr. 14, 2020 in PCT/JP2020/004437 filed on Feb. 5, 2020, 2 pages.
(Continued)

*Primary Examiner* — Padma Haliyur
(74) *Attorney, Agent, or Firm* — Oblon, McClelland, Maier & Neustadt, L.L.P.

(57) ABSTRACT

[Problem] To provide a solid-state imaging device enabling summed-readout mode and cyclic-readout mode.
[Solution]
A device includes virtual-pixel units implemented by pixels of transfer-route controlling-scheme, the virtual-pixel units having a shape of polygon, the polygons are tessellated. The virtual-pixel unit encompasses a photoelectric-conversion region, charge detectors to which ordinal numbers are labeled, configured to accumulate signal charges transferred from the photoelectric-conversion region, and transfer-control elements configured to control movement of signal charges from the photoelectric-conversion region to one of the charge detectors. N pieces of charge detectors of the same ordinal number are arranged in boundary between the photodiodes and the intersection-shared sites. The intersection-shared site encompasses N pieces of switching elements having first main electrode connected to the charge detec- (Continued)

tors, and common signal-readout circuit having input terminals connected to second main electrode of each of the switching elements.

19 Claims, 28 Drawing Sheets

(51) Int. Cl.
*H04N 25/705* (2023.01)
*H04N 25/46* (2023.01)

(58) Field of Classification Search
CPC ............ G01S 7/4863; H01L 27/14603; H01L 27/14612; H01L 27/14643
See application file for complete search history.

(56) References Cited

U.S. PATENT DOCUMENTS

| | | | |
|---|---|---|---|
| 9,681,037 B2 * | 6/2017 | Sugawara | ............ H04N 23/957 |
| 10,784,294 B2 | 9/2020 | Jin et al. | |
| 2018/0156898 A1 | 6/2018 | Suzuki et al. | |
| 2019/0391266 A1 * | 12/2019 | Mori | ........................ G02B 7/32 |
| 2020/0029047 A1 | 1/2020 | Jin et al. | |

FOREIGN PATENT DOCUMENTS

| | | | | |
|---|---|---|---|---|
| CN | 103972258 A | 8/2014 | | |
| CN | 104469200 A | 3/2015 | | |
| CN | 107888807 A | 4/2018 | | |
| EP | 3 550 330 A1 | 10/2019 | | |
| JP | 4235729 B2 | 3/2009 | | |
| JP | 2020-10328 A | 1/2020 | | |
| JP | 2020-13985 A | 1/2020 | | |
| WO | WO 2017/022220 A1 | 2/2017 | | |
| WO | WO 2018/101187 A1 | 6/2018 | | |
| WO | WO-2018101187 A1 * | 6/2018 | ............... | G01C 3/06 |
| WO | WO-2019035374 A1 * | 2/2019 | ............... | G02B 7/34 |

OTHER PUBLICATIONS

Yasutomi, K. et al., "A high-resolution time-of-flight range image sensor with a 3-tap lateral electric field charge modulator," IISW 2017, R24, 2017, pp. 254-257.
Lee, S., et al., "A Back-Illuminated Time-of-Flight Image Sensor with SOI-Based Fully Depleted Detector Technology for LiDAR Application," MDPI Proceedings, vol. 2, No. 13, 798, 2018, pp. 1-4.
Chinese Office Action dated Jul. 31, 2023, in Chinese Patent Application No. 202080023089.7 filed on Feb. 5, 2020, (13 pages).

* cited by examiner

FIG. 10

| | |
|---|---|
| Sig1(k-1) | G3[(i, j-1)+(i+1, j-1)+(i, j)+(i+1, j)] |
| Sig1(k) | G1[(i, j)+(i+1, j)+(i, j+1)+(i+1, j+1)] |
| Sig1(k+1) | G3[(i, j+1)+(i+1, j+1)+(i, j+2)+(i+1, j+2)] |
| Sig2(k-1) | G4[(i+1, j-1)+(i+2, j-1)+(i+1, j)+(i+2, j)] |
| Sig2(k) | G2[(i+1, j)+(i+2, j)+(i+1, j+1)+(i+2, j+1)] |
| Sig2(k+1) | G4[(i+1, j+1)+(i+2, j+1)+(i+1, j+2)+(i+2, j+2)] |

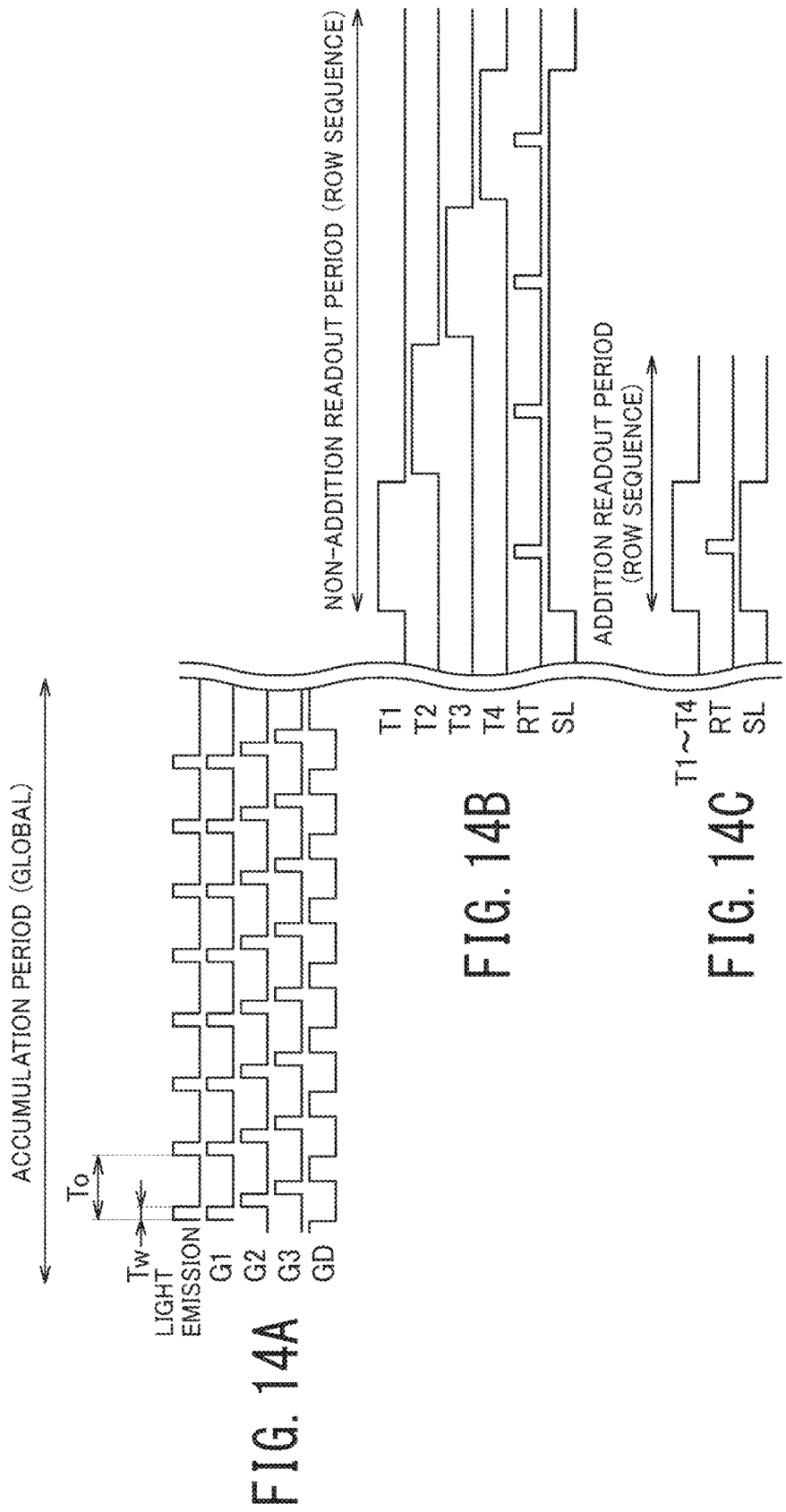

SOLID-STATE IMAGING DEVICE, IMAGING SYSTEM, AND IMAGING METHOD

CROSS-REFERENCE TO RELATED APPLICATIONS

The present application is a 35 U.S.C. § 371 national stage patent application of International patent application PCT/JP2020/004437, filed on Feb. 5, 2020, which is based on and claims the benefits of priority to Japanese Application No. 2019-065937, filed on Mar. 29, 2019. The entire contents of these applications are incorporated herein by reference.

TECHNICAL FIELD

The present invention relates to a solid-state imaging device used for range imaging, an imaging system and an imaging method using the solid-state imaging device.

BACKGROUND ART

Among methods for obtaining depth information of objects, an optical time-of-flight (TOF) method is known which performs range measurements by using flight times, when light reciprocates to and from the objects to be measured. That is, when irradiation light is reflected by an object, a range from the target can be determined using a delay of reflection light with respect to the irradiation light.

In the TOF method, a direct TOF scheme for directly measuring the delay time of the reflection light, and an indirect TOF scheme for measuring a phase delay of the reflection light are known. Even in the indirect TOF scheme, there are a pulse modulation (PM) architecture for determining the ranges from the targets using the phase delay of the irradiation light emitted in pulsed mode, and a continuous wave modulation (CW) architecture for determining the ranges from the targets using a phase delay of the irradiated light emitted in sine wave manner. In the following, although explanations of the PM architecture will be carried, the present invention can be applied to both PM and CW architectures. Also, the TOF pixels in the CMOS configuration will be discussed in the following, because the CMOS image sensor having the TOF pixels made by CMOS process, is advantageous for low power consumption and system integration, Various architectures of pixels for detecting the phase delay of the reflection light are proposed. Among the various architectures, a readout scheme, in which the phases are shifted from a common light detector to a plurality of readout elements, is used in general. In the present specification, a readout circuit for reading out signals from the light detector is referred to as "a tap", in the following. It is enough that the number of the taps is two at the minimum. However, as recited in PTL 1, three or more is desirable in which background light can be removed by embedding "a charge-exhaust element", and if the number of the taps is four, it is possible to perform a triple-tap and a single charge-exhaust element configuration, as recited in NPTL 1 or perform a quadruple-tap operation, as recited in NPTL 2.

When making higher resolution of the range imaging system for obtaining the range-measuring imaging, which has an array of many CMOS TOF pixels, by increasing the number of the CMOS TOF pixels, the decrease of the range-measurement precision is inevitable, ascribable to the drops in the sensibility and the number of saturated electrons with the reduction of the pixel sizes. As one of the countermeasures against the decrease in the range-measurement precision, a scheme of additions between the adjacent pixels is known. In the present specification, in the following, the scheme of executing the mathematical addition between the adjacent pixels is referred to as "binning". However, the binning in the quadruple-tap pixels is not easy to achieve, because the configurations of the quadruple-tap pixels become very complex.

CITATION LIST

Patent Literature

[PTL 1] JP-P4235729

Non-Patent Literature

[NPTL 1] K. Ando et. al, "A high-resolution time-of-flight range image sensor with a 3-tap lateral electric field charge modulator", 2017 International Image Sensor Workshop (IISW), R24, pp. 254-257, Hiroshima City, May 31, 2017

[NPTL 2] S. Lee et al, "A Back-Illuminated Time-of-Flight Image Sensor with SOI-Based Fully Depleted Detector technology for LiDAR Application", Proceedings of Multi-disciplinary Digital Publishing Institute (MDPI), vol. 2, no. 13, 798. 2018

SUMMARY OF INVENTION

Technical Problem

Considering the above problems, an objective of the present invention is to provide a solid-state imaging device, which enables both of a summed-readout mode of signals from a plurality of pixels arranged in a pixel-array area and a cyclic-readout mode of individual signals from each pixel, and an imaging system and an imaging method, each of which uses the solid-state imaging device.

Solution to Problem

A first aspect of the present invention inheres in a solid-state imaging device including a plurality of virtual-pixel units implemented by pixels of transfer-route controlling-scheme, each of the virtual-pixel units having a shape of polygon, the polygons are tessellated in a pixel-array area, each of the virtual-pixel units encompassing a photoelectric-conversion region, a plurality of charge detectors to which ordinal numbers are labeled in order, configured to accumulate signal charges transferred from the photoelectric-conversion region, and a plurality of transfer-control elements configured to control movement of signal charges from the photoelectric-conversion region to one of the charge detectors. In the solid-state imaging device pertaining to the first aspect of the present invention, the arrangement of polygons further encompasses (a) a plurality of intersection-shared sites, each of the intersection-shared sites is surrounded by the charge detectors, which have the same ordinal number and are disposed respectively at vertices of the polygons, such that respective vertices of the polygons are in contact with an intersection point of meshes implemented by outer shapes of the virtual-pixel units, the intersection point is allocated in a center of each of the intersection-shared sites, a space of each of the intersection-shared sites is provided to a cut-away space generated by cutting away each of the vertices mating toward the intersection point, the plurality of intersection-shared sites are periodically arranged, and (b) a plurality of photodiodes, each of which includes the photoelectric-conversion region, are arranged in a remaining space of the cut-away space in the virtual-pixel units so that a tessellation topology of the polygons is divided and re-assigned to the cut-away space and the remaining space. Furthermore, in the solid-state imaging device pertaining to the first aspect of the present invention, with "N" as positive integers of three or more, N pieces of the charge detectors of the same ordinal number are arranged in each boundary between the photodiodes and the intersection-shared sites. And, each of the intersection-shared sites encompasses N pieces of switching elements, each having first main electrode being connected to the charge detectors, respectively in order, and a common signal-readout circuit having input terminals connected to a second main electrode of each of the switching elements.

A second aspect of the present invention inheres in an imaging system encompassing (a) a light source configured to project irradiated light to an object, and (b) a solid-state imaging device including a plurality of virtual-pixel units implemented by pixels of transfer-route controlling-scheme, each of the virtual-pixel units having a shape of polygon, the polygons are tessellated in a pixel-array area. Each of the virtual-pixel units encompasses a photoelectric-conversion region to which a reflection light is supposed to be entered, the reflection light is ascribable to the irradiation light reflected by the object, a plurality of charge detectors to which ordinal numbers are labeled in order, configured to accumulate signal charges transferred from the photoelectric-conversion region, and a plurality of transfer-control elements configured to control movement of signal charges from the photoelectric-conversion region to one of the charge detectors. In the imaging system pertaining to the second aspect of the present invention, the arrangement of polygons further encompassing a plurality of intersection-shared sites, each of the intersection-shared sites is surrounded by the charge detectors, which have the same ordinal number and are disposed respectively at vertices of the polygons, such that respective vertices of the polygons are in contact with an intersection point of meshes implemented by outer shapes of the virtual-pixel units, the intersection point is allocated in a center of each of the intersection-shared sites, a space of each of the intersection-shared sites is provided to a cut-away space generated by cutting away each of the vertices mating toward the intersection point, the plurality of intersection-shared sites are periodically arranged, and a plurality of photodiodes, each of which includes the photoelectric-conversion region, are arranged in a remaining space of the cut-away space in the virtual-pixel units so that a tessellation topology of the polygons is divided and re-assigned to the cut-away space and the remaining space. Furthermore, in the imaging system pertaining to the second aspect of the present invention, with "N" as positive integers of three or more. N pieces of the charge detectors of the same ordinal number are arranged in each boundary between the photodiodes and the intersection-shared sites. And, each of the intersection-shared sites encompasses N pieces of switching elements, each having first main electrode being connected to the charge detectors, respectively in order, and a common signal-readout circuit having input terminals connected to a second main electrode of each of the switching elements.

A third aspect of the present invention inheres in an imaging method with a solid-state imaging device having a tessellation topology with an array of polygons, each of the polygons is defined as a virtual-pixel unit, which has a pixels of transfer-route controlling-scheme, the tessellation topology of the polygons is re-assigned to a cut-away space for intersection-shared sites having an intersection point of meshes implemented by outer shapes of the virtual-pixel units at a center, and a remaining space of the cut-away space for photodiodes, each of the intersection-shared sites is provided in cut-away space generated by cutting away each of the vertices of the polygons mating toward the intersection point. The imaging method pertaining to the third aspect of the present invention includes the steps of switching (a) a mode of sequentially reading out N sets of individual signals from N pieces of charge detectors labeled with same ordinal number, each of the charge detectors is arranged in a boundary between the photodiodes and the intersection-shared sites, and (b) a mode of simultaneously reading out N sets of individual signals, in each of the intersection-shared sites. Here, N is positive integers of three or more, Advantageous Effects of Invention According to the present invention, it is possible to provide the solid-state imaging device, which enables both of the summed-readout mode of the signals from the plurality of pixels in the pixel-array area and the cyclic-readout mode of the individual signals from each pixel, and the imaging system and the imaging method each of which uses the solid-state imaging device.

BRIEF DESCRIPTION OF DRAWINGS

FIG. 10 is a timing chart explaining a summed-readout mode of the signals from the pixels in the solid-state imaging device pertaining to the first embodiment;

FIGS. 14A, 14B and 14C are timing charts explaining driving/readout methods in the solid-state imaging device pertaining to the second embodiment;

DESCRIPTION OF EMBODIMENTS

Figure 1:
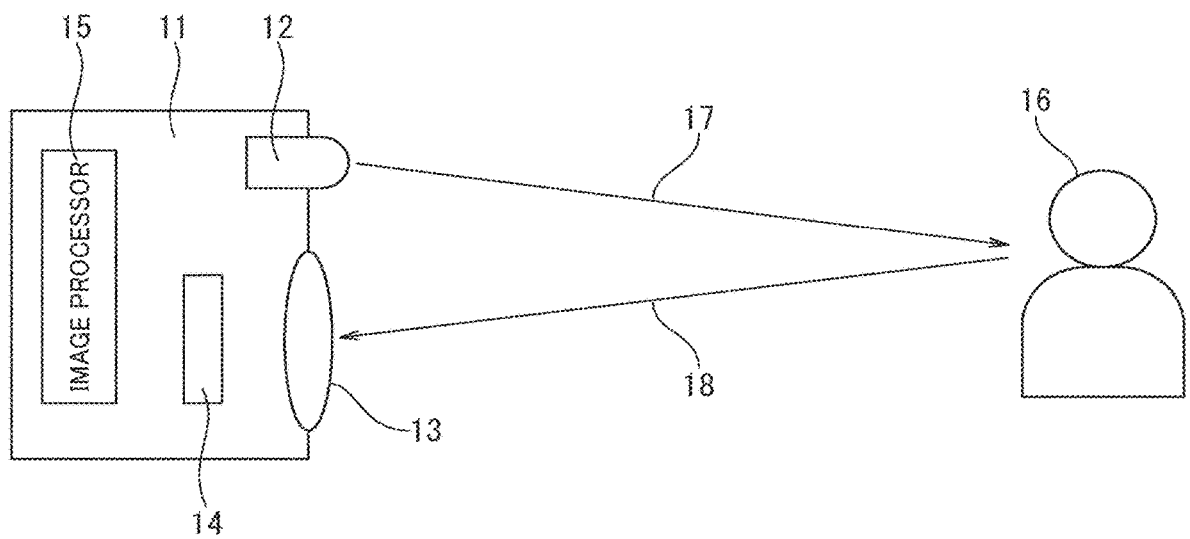
FIG. 1 is a block diagram illustrating a part of an example of an imaging system pertaining to a first embodiment of the present invention.

Hereinafter, first to fourth embodiments of the present invention will be described with reference to the Drawings. Note that, in the following description of the Drawings, the same or similar reference numerals denote the same or similar elements and portions. However, because the drawing is merely diagrammatic, attention should be paid to a fact that a relationship between a thickness and a planar dimension, ratios between thicknesses of respective layers and the like differ from actual values. Hence, the concrete thicknesses and dimensions should be judged by referring to the following explanations. Also, it is natural that a portion in which the mutual dimensional relations and ratios differ from each other are included even between the mutual drawings.

In addition, it should be noted that the following first to fourth embodiments each illustrate a device or method embodying the technical ideas of the present invention. The technical ideas of the present invention are not intended to be limited to the following configurations or arrangement of circuit elements and circuit blocks, or alternatively, are not intended to be limited to the following layout on the semiconductor chips described below. Various modifications will be apparent to those skilled in the art within the technical ideas of the present invention.

Also, in the following explanations of the first to fourth embodiments of the present invention, a case when a first conductivity type is "a p-type" and a second conductivity type is "an n-type" is exemplified. However, by inversely selecting the conductivity type, the first conductivity type may be "the n-type", and the second conductivity type may be "the p-type". It is apparent to those skilled in the art that, when the conductivity type is inversely assigned, "the high-level" and "the low-level" in pulsed waveforms shall be appropriately inversely elected, if necessary.

For example, in the following FIGS. 2, 4 and so on, for the sake of explanatory convenience, topologies are illustrated in which a plurality of pixel units are arrayed in a shape of two-dimensional matrix, in a pixel-array area. However, because the topologies illustrated in FIGS. 2, 4 and so on are merely simple exemplifications, a layout of line sensor may be used in which a plurality of the pixel units is one-dimensionally arrayed in a pixel-array area.

First Embodiment

FIG. 1 illustrates a part of a configuration of an imaging system 11 pertaining to the first embodiment of the present invention, that enables a TOF range imaging. Here, the part of the imaging system 11 illustrated in FIG. 1 is implemented by a light source 12 for projecting an irradiated light 17 to an object 16, an image-generating optical-system 13 to which a reflection light 18 is entered after the irradiated light 17 is reflected by the object 16, a TOF solid-state imaging device 14, and an image processor 15.

Figure 2:
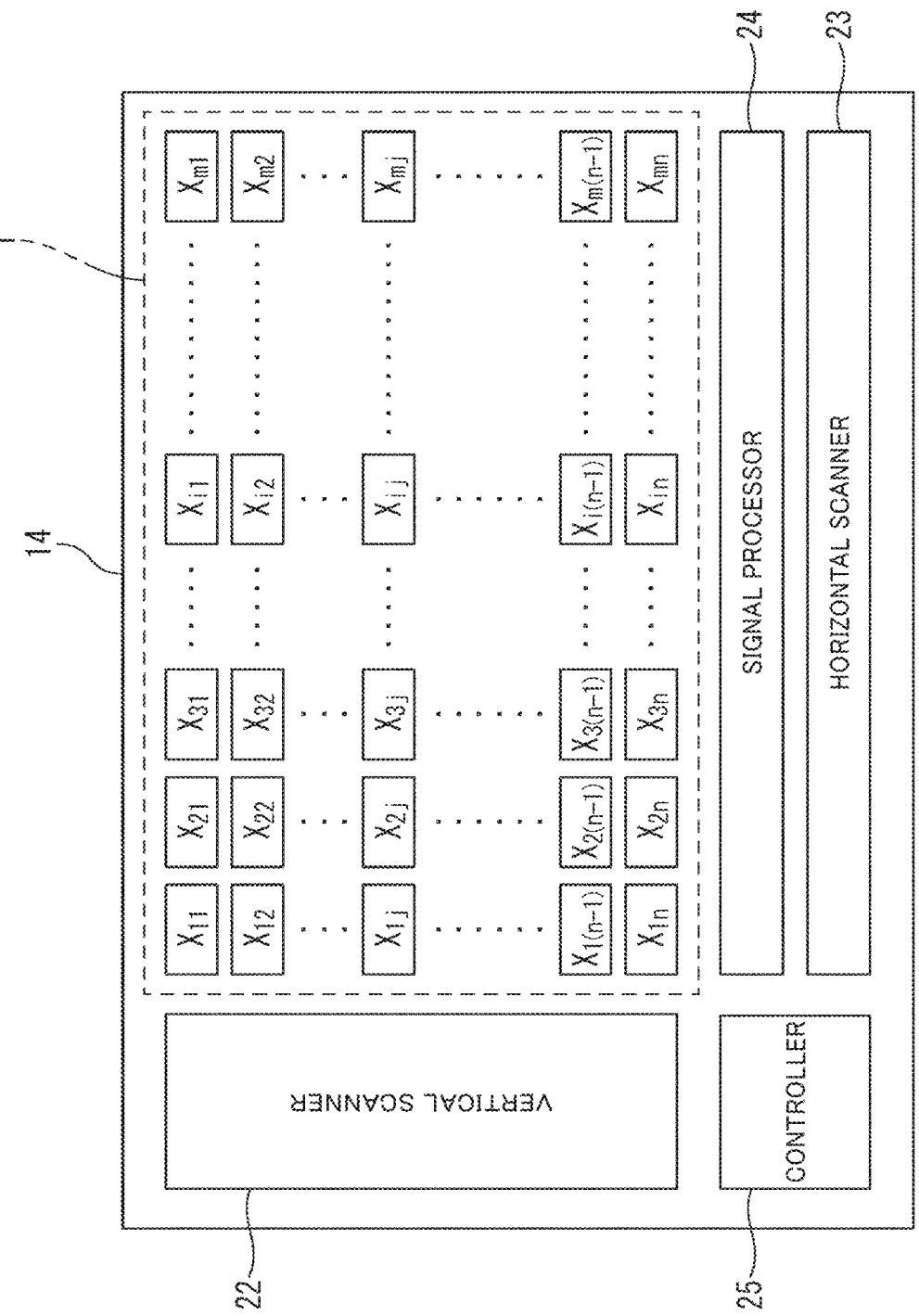
FIG. 2 is a block diagram illustrating an example of a configuration of a solid-state imaging device pertaining to the first embodiment.

FIG. 2 illustrates a part of a configuration of the solid-state imaging device 14 illustrated in FIG. 1. As illustrated in FIG. 2, in the solid-state imaging device 14 pertaining to the first embodiment, virtual-pixel units $X_{i,j}$ (i=1 to $m_1$ and j=1 to $n_1$: each of the $m_1$ and the $n_1$ are positive integers of two or more), each of which includes a plurality of pixels with transfer-route controlling-schemes, are arrayed in mesh in a pixel-array area 1. That is, the pixel-array area 1 is filled by the virtual-pixel units $X_{i,j}$ in tessellation topology, or by geometric planar tiling, such that virtual-pixel units $X_{i,j}$ fill the pixel-array area 1 of a plane without generating overlaps or gaps, thereby enabling a quadruple-tap range-imaging. The "pixel of transfer-route controlling-scheme" means the pixel that can independently control movement of signal charges, by sorting the transfer routes and the transfer directions of the signal charges, respectively. Conventionally, such sorting architecture of the transfer routes and the transfer directions in the pixel of transfer-route controlling-scheme is known as the operation scheme by "TOF pixel".

As proved by Pythagoras of Samos, regular triangles, regular squares and regular hexagons are the only three kinds of regular polygons, which tessellate by themselves with translational symmetry and two-fold rotational symmetry, or the mirror-image pair of tile patterns, without generating any gap. However, if the condition of the regular polygon is removed, and further rotations are allowed, any triangle or tetragon including non-convex shapes can be tessellated so as not to generate any gap. In the solid-state imaging device 14 pertaining to the first embodiment illustrated in FIG. 2, as an example, since the tetragonal virtual-pixel units $X_{i,j}$ are arrayed in the mesh, the pixel-array area 1 is tessellated so as not to generate any gap.

Moreover, in the solid-state imaging device pertaining to the first embodiment, a vertical scanner 22 and a horizontal scanner 23, which drive the respective pixels, and a signal processor 24 for processing signals from the pixels, and a controller 25 for entirely controlling the vertical scanner 22, the horizontal scanner 23 and the signal processor 24 are arranged around the pixel-array area 1.

Figure 3:
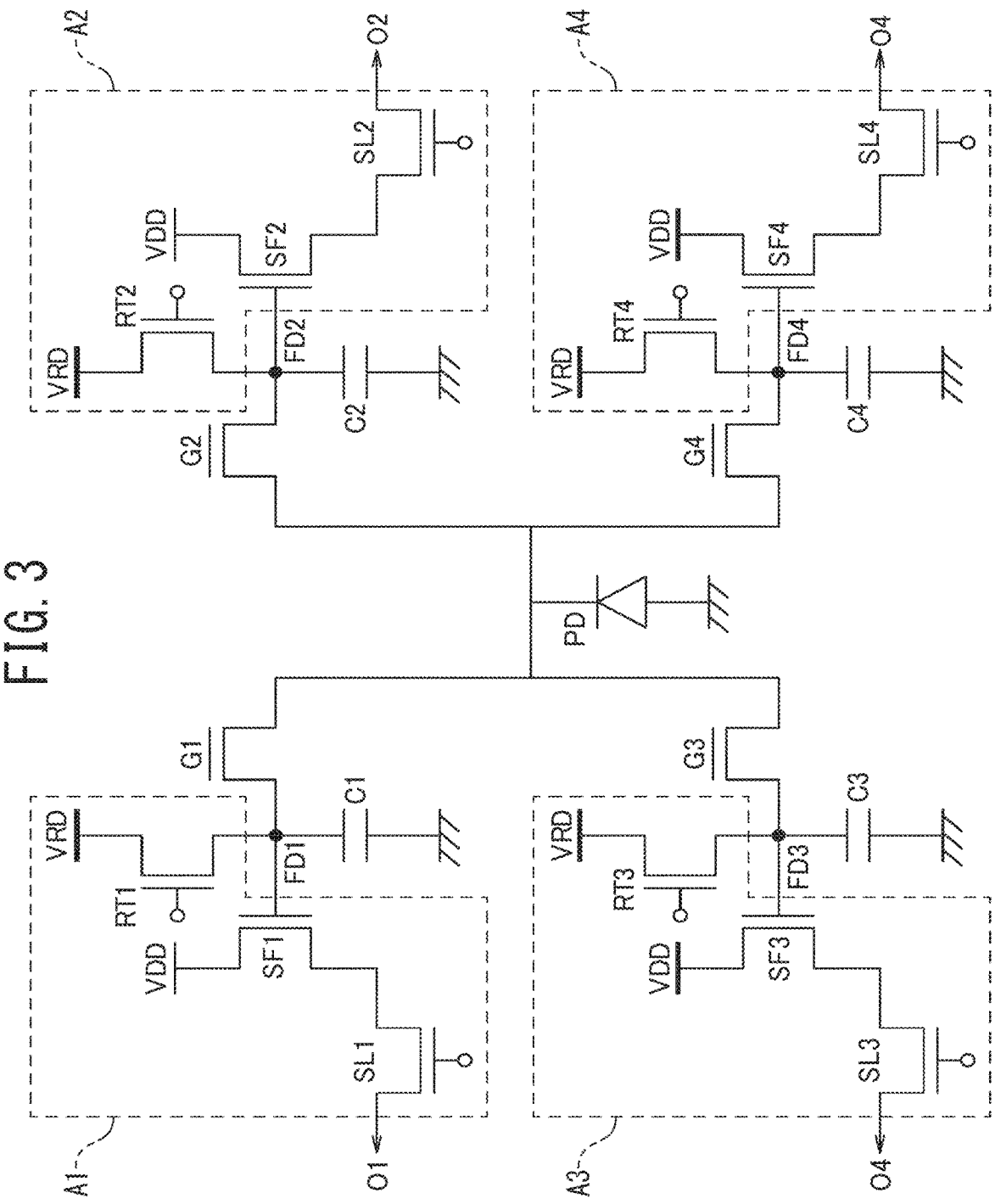
FIG. 3 is a circuit diagram illustrating an example of an equivalent circuit of a pixel, which includes signal-readout circuit of the solid-state imaging device pertaining to the first embodiment.

FIG. 3 illustrates an equivalent circuit configuration of the virtual-pixel unit $X_{i,j}$, by which the TOF range imaging is executed, using the solid-state imaging device pertaining to the first embodiment of the present invention. The virtual-pixel unit $X_{i,j}$ that implements a tetragon, belonging to one kind of "tessellating shape" in geometric mathematics. The virtual-pixel unit $X_{i,j}$ encompasses a single photodiode PD, which serves as a constituent element in the pixel for transfer-route controlling-scheme, and quadruple transfer-control mechanisms connected to the single photodiode PD.

By the way, the "tessellating shape" used in the present specification means the shape in which a flat surface can be perfectly edge-to-edge filled with a single kind of pattern only by the parallel movement and the inversion, so as not to generate any gap such as small triangles and the like. If only a single shape of tile is allowed, the theory that regular tessellations with the edge-to-edge tiling are possible for only three regular polygons of regular triangle, regular tetragon and regular hexagon was proved by Pythagoras, and regular triangle, regular tetragon and regular hexagon are referred as "regular tessellation shape". Similarly, the terms of "tessellation" and "flat-tiling" that are used in the present specification mean that the flat surface is perfectly filled so as not to generate any gap such as small triangles and the like. The tessellations are not limited to the edge-to-edge tiling by the regular polygons. Therefore, if operations of rotation are allowed, the edge-to-edge tiling by irregular polygons will be possible, as explained in "the other embodiments" and the like, in the later paragraphs of the present specification.

Each of the quadruple transfer-control mechanisms can be distinguished, by labeling the first to fourth ordinal numbers (ordinal numerals) to the corresponding taps, such as a first transfer-control element G1, a second transfer-control element G2, a third transfer-control element G3 and a fourth transfer-control element G4, respectively. The first transfer-control element G1, the second transfer-control element G2, the third transfer-control element G3 and the fourth transfer-control element G4 are assigned to the corresponding taps to build up a quadruple-tap pixel. The first transfer-control element G1, the second transfer-control element G2, the third transfer-control element G3 and the fourth transfer-control element G4 control each of the transfer routes and the transfer directions of signal charges, which are independently assigned to each of the quadruple taps.

Figure 24:
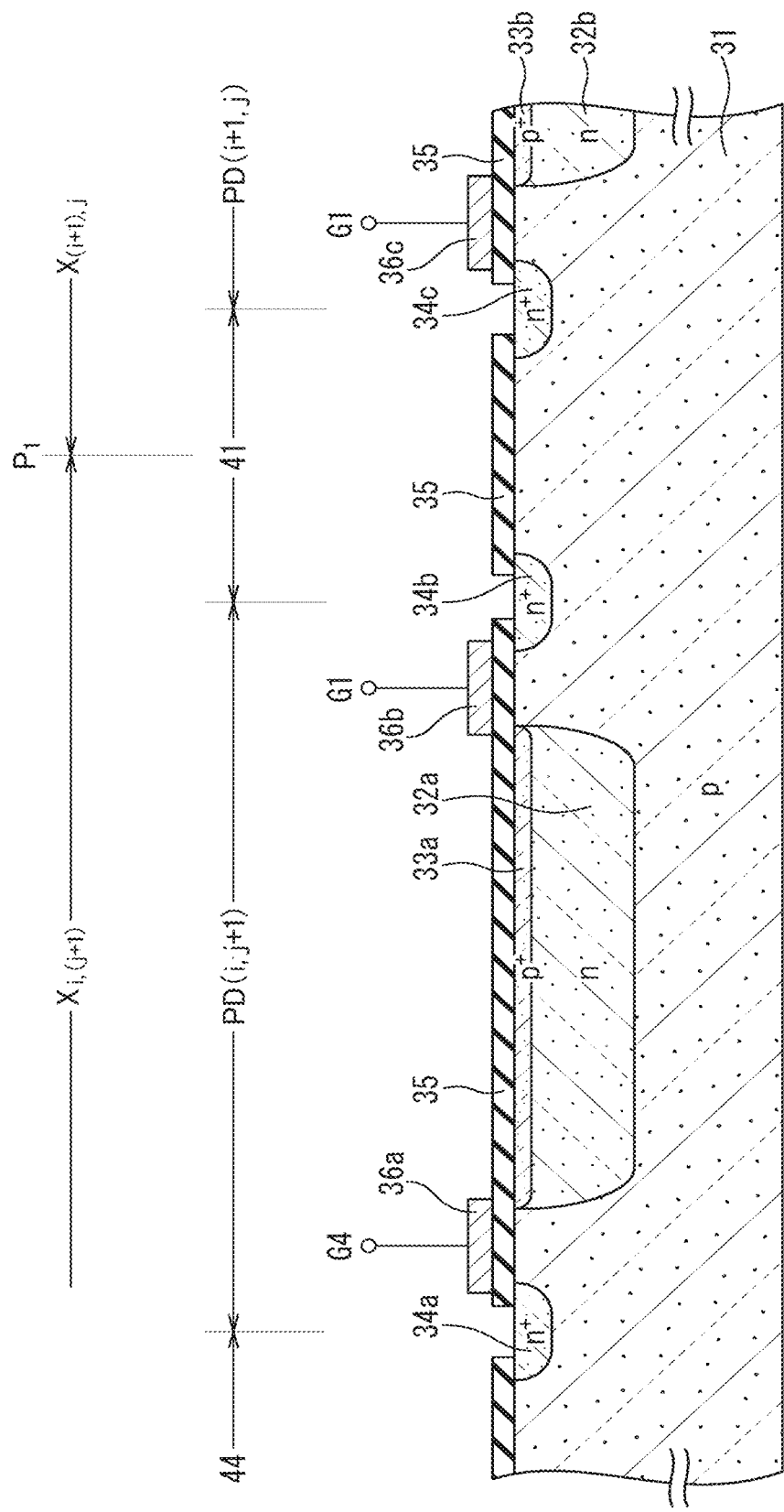
FIG. 24 is a schematic view explaining a lough section corresponding to a constituent element of the pixel-array area in the solid-state imaging device pertaining to the first embodiment, taken from XXIV-XXIV direction in FIG. 23.

Each of the first transfer-control element G1, the second transfer-control element G2, the third transfer-control element G3 and the fourth transfer-control element G4 may be implemented by an insulated-gate structure, similar to a MOS transistor as illustrated in FIG. 24, or may be implemented by a lateral electric-field charge-modulator (LEFM) structure. FIG. 24 illustratively explains the transfer-control mechanism of the insulated-gate structures in which surface potentials of a semiconductor substrate 31 of a first conductivity type (p-type) are controlled by gate electrodes 36a, 36b and 36c provided on gate insulating films 35.

A first charge detector FD1, a second charge detector FD2, a third charge detector FD3 and a fourth charge detector FD4 are distinguished by ordinal numbers, respectively, and connected to the quadruple transfer-control elements G1 to G4, respectively. In FIG. 3, the other terminal of a first detector capacitor C1 whose one terminal is grounded is connected to the first charge detector FD1 so that an accumulation capacitance of the first charge detector FD1 can be increased. Similarly, the other terminal of a second detector capacitor C2 whose one terminal is grounded is connected to the second charge detector FD2 so that an accumulation capacitance of the second charge detector FD2 can be increased.

FIG. 24 illustratively explains a configuration that a photoelectric-conversion region of a pixel in the virtual-pixel units $X_{i,(j+1)}$ is implemented by p-n junction of a p-type semiconductor substrate 31 and a surface-buried region 32a of second conductivity type (n-type), which is selectively buried in an upper portion of the semiconductor substrate 31. A $p^+$ type pinning layer 33a is arranged on the surface-buried region 32a. As illustrated in FIG. 24, regions ($n^+$ regions) 34a, 34b and 33c, to which n-type impurities are heavily doped, are buried separately from each other on the upper portion of the semiconductor substrate 31.

As illustrated in FIG. 24, a gate insulating film 35 is provided on an upper surface of the semiconductor substrate 31. The first transfer-control element G1 of the insulated-gate structure is implemented by the gate electrode 36b provided on the gate insulating film 35. The signal charges of the photodiode PD (i, j+1) are transferred to the first charge detector FD1 implemented by the $n^+$ region 34b. Also, the fourth transfer-control element G4 of the insulated-gate structure is implemented by the gate electrode 36a provided on the gate insulating film 35, and the signal charges of the photodiode PD (i, j+1) are transferred to the fourth charge detector FD4 implemented by the $n^+$ region 34a. Moreover, the first transfer-control element G1 of the insulated-gate structure is implemented by the gate electrode 36c provided on the gate insulating film 35 in FIG. 24, and the signal charges of the photodiode PD (i+1, j) are transferred to the first charge detector FD1 of the photodiode PD (i+1, j) implemented by the n$^+$ region 34c. As just described, FIG. 24 illustratively exemplifies the structure and the corresponding operation principle of the virtual-pixel units $X_{i,(j+1)}$.

Moreover, as illustrated in FIG. 3, the other terminal of a third detector capacitor C3 whose one terminal is grounded is connected to the third charge detector FD3, and the other terminal of a fourth detector capacitor C4 whose one terminal is grounded is connected to the fourth charge detector FD4. Consequently, it is possible to increase each accumulation capacitance of the third detector capacitor C3 and the fourth detector capacitor C4. However, in FIG. 3, the first detector capacitor C1, the second detector capacitor C2, the third detector capacitor C3 and the fourth detector capacitor C4 which are added to the charge detectors FD1 to FD4, respectively, may be discrete capacitive elements that are intentionally provided, or may be unintentional parasitic capacitances. For example, each of the quadruple detection capacitors C1 to C4 may be junction capacitances of the charge detectors FD1 to FD4.

In FIG. 3, a source terminal of a first reset transistor RT1 whose drain terminal is connected to a power-supply wiring VRD is connected to the first charge detector FD1. Similarly, a source terminal of a second reset transistor RT2 whose drain terminal is connected to the power-supply wiring VRD is connected to the second charge detector FD2. Moreover, a source terminal of a third reset transistor RT3 whose drain terminal is connected to the power-supply wiring VRD is connected to the third charge detector FD3, and a source terminal of a fourth reset transistor RT4 whose drain terminal is connected to the power-supply wiring VRD is connected to the fourth charge detector FD4. Each potential of the respective charge detectors FD1 to FD4, which is caused by the accumulation of the signal charges in each of the charge detectors FD1 to FD4, is reset, or is initialized by each of the first reset transistor RT1, the second reset transistor RT2, the third reset transistor RT3 and the fourth reset transistor RT4.

In FIG. 3, a gate terminal of a first source-follower transistor SF1 is connected to the first charge detector FD1. Similarly, a gate terminal of a second source-follower transistor SF2 is connected to the second charge detector FD2. Moreover, a gate terminal of a third source-follower transistor SF3 is connected to the third charge detector FD3, and a gate terminal of a fourth source-follower transistor SF4 is connected to the fourth charge detector FD4. A drain terminal of the first source-follower transistor SF1 is connected to a power-supply wiring VDD, and a source terminal of the first source-follower transistor SF1 is connected to a source terminal of a first select transistor SL1. Similarly, a drain terminal of the second source-follower transistor SF2 is connected to the power-supply wiring VDD, and a source terminal of the second source-follower transistor SF2 is connected to a source terminal of a second select transistor SL2.

Moreover, a drain terminal of the third source-follower transistor SF3 is connected to the power-supply wiring VDD, and a source terminal of the third source-follower transistor SF3 is connected to a source terminal of a third select transistor SL3. Still, a drain terminal of the fourth source-follower transistor SF4 is connected to the power-supply wiring VDD, and a source terminal of the fourth source-follower transistor SF4 is connected to a source terminal of a fourth select transistor SL4.

The reset potential of the first charge detector FD1 and the signal potential of the first charge detector FD1, after the process of signal transfer, are amplified by the first source-follower transistor SF1, and then, are transmitted as first output signals O1 from the drain terminals of the first select transistor SL1. And, the reset potential of the second charge detector FD2 and the signal potential of the second charge detector FD2, after the process of the signal transfer, are amplified by the second source-follower transistor SF2, and then, are transmitted as second output signals O2 from the drain terminals of the second select transistor SL2. Similarly, the respective reset potentials of the third charge detector FD3 and the fourth charge detector FD4, and the respective signal potentials of the third charge detector FD3 and the fourth charge detector FD4, after the processes of the signal transfers, are amplified by the respective third source-follower transistor SF3 and fourth source-follower transistor SF4, and then, are transmitted as third output signal O3 and fourth output signals O4, from the drain terminals of the third select transistor SL3 and the fourth select transistor SL4, respectively. A correlated double sampling (CDS) process, in which a difference between the reset and signal potentials is calculated by the signal processor 24 illustrated in FIG. 2, is executed with the reset potentials and the signal potentials, which are read out as each of the output signals O1 to O4, and net signals will be obtained.

As illustrated in FIG. 2, the quadruple-tap solid-state imaging device 14 pertaining to the first embodiment is build up by arraying the virtual-pixel units $X_{i,j}$ illustrated in FIG. 3 in the shape of the two-dimensional matrix, or the mesh, so as to fill the pixel-array area 1. An architecture which enables both cyclic-readout mode and summed-readout mode in the solid-state imaging device pertaining to the first embodiment will be explained with reference FIG. 4. Here, the cyclic-readout mode reads out signals from discrete pixels, sequentially, and the summed-readout mode reads out signals through an intersection-shared site in the grid of two-by-two (2×2) pixels in the solid-state imaging device pertaining to the first embodiment. With regard to the virtual-pixel units $X_{i,j}$, $X_{i,(j+1)}$, $X_{(i+1),j}$, $X_{(i+1),(j+1)}$, which are deployed as constituent elements of the pixel-array area 1 in the solid-state imaging device 14, carrying out the quadruple-tap TOF operation, FIG. 4 illustrates the respective photodiodes PDs, and the first transfer-control element G1, the second transfer-control element G2, the third transfer-control element G3 and the fourth transfer-control element G4. In the center of FIG. 4, a photodiode PD (i, j), a photodiode PD (i+1, j), a photodiode PD (i, j+1) and a photodiode PD (i+1, j+1) of the virtual-pixel units $X_{i,j}$, $X_{i,(j+1)}$, $X_{(i+1),j}$, $X_{(i+1),(j+1)}$ are illustrated respectively.

The virtual-pixel units $X_{i,j}$, $X_{i,(j+1)}$, $X_{(i+1),j}$, $X_{(i+1),(j+1)}$ are arranged in the shape of the two-dimensional matrix, or the two-dimensional mesh and tessellated so as not to generate any gap. As to each of the quadruple transfer-control mechanisms of adjacent quadruple virtual-pixel units $X_{i,j}$, $X_{i,(j+1)}$, $X_{(i+1),j}$, $X_{(i+1),(j+1)}$, the respective positions of the virtual-pixel units $X_{i,j}$, $X_{i,(j+1)}$, $X_{(i+1),j}$, $X_{(i+1),(j+1)}$ are mated in such a way that the transfer-control mechanisms of the same labeled ordinal number, which are distinguished and classified on the basis of the same ordinal number, are located close to each other. The above arrangement establishes "a same-ordinal-number encircled-space", in which a mode-switching circuit for the adjacent virtual-pixel units $X_{i,j}$, $X_{i,(j+1)}$, $X_{(i+1),j}$, $X_{(i+1),(j+1)}$ is surrounded by the transfer-control mechanisms of the same performance and behavior, which have the same ordinal number.

A same-ordinal-number encircled-space has a space of tetragon surrounded by quadruple adjacent first transfer-control elements G1. And, the space of tetragon surrounded by the quadruple adjacent first transfer-control elements G1 is re-assigned as "a first intersection-shared site 41". The first intersection-shared site 41 is the space whose center is allocated at an intersection point $P_1$ of meshes, which are defined by quadruple outlines of quadruple virtual-pixel units $X_{i,j}$, $X_{i,(j+1)}$, $X_{(i+1),j}$, $X_{(i+1),(j+1)}$ illustrated in FIG. 22A so that the intersection point $P_1$ can be shared by the quadruple virtual-pixel units $X_{i,j}$, $X_{i,(j+1)}$, $X_{(i+1),j}$, $X_{(i+1),(j+1)}$. The first intersection-shared site 41 is a tetragonal space, which is generated and re-assigned by chamfering each of the quadruple vertices, or quadruple vertex points, and the first intersection-shared site 41 is located at the space toward which the quadruple first transfer-control element G1 of each of the quadruple virtual-pixel units $X_{i,j}$, $X_{i,(j+1)}$, $X_{(i+1),j}$, $X_{(i+1),(j+1)}$ are mated, as illustrated in FIG. 22B.

Similarly, a same-ordinal-number encircled-space delineating a tetragon surrounded by the quadruple adjacent second transfer-control elements G2 is generated and re-assigned as "a second intersection-shared site 42". The second intersection-shared site 42 is a space whose center is allocated at an intersection point $P_2$ of meshes defined by quadruple outlines of quadruple virtual-pixel units $X_{(i-1),j}$, $X_{(i-1),(j+1)}$, $X_{i,j}$, $X_{j,(j+1)}$ illustrated in FIG. 22A, in which the intersection point $P_2$ is shared by the quadruple virtual-pixel units $X_{(i-1),j}$, $X_{(i-1),(j+1)}$, $X_{i,j}$, $X_{i,(j+1)}$. The second intersection-shared site 42 is a tetragonal space, which is generated and re-assigned by chamfering each of the quadruple vertex points, at which each second transfer-control element G2 of the quadruple virtual-pixel units $X_{(i-1),j}$, $X_{(i-1),(j+1)}$, $X_{i,j}$, $X_{i,(j+1)}$ is located, which allocate the intersection point $P_2$ at a center as illustrated in FIG. 22B.

Moreover, same-ordinal-number encircled-spaces delineating tetragons, respectively surrounded by the quadruple adjacent third transfer-control elements G3 and the quadruple adjacent fourth transfer-control element G4, are defined respectively as "a third intersection-shared site 43" and "a fourth intersection-shared site 44". The third intersection-shared site 43 is a space whose center is allocated at an intersection point $P_3$ of meshes defined by quadruple outlines of quadruple virtual-pixel units $X_{i,(j+1)}$, $X_{i,(j+2)}$, $X_{(i+1),(j+1)}$, $X_{(i+1),(j+2)}$ illustrated in FIG. 22A, in which the intersection point $P_3$ is shared. The third intersection-shared site 43 is a tetragonal space, which is generated and re-assigned by chamfering each of the quadruple vertex points, at which each third transfer-control element G3 of the quadruple virtual-pixel units $X_{i,(j+1)}$, $X_{i,(j+2)}$, $X_{(i+1),(j+1)}$, $X_{(i+1),(j+2)}$ are mated, which allocate the intersection point $P_3$ at a center as illustrated in FIG. 22B.

Figure 22A:
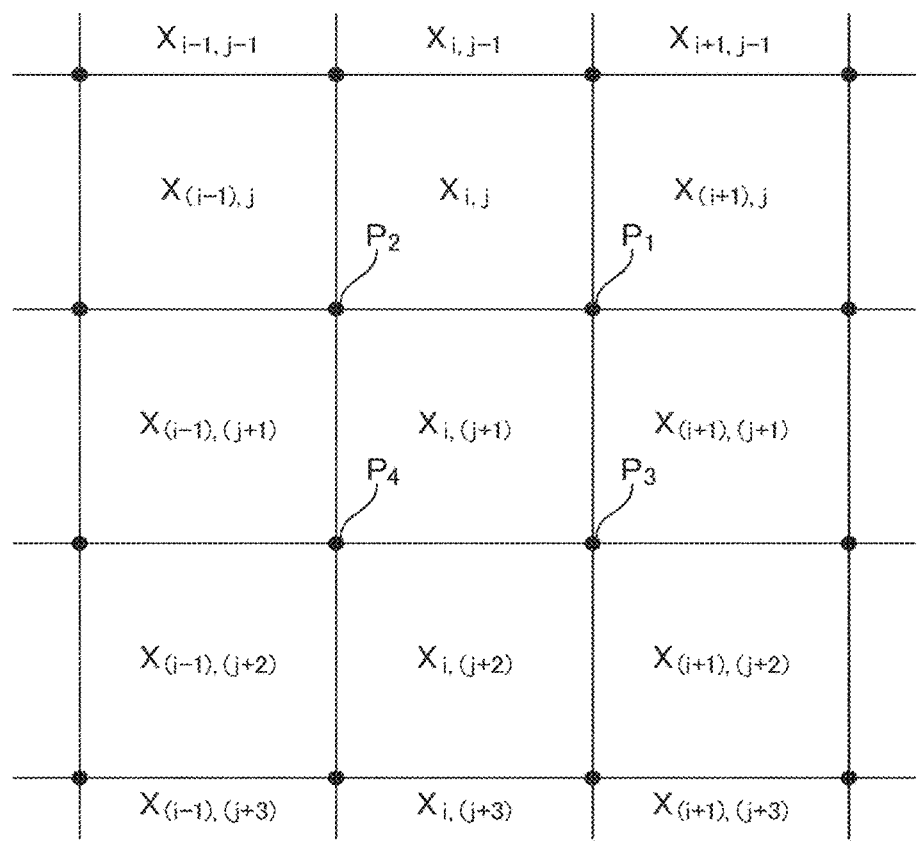
FIG. 22A is a view explaining a technical idea in which tiles are laid so as not to generate any gap, supposing a pixel unit constructing a pixel-array area in the solid-state imaging device pertaining to the first embodiment as one square tile.
Figure 22B:
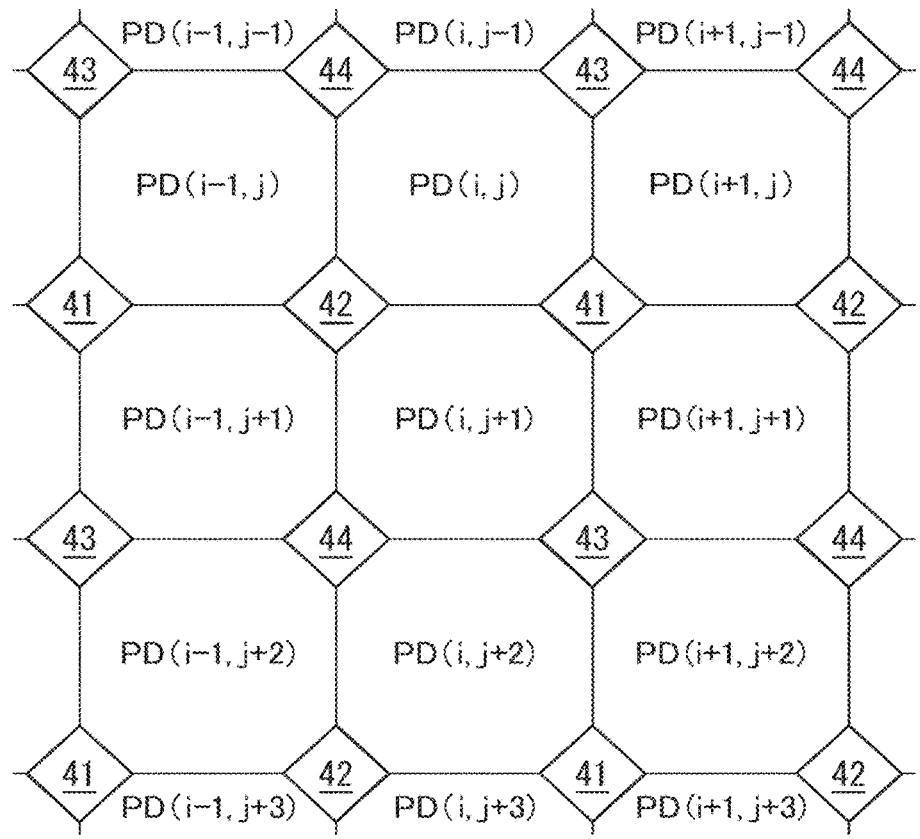
FIG. 22B is a view explaining a technical idea in which the pixel-array area in the solid-state imaging device pertaining to the first embodiment is tiled by using two shapes of tiles, which include a first octagonal tile corresponding to the photodiode and a second tetragonal tile corresponding to a pattern of the intersection-shared site.

The fourth intersection-shared site 44 is a space whose center is allocated at an intersection point $P_4$ of meshes defined by quadruple outlines of quadruple virtual-pixel units $X_{(i-1),(j+1)}$, $X_{(i-1),(j+2)}$, $X_{i,(j+1)}$, $X_{i,(j+2)}$ illustrated in FIG. 22A, in which the intersection point $P_4$ is shared. The fourth intersection-shared site 44 is a tetragonal space, which is generated and re-assigned by chamfering each of the quadruple vertex points, at which each fourth transfer-control element G4 of the quadruple virtual-pixel units $X_{(i-1),(j+1)}$, $X_{(i-1),(j+2)}$, $X_{i,(j+1)}$, $X_{i,(j+2)}$ are mated, which allocate the intersection point $P_4$ at a center as illustrated in FIG. 22B. For example, when focusing to the virtual-pixel unit $X_{i,(j+1)}$, the respective quadruple vertex points at which the first transfer-control element G1, the second transfer-control element G2, the third transfer-control element G3 and the fourth transfer-control element G4 are located are chamfered, respectively, the cut away shape defines an outer shape of the photodiode PD (i, j+1) of an irregular octagon, as illustrated in FIG. 22B.

With regard to the other virtual-pixel units $X_{i,j}$, $X_{(i+1),j}$, $X_{(i+1),(j+1)}$ and others, similarly, quadruple vertex points at which the first transfer-control element G1, the second transfer-control element G2, the third transfer-control element G3 and the fourth transfer-control element G4 are located are chamfered, the cut-away spaces define outer shapes of the irregular octagonal photodiodes PD (i, j), PD (i+1, j) and PD (i+1, j+1) and PD (i, j+1), respectively. In FIG. 2, although the tetragonal virtual-pixel unit $X_{i,j}$ is explained as to be tessellated, not generating any gap in the pixel-array area 1, two different shapes of tiles are actually tessellated, as can be understood from FIGS. 22A and 22B. Namely, a first tiling shape of an irregular octagon, which is enclosed by the photodiode PD (i, j), PD (i+1, j) and PD (i+1, j+1) and PD (i, j+1), and a second tiling shape of a tetragon enclosed by the first intersection-shared site 41, the second intersection-shared site 42, the third intersection-shared site 43 and the fourth intersection-shared site 44 are tessellated.

Figure 23:
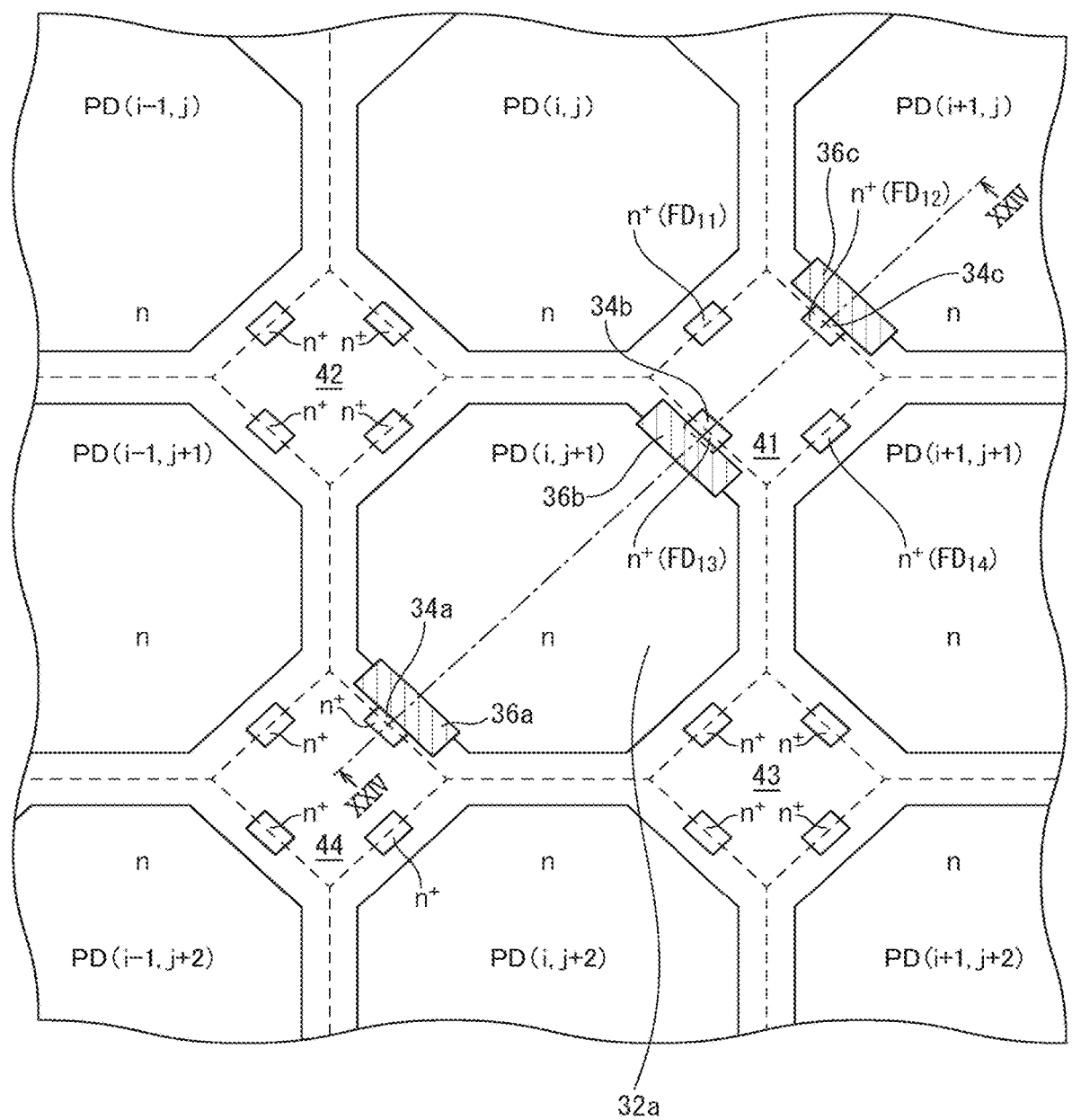
FIG. 23 is a schematic vie explaining a detailed flat-surface structure of the photodiode illustrated as the octagonal tile illustrated in FIG. 22B.

An inner structure of the photodiode PD (i, j+1) in FIG. 22B is illustrated by a flat pattern, which encompasses a photoelectric-conversion region of an irregular octagon, defined by the surface-buried region 32a occupying the inside of the photodiode PD (i, j+1), and an element-isolation region surrounding the photoelectric-conversion region, as illustrated in FIGS. 23 and 24. That is, the photoelectric-conversion region serving as an effective photodiode of the pixel in the virtual-pixel units $X_{i,(j+1)}$ is a space of an irregular octagon whose area is smaller than an area of the first tiling shape of the irregular octagon illustrated in FIG. 22B. Thus, in each pixel, there are the following relations of superficial contents:

(virtual-pixel unit)>(photodiode)>(photoelectric-conversion region)

As illustrated in FIG. 24, the photoelectric-conversion region of the pixel in the virtual-pixel units $X_{i,(j+1)}$ is implemented by p-n junction of the p-type semiconductor substrate 31 and the surface-buried region 32a selectively buried on the upper portion of the semiconductor substrate 31. The p$^+$ type pinning layer 33a is arranged on the surface-buried region 32a. As illustrated in FIG. 23, quadruple n$^+$ regions are provided as charge detectors around the photodiode PD (i,j+1), correspondingly to the shape of the photodiode PD (i,j+1).

Figure 4:
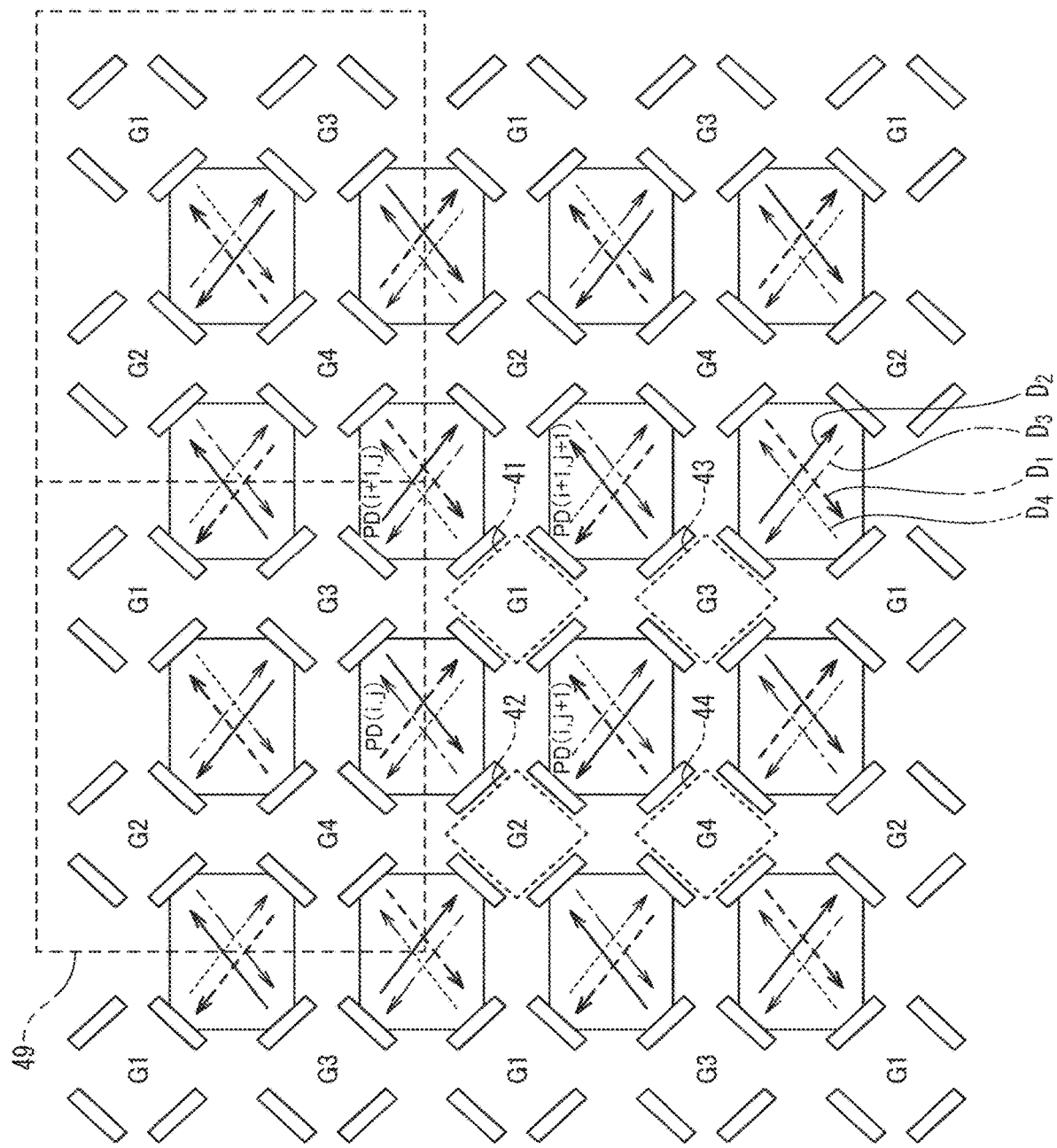
FIG. 4 is a schematic view explaining the arrangement of photodiodes and transfer-control elements in the solid-state imaging device pertaining to the first embodiment and the relationship with intersection-shared sites.

As shown in FIG. 4, focusing to two-by-two sets of the first intersection-shared site 41, the second intersection-shared site 42, the third intersection-shared site 43 and the fourth intersection-shared site 44, which are defined respectively as the encircled-space surrounded by quadruple same ordinal-number transfer-control elements, a "unit cell 49 for the quadruple-tap architecture" shall be defined as a district of a unit pattern, or a site of the unit pattern, which includes quadruple intersection-shared sites, each of the intersection-shared sites is labeled by different ordinal number, respectively. Then, with the definition of the "unit cell 49 for the quadruple-tap architecture", the topology in which the virtual-pixel units $X_{i,j}$ are repeatedly arranged in the pixel-array area 1, as illustrated in FIG. 2, can be construed as a layout in which the unit cells 49 are arranged periodically.

In FIG. 4, a first charge-transfer direction $D_1$ indicated by a thick dashed arrow inside each of the virtual-pixel units $X_{i,j}$ indicates a direction in which the signal charges are transferred and sorted from the photodiode PD (i, j) of each of the virtual-pixel units $X_{i,j}$ to the first transfer-control element. Similarly, a second charge-transfer direction $D_2$ indicated by a solid arrow indicates a direction in which the signal charges are transferred and sorted from the photodiodes PD (i, j) of each of the virtual-pixel units $X_{i,j}$ to the second transfer-control element. Also, in FIG. 4, a third charge-transfer direction $D_3$ indicated by an alternate long and short dashed line arrow inside each of the virtual-pixel units $X_{i,j}$ indicates a direction in which the signal charges are transferred and sorted from the photodiode PD (i, j) of each of the virtual-pixel units $X_{i,j}$ to the third transfer-control element. Moreover, a fourth charge-transfer direction $D_4$ indicated by a dashed line arrow thinner than the dashed line of the first charge-transfer direction $D_1$ indicates a direction in which the signal charges are transferred and sorted from the photodiode PD (i, j) of each of the virtual-pixel units $X_{i,j}$ to the fourth transfer-control element.

In each of the virtual-pixel units $X_{i,j}$, although the quadruple transfer-control elements G1 to G4 are arranged at the quadruple vertex points around the photodiode PD (i, j), respectively, regarding the arrangement positions of the quadruple transfer-control elements G1 to G4 in each of the pixels, the periodic patterns of the quadruple transfer-control elements G1 to G4 differ cyclically depending upon the coordinate positions of the virtual-pixel units $X_{i,j}$ allocated in the unit cell 49. In association with the cyclic positions in the periodic pattern, each of the charge-transfer directions $D_1$ to $D_4$ within the photodiode PD also has an azimuth cyclically differing from the coordinate position of the virtual-pixel unit $X_{i,j}$ in the unit cell 49, as indicated by the arrows in FIG. 4. However, the virtual-pixel units $X_{i,j}$ illustrated in FIG. 4 are symmetric in both of an upper-lower direction and a left-right direction with respect to the photodiode PD (i, j) serving as a central point of symmetry, and any directions of the respective charge-transfer directions $D_1$ to $D_4$ are equivalent to the charge-transfers. Thus, all of the virtual-pixel units $X_{i,j}$ illustrated in FIG. 4 can be regarded to be equivalent.

By the way, in FIG. 4, the respective positions of the first transfer-control element G1, the second transfer-control element G2, the third transfer-control element G3 and the fourth transfer-control element G4 can be exchanged, keeping the above periodicity. Also, FIG. 4 illustrates an example of a cyclic periodic pattern in which the arrangement positions in the pixel, or the array-positions of the ordinal numbers of the quadruple transfer-control elements G1 to G4 are cyclically repeated in the unit cell 49, which includes the intersection-shared sites in the grid of two-by-two pixels, as the unit pattern. However, because the unit cell 49 is defined as a district in which the rectangular two-by-two virtual-pixel units are included, other combination or other topology of the two-by-two virtual-pixel units can be contained in the range of district defining the unit cell 49. For example, between the columns of the adjacent unit cells 49, the positions of the adjacent unit cells 49 may be displaced from each other in the column direction, by a length corresponding to a side length of the virtual-pixel units, and the displaced arrangement may be repeated. An example of the above displaced arrangement in the column direction will be explained in FIG. 12 in the second embodiment.

Figure 5:
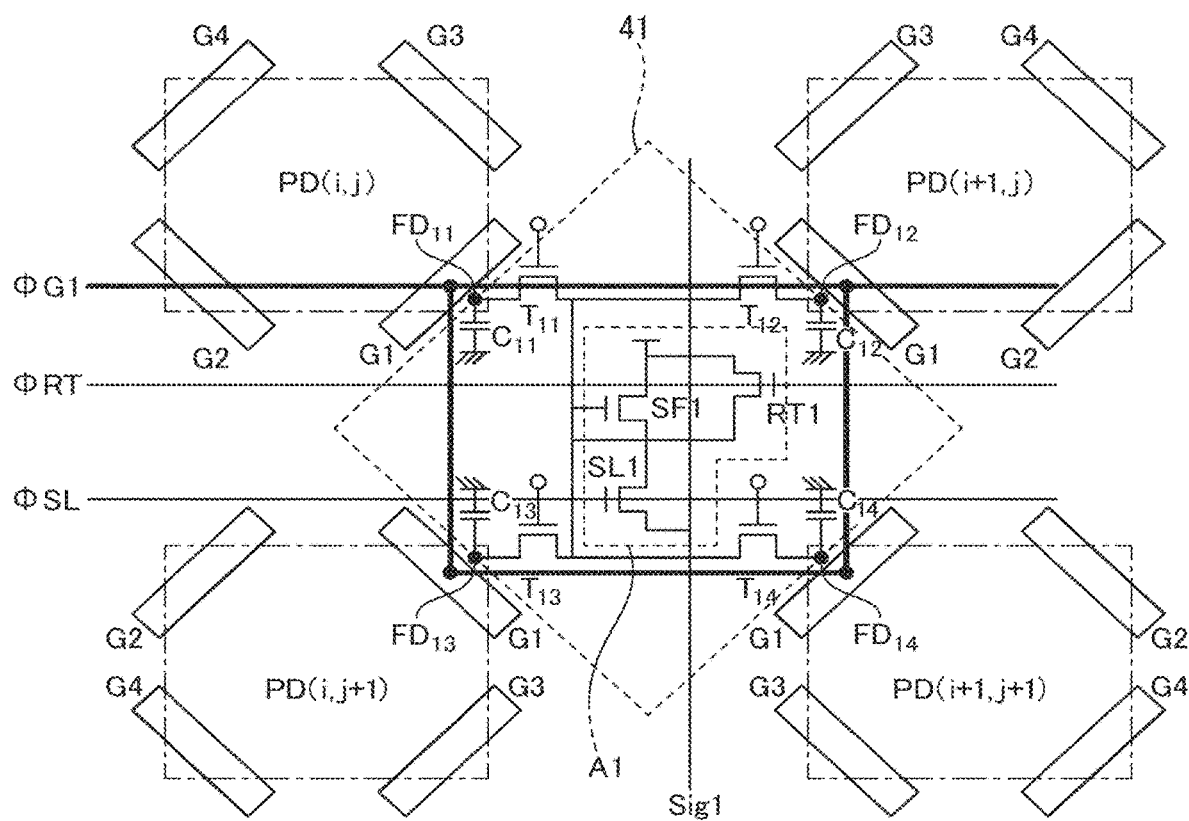
FIG. 5 is a schematic view illustrating a configuration of a first intersection-shared site in the solid-state imaging device pertaining to the first embodiment.

FIG. 5 illustrates the detail of the mode-switching circuit arranged in the intersection-shared site. Here, FIG. 5 illustrates the first intersection-shared site 41 located at the center of the photodiodes PD (i, j), PD (i+1, j), PD (i, j+1) and PD (i+1, j+1), among the various photodiodes illustrated in FIG. 4. As illustrated in FIG. 22A, each of the vertices of the quadruple tetragons contacts at the intersection point $P_1$ of the mesh implemented by the outer shapes of the tetragons of the virtual-pixel units $X_{i,j}$, $X_{i,(j+1)}$, $X_{(i+1),j}$, $X_{(i+1),(j+1)}$. The first intersection-shared site 41 is a rhombic space re-assigned as a pattern delineated by quadruple sides, which are the quadruple cut-away vertices of the tetragons, respectively, encircling the intersection point $P_1$ at the center of the rhombic space. FIG. 5 illustrates the quadruple first charge detectors FD1 (refer to FIG. 3) as dots (–) on the quadruple peripheral sides of the first intersection-shared site 41, respectively. To respectively distinguish the quadruple first charge detectors FD1, the first charge detector FD1 connected to the photodiode PD (i, j) on an upper-left portion in FIG. 5 is re-defined as "a first low-resistivity region $FD_{11}$", by labeling a new ordinal number to the first charge detector FD1. On an upper-right portion in FIG. 23, the first low-resistivity region $FD_{11}$ in FIG. 5 is illustrated as an $n^+$ region to which n-type impurities are heavily doped, on the upper portion of a p-type semiconductor substrate. Like FIG. 3, the other terminal of a first enlarge-capacitor $C_{11}$ whose one terminal is grounded is connected to the first low-resistivity region $FD_{11}$.

In FIG. 5, quadruple capacitors are allocated around periphery of the first intersection-shared site 41. In order to respectively distinguish the quadruple capacitors, a first detector capacitor C1 located on a side of the photodiode PD (i, j) on the upper-left portion in FIG. 5 is re-defined as "a first enlarge-capacitor $C_{11}$" by labeling a new ordinal number. That is, the "first enlarge-capacitor $C_{11}$" re-labeled in FIG. 5 corresponds to the first detector capacitor C1 illustrated in FIG. 3. Moreover, a first main electrode of a first switching element $T_{11}$ is connected to the first low-resistivity region $FD_{11}$, and the gate terminal of the first source-follower transistor SF1 is connected to a second main electrode of the first switching element $T_{11}$. If the first switching element $T_{11}$ is a MOS transistor such as MOSFET or the like, the first main electrode corresponds to a source terminal, and the second main electrode corresponds to a drain terminal. A first source-follower transistor SF1 constructing a signal-readout circuit A1, which is a common signal-readout circuit for the switching elements $T_1$, $T_{12}$, $T_{13}$ and $T_{14}$ in FIG. 5, shall correspond to the first source-follower transistor SF1 of the signal-readout circuit A1 already illustrated in FIG. 3. The gate terminal of the first source-follower transistor SF1 serves as an input terminal of the signal-readout circuit A1.

Similarly, the first charge detector FD1 connected to the photodiode PD (i+1, j) on an upper-right portion in FIG. 5 is defined as "a second low-resistivity region $FD_{12}$". The $n^+$ region 34c selectively buried on the upper portion of the p-type semiconductor substrate 31 illustrated in FIG. 24 corresponds to the second low-resistivity region $FD_{12}$. The other terminal of the second detector capacitor whose one terminal is grounded is connected to the second low-resistivity region $FD_{12}$. The "second enlarge-capacitor $C_{12}$" re-labeled in FIG. 5 corresponds to the first detector capacitor C1 illustrated in FIG. 3. Moreover, the first main electrode of the second switching element $T_{12}$ is connected to the second low-resistivity region $FD_{12}$, and the input terminal of the common signal-readout circuit A1 is connected to the second main electrode of the second switching element $T_{12}$.

Also, the first charge detector FD1 connected to the photodiode PD (i, j+1) on a lower-left portion in FIG. 5 is defined as "a third low-resistivity region $FD_{13}$". The $n^+$ region 34b illustrated in FIG. 24 is the third low-resistivity region $FD_{13}$. The other terminal of the third detector capacitor whose one terminal is grounded is connected to the third low-resistivity region $FD_{13}$. The "third enlarge-capacitor $C_{13}$" re-labeled in FIG. 5 corresponds to the first detector capacitor C1 illustrated in FIG. 3. Moreover, the first main electrode of the third switching element $T_{13}$ is connected to the third low-resistivity region $FD_{13}$, and the input terminal of the common signal-readout circuit A1 is connected to the second main electrode of the third switching element $T_{13}$.

Moreover, the first charge detector FD1 connected to the photodiode PD (i+1, j+1) on a lower-right portion in FIG. 5 is defined as "a fourth low-resistivity region $FD_{14}$". The n$^+$ region selectively provided in a p-type semiconductor substrate, which is illustrated in a region on an upper-right portion in FIG. 23, corresponds to the fourth low-resistivity region $FD_{14}$. The other terminal of the fourth detector capacitor whose one terminal is grounded is connected to the fourth low-resistivity region $FD_{14}$. The "fourth detector capacitor $C_{14}$" re-labeled in FIG. 5 corresponds to the first detector capacitor C1 illustrated in FIG. 3. Moreover, the first main electrode of the fourth switching element $T_{14}$ is connected to the fourth low-resistivity region $FD_{14}$, and the input terminal of the common signal-readout circuit A1 is connected to the second main electrode of the fourth switching element $T_{14}$.

That is, in FIG. 5, the first low-resistivity region $FD_{11}$, the second low-resistivity region $FD_{12}$, the third low-resistivity region $FD_{13}$ and the fourth low-resistivity region $FD_{14}$, to each of which the capacitance corresponding to the first detector capacitor C1 illustrated in FIG. 3 is added, are connected to the first transfer-control elements G1 serving as the transfer-control mechanisms that are classified on the basis of the same ordinal number of each of the quadruple photodiodes PD (i, j), PD (i+1, j), PD (i, j+1) and PD (i+1, j+1), respectively. The respective charge-detect signals delivered from the quadruple low-resistivity regions $FD_{11}$ to $FD_{14}$ are entered to the common signal-readout circuit A1 through the respective first switching element $T_1$, second switching element $T_{12}$, third switching element $T_{13}$ and fourth switching element $T_{14}$.

The signals delivered from the first source-follower transistor SF1 are fed to a first signal line Sig1 through the first select transistor SL1 constructing the common signal-readout circuit A1. In a mode by which the signals from the pixels of the quadruple virtual-pixel units $X_{i,j}$, $X_{i,(j+1)}$, $X_{(i+1),j}$, $X_{(i+1),(j+1)}$ are read out independently of each other, the switching elements $T_{11}$ to $T_{14}$ are turned on in turn, and the signals are serially read out at four divided times. In a mode by which the signals from the pixels, included in the unit cell including the intersection-shared site in the grid of two-by-two pixels, are summed mathematically, and the summed signals are read out, the summed signals can be read out in a single job by turning on the switching elements $T_{11}$ to $T_{14}$ at the same time.

As illustrated in FIG. 5, the first intersection-shared site 41 including the first transfer-control element G1 further encompasses the switching elements $T_{11}$ to $T_{14}$, the first source-follower transistor SF1, the first select transistor SL1 and the first reset transistor RT1. Although illustration is omitted, corresponding circuit configurations of other intersection-shared sites, which are assigned in each of the second transfer-control element G2, the third transfer-control element G3 and the fourth transfer-control element G4, have the same configuration as the first intersection-shared site 41, except that the ordinal numbers (ordinal numerals) labeled to the elements of each of the transistors and the like are different.

By the way, regarding a drive-signal line of each gate, FIG. 5 exemplifies only a part of the drive-signal lines. That is, FIG. 5 illustrates a first transfer-control drive-signal line ϕG1, a reset-transistor drive-signal line ϕRT and a select-transistor drive-signal line ϕSL. However, although a second transfer-control drive-signal line located on the same row and drive-signal lines of the switching elements $T_{11}$ to $T_{14}$ are required, the second transfer-control drive-signal lines and the drive-signal lines of the switching elements $T_{11}$ to $T_{14}$ are not described. Although those drive-signal lines mainly become a lateral wiring direction, the respective transfer-control elements G1 to G4 serving as wirings for global operations are possible even in longitudinal wiring directions. Also, in the longitudinal wiring, a power-supply wiring is required in addition to the first signal line Sig1. However, the power-supply wiring is not described.

Figure 6:
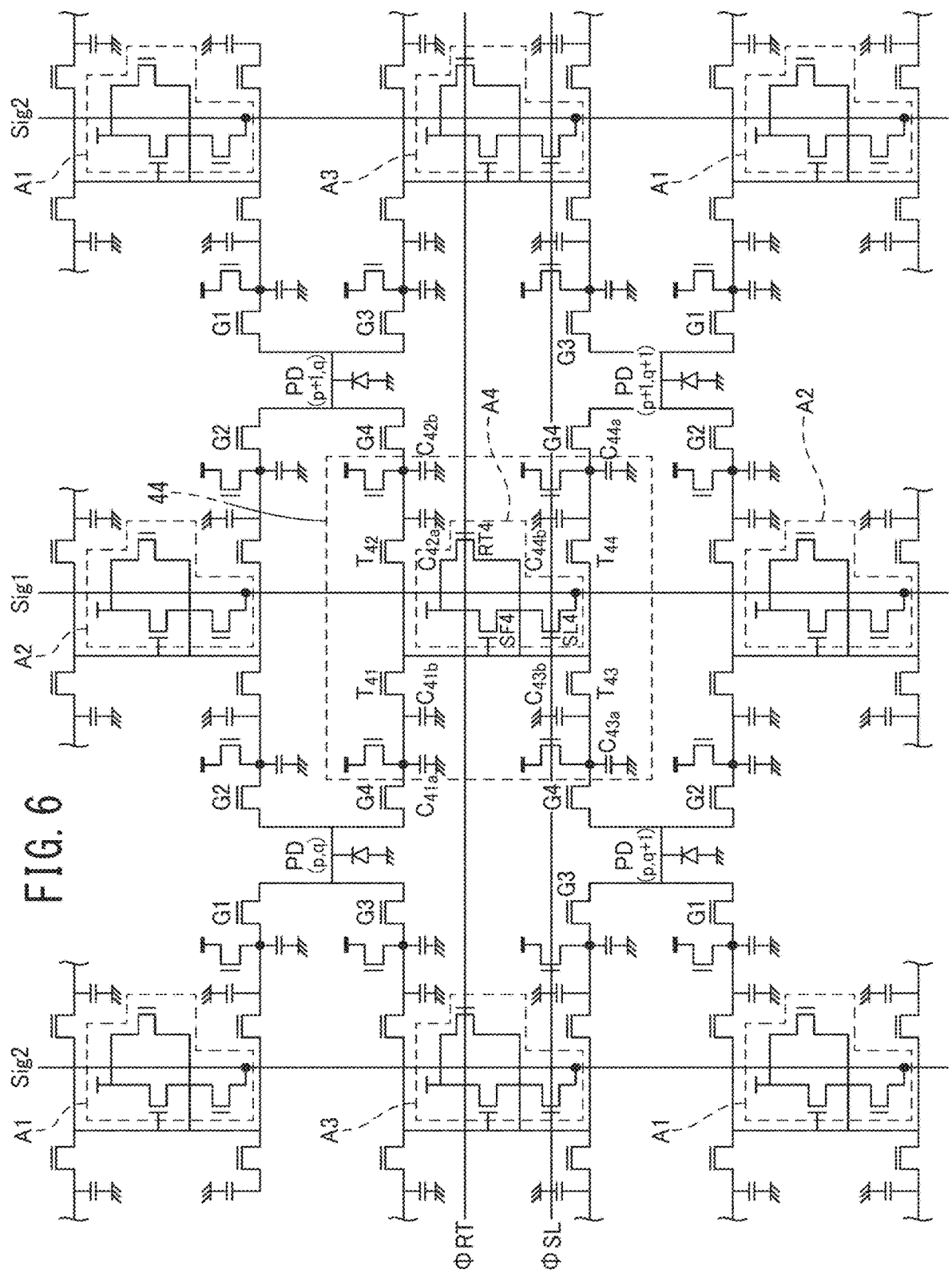
FIG. 6 is a circuit diagram illustrating a circuit configuration that is enlarged up to another intersection-shared site, with a centered fourth intersection-shared site in the solid-state imaging device pertaining to the first embodiment as a center.

A subject area of the circuit configuration illustrated in FIG. 5 is enlarged to contain an area of the unit cell covering the quadruple intersection-shared sites in two-by-two grids as illustrated in FIG. 6, which may correspond to the circuit configuration in FIG. 3. Namely, FIG. 6 illustrates the circuit configuration in which a portion of the unit cell covering the quadruple intersection-shared sites in two-by-two grids, focusing to quadruple photodiodes PD (p, q), PD (p+1, q), PD (p, q+1) and PD (p+1, q+1) (p=1 to $m_2$ and q=1 to $n_2$: each of the $m_2$ and the $n_2$ is positive integers of two or more). Although FIG. 6 illustrates a repetition topology of patterns having the same circuit configuration, the arrangements of the transfer-control elements G1 to G4 corresponds to FIG. 4. In the fourth intersection-shared site 44 located at a center of the unit cell including two-by-two intersection-shared sites illustrated in FIG. 6, transfer-control elements for the adjacently merged photodiodes PD (p, q), PD (p+1, q), PD (p, q+1) and PD (p+1, q+1) are the transfer-control elements G4.

A fourth charge detector $FD_4$ connected to the photodiode PD (p, q) at an upper-left portion in FIG. 6 is defined as "a first low-resistivity region $FD_{41}$". Similarly to FIG. 3, the other terminals of a first enlarge-capacitor $C_{41a}$ and a first auxiliary-capacitor $C_{41b}$ in which each one terminal is grounded are connected to the first low-resistivity region $FD_{41}$. "The first enlarge-capacitor $C_{41a}$" in FIG. 6 corresponds to the fourth detector capacitor C4 illustrated in FIG. 3. A value of the first auxiliary-capacitor $C_{41b}$ may be determined based on a light intensity from the object to be imaged, and the first auxiliary-capacitor $C_{41b}$ may be omitted depending on requirements of the design. Moreover, a first main electrode of a first switching element $T_{41}$ is connected to the first low-resistivity region $FD_{41}$, and a gate terminal of a fourth source-follower transistor SF4 constructing a common signal-readout circuit A4 is connected to a second main electrode of the first switching element $T_{41}$. The fourth source-follower transistor SF4 constructing the common signal-readout circuit A4 in FIG. 6 corresponds to the fourth source-follower transistor SF4 illustrated in FIG. 3, and the gate terminal of the fourth source-follower transistor SF4 in FIG. 6 serves as an input terminal of the signal-readout circuit A4.

Similarly, a fourth charge detector $FD_4$ connected to the photodiode PD (p+1, q) at an upper-right portion in FIG. 6 is defined as "a second low-resistivity region $FD_{42}$". The other terminals of a second enlarge-capacitor $C_{42a}$ and a second auxiliary-capacitor $C_{42b}$ in which each one terminal is grounded are connected to the second low-resistivity region $FD_{42}$. "The second enlarge-capacitor $C_{42a}$" in FIG. 6 corresponds to the fourth detector capacitor C4 illustrated in FIG. 3. A value of the second auxiliary-capacitor $C_{42b}$ may be determined based on the light intensity from the object to be imaged, and the second auxiliary-capacitor $C_{42b}$ may be omitted depending on requirements of the design. Moreover, a first main electrode of a second switching element $T_{42}$ is connected to the second low-resistivity region $FD_{42}$, and the gate terminal of the fourth source-follower transistor SF4 constructing the common signal-readout circuit A4 is connected to a second main electrode of the second switching element $T_{42}$.

Also, a fourth charge detector $FD_4$ connected to the photodiode PD (p, q+1) at a lower-left portion in FIG. 6 is defined as "a third low-resistivity region $FD_{43}$". The other terminals of a third enlarge-capacitor $C_{43a}$ and a third auxiliary-capacitor $C_{43b}$ in which each one terminal is grounded are connected to the third low-resistivity region $FD_{43}$. "The third enlarge-capacitor $C_{43a}$" in FIG. 6 corresponds to the fourth detector capacitor C4 illustrated in FIG. 3. A value of the third auxiliary-capacitor $C_{43b}$ may be determined based on the light intensity from the object to be imaged, and the third auxiliary-capacitor $C_{43}$b may be omitted depending on requirements of the design. Moreover, a first main electrode of a third switching element $T_{43}$ is connected to the third low-resistivity region $FD_{43}$, and the gate terminal of the fourth source-follower transistor SF4 constructing the common signal-readout circuit A4 is connected to a second main electrode of the third switching element $T_{43}$.

Moreover, a fourth charge detector $FD_4$ connected to the photodiode PD (p+1, q+1) at a lower-right portion in FIG. 6 is defined as "a fourth low-resistivity region $FD_{44}$". The other terminals of a fourth detector capacitor $C_{44a}$ and a fourth auxiliary-capacitor $C_{44}$b in which each one terminal is grounded are connected to the fourth low-resistivity region $FD_{44}$. "The fourth detector capacitor $C_{44a}$" in FIG. 6 corresponds to the fourth detector capacitor C4 illustrated in FIG. 3. A value of the fourth auxiliary-capacitor $C_{44}$b may be determined based on the light intensity from the object to be imaged, and the fourth auxiliary-capacitor $C_{44b}$ may be omitted depending on requirements of the design. Moreover, a first main electrode of a fourth switching element $T_{44}$ is connected to the fourth low-resistivity region $FD_{44}$, and the gate terminal of the fourth source-follower transistor SF4 constructing the common signal-readout circuit A4 is connected to a second main electrode of the fourth switching element $T_{44}$.

That is, in FIG. 6, the first low-resistivity region $FD_{41}$, the second low-resistivity region $FD_{42}$, the third low-resistivity region $FD_{43}$ and the fourth low-resistivity region $FD_{44}$ to each of which the capacitance corresponding to the fourth detector capacitor C4 illustrated in FIG. 3 and the auxiliary-capacitance are added are connected to the fourth transfer-control elements G4 serving as the transfer-control mechanisms that are classified on the basis of the same ordinal number, in the pixel in each of the quadruple photodiodes PD (p, q), PD (p+1, q), PD (p, q+1) and PD (p+1, q+1), respectively.

The respective charge-detect signals delivered from the quadruple low-resistivity regions $FD_{41}$ to $FD_{44}$ assigned in the fourth intersection-shared site 44 are entered to the gate terminal of the source-follower transistor SF4, which implements the input terminal of the common signal-readout circuit A4, through the first switching element $T_{41}$, the second switching element $T_{42}$, the third switching element $T_{43}$ and the fourth switching element $T_{41}$, respectively. With regard to wirings, FIG. 6 illustrates only a reset-transistor drive-signal line ORT, a select-transistor drive-signal line ϕSL, a first output-signal line Sig1, and second output-signal lines Sig2 adjacent to the left and right side of the first output-signal line Sig1, in the fourth intersection-shared site 44. A configuration example of the entire wirings will be described later with reference to FIG. 8.

Figure 7:
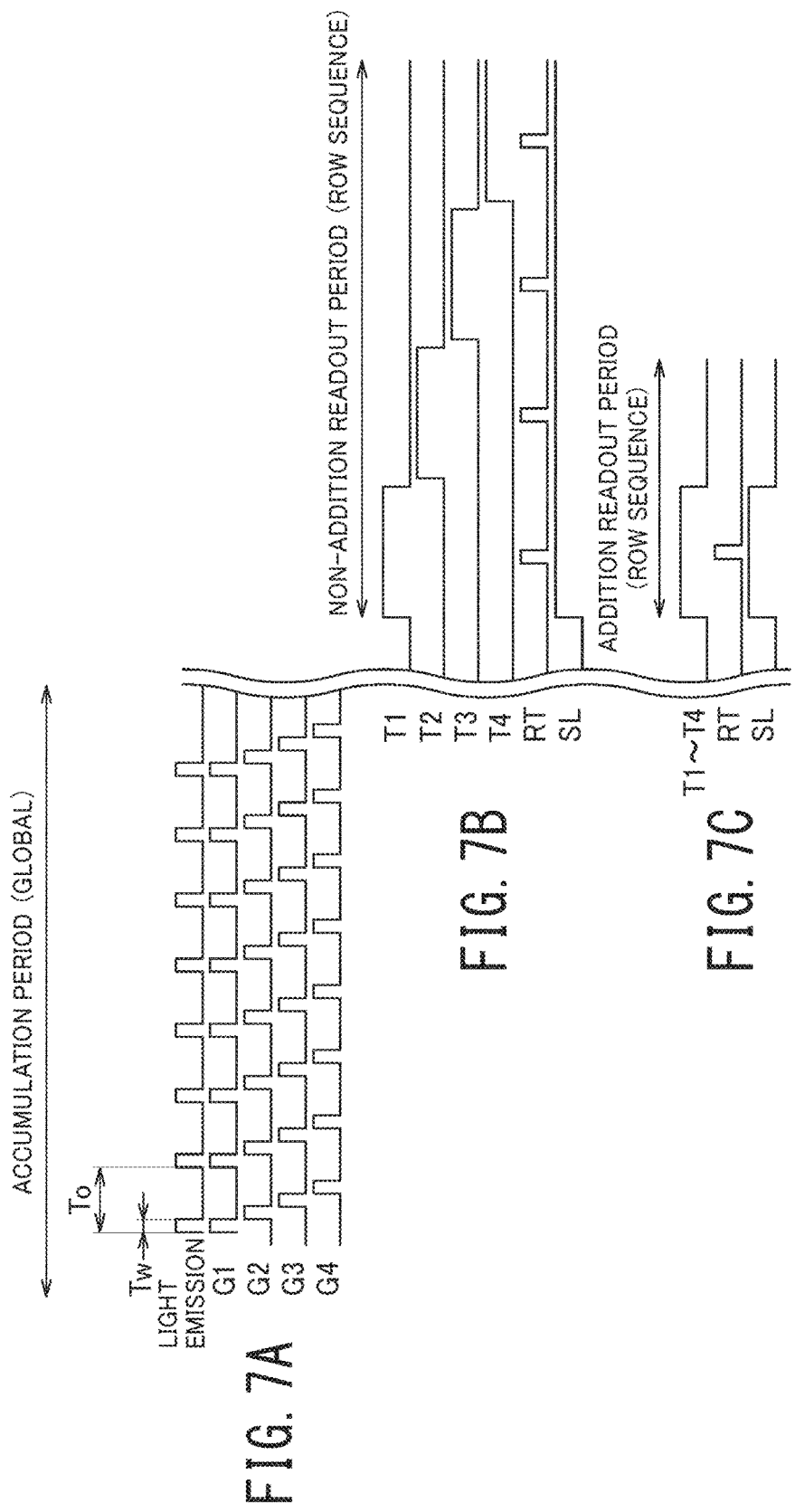
FIGS. 7A, 7B and 7C are timing charts explaining driving/readout methods in the solid-state imaging device pertaining to the first embodiment.

FIGS. 7A, 7B and 7C illustrate timing charts for driving the switching elements $T_{11}$ to $T_{14}$, respectively, by a quadruple-tap scheme, in a configuration including the first intersection-shared site 41 and the pixels around the space 41 illustrated in FIG. 5. By the way, although a case of a pulsed-wave modulation-scheme is explained hereinafter, the present invention can be applied to a sine-wave modulation-scheme. In the case of the sine-wave modulation-scheme, the first transfer-control element G1, the second transfer-control element G2, the third transfer-control element G3 and the fourth transfer-control element G4 correspond to phases of zero degree, 90 degrees, 180 degrees and 270 degrees, respectively. In an operation of the pulsed-wave modulation-scheme, at first, a former half of a frame period is defined as a global accumulation period in which charges are simultaneously distributed and accumulated in each of the quadruple taps included in the pixels of all of the virtual-pixel units $X_{i,j}$, $X_{i,(j+1)}$, $X_{(i+1),j}$, $X_{(i+1),(j+1)}$ synchronously with light-emission pulses, as illustrated in FIG. 7A. The quadruple transfer-control elements G1 to G4 are repeatedly operated at timings at which the pulses of a short pulse width Tw and a repeated period To do not overlap with each other. When the accumulation period has ended, a mode of a readout operation is executed in a row sequence mode, or rolling mode, and signal charges are read out from the pixels of the respective virtual-pixel units $X_{i,j}$.

At first, FIG. 7B illustrates a timing chart of serial read-out mode by which the signals from the pixels of all of the virtual-pixel units $X_{i,j}$, $X_{i,(j+1)}$, $X_{(i+1),j}$, $X_{(i+1),(j+1)}$ are independently read out without, being summed mathematically. The signals of the first low-resistivity region $FD_{11}$, the second low-resistivity region $FD_{12}$, the third low-resistivity region $FD_{13}$ and the fourth low-resistivity region $FD_{14}$, which correspond to the first charge detectors $FD_1$ of the virtual-pixel units $X_{i,j}$, $X_{i,(j+1)}$, $X_{(i+1),j}$, $X_{(i+1),(j+1)}$, respectively, are sequentially read out by turning on the first select transistor SL1 in FIG. and sequentially turning on switching signals $T_1$ to $T_4$ for driving the switching elements $T_{11}$ to $T_{14}$, respectively. Here, the respective conductive states (on-states) of the respective switching elements $T_{11}$ to $T_{14}$ are desired not to overlap with each other. In the middles of the on-periods of the respective switching elements $T_{11}$ to $T_{14}$, the reset transistors RT are turned on and off, thereby receiving the reset signals of the respective detectors. That is, on a single signal line, the set of signals and reset signals of quadruple kinds are received in temporal order. If a CDS operation is executed at a subsequent circuit portion of the signal line, the net signals of quadruple kinds can be acquired as mentioned above.

Next, FIG. 7C illustrates a timing chart of parallel read-out mode with which signals are summed mathematically in the unit cell, which covers the quadruple intersection-shared sites in two-by-two grids, and the summed signals are read out. By turning on the first select transistor SL1 illustrated in FIG. 5 and turning on the switching elements $T_{11}$ to $T_{14}$ at the same time through the switching signals T1 to T4, the summed signals are read out after summing the signals of the first low-resistivity region $FD_{11}$, the second low-resistivity region $FD_{12}$, the third low-resistivity region $FD_{13}$ and the fourth low-resistivity region $FD_{14}$, which correspond to the first charge detectors $FD_1$ of the virtual-pixel units $X_{i,j}$, $X_{i,(j+1)}$, $X_{(i+1),j}$, $X_{(i+1),(j+1)}$, respectively. In the middles of the simultaneous on-states of the switching elements $T_{11}$ to $T_{14}$, the first reset transistor RT1 in FIG. 5 is turned on and off, receiving the reset signal of the detector after the addition. That is, a set of one kind of summed signals and the reset signal are acquired on a single signal line. If the CDS operation is executed at operations in the subsequent circuit stage associated with the signal line, it is possible to obtain the net signals after the addition.

Figure 8:
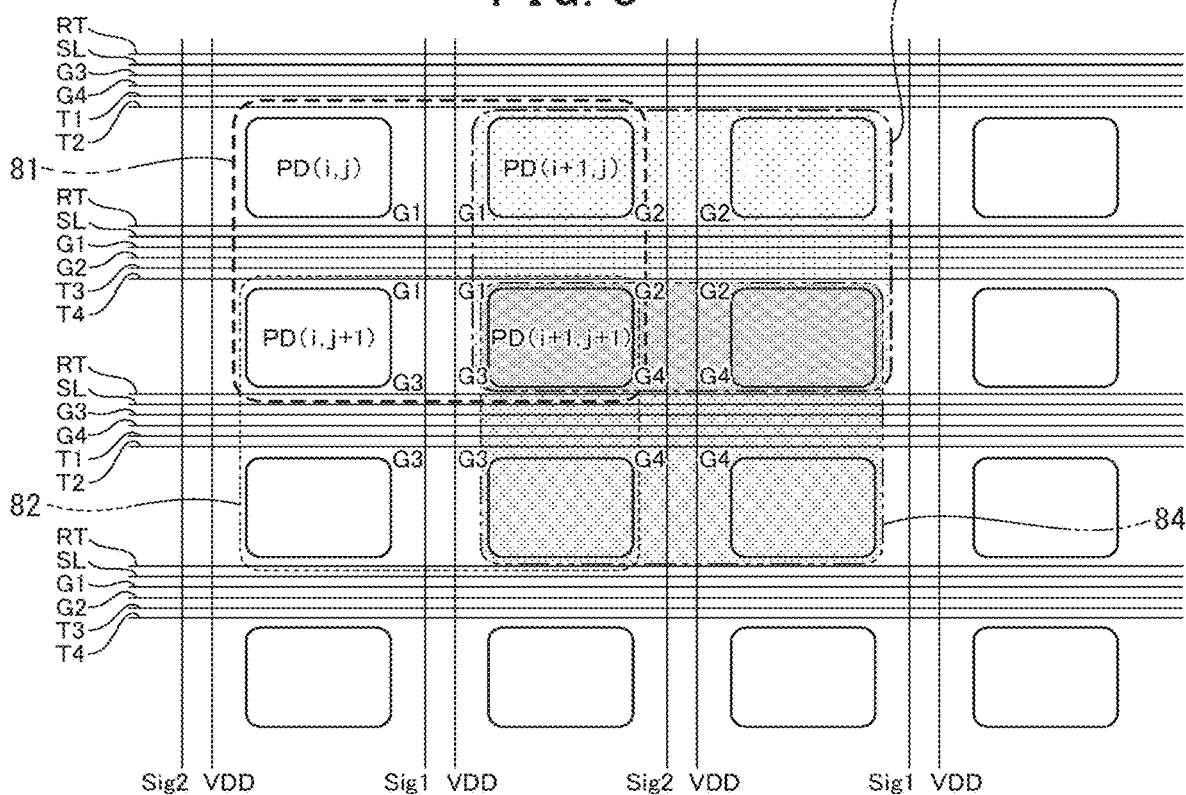
FIG. 8 is a schematic diagram illustrating an arrangement example of signal lines in the solid-state imaging device pertaining to the first embodiment.

In the two-dimensional pixel array of the present invention illustrated in FIGS. 4 and 5, there are various variations with regard to the interconnection architecture with various signal lines. FIG. 8 illustrates one example. The drive-signal interconnections of the transfer-control elements G1 to G4 performing the global operations can be delineated in both of longitudinal and lateral directions. However, FIG. 8 illustrates the example of the lateral direction. Also, since two upper and lower circuits are shared and driven through a single drive-signal interconnection, only the transfer-control elements G1 and G2 on the upper side can be located on odd rows, and only the transfer-control elements G3 and G4 on the lower stage side can be located on even rows. Thus, the number of the drive-signal interconnections is reduced.

Switching elements $T_{c1}$ to $T_{c4}$ (c=1 to 4: correspondence to G1 to G4) are elements for a driving mode of row sequence. However, when a simultaneous double-row drive is used, similarly to the transfer-control elements G1 to G4, only the first switching element $T_{c1}$ and the second switching element $T_{c2}$ can be located on the odd rows, and only the third switching element $T_{c3}$ and the fourth switching element $T_{c4}$ can be located on even elements. Thus, the number of the drive-signal interconnections is reduced. Each of a c-th reset transistor RTc (c=1 to 4: correspondence to G1 to G4) and a c-th select transistor SLc is row-sequential, and each of the drive-signal lines are interconnected for each row. The vertically running interconnections are the double output-signal lines Sig1 and Sig2 and the power-supply wiring VDD. The output-signal lines Sig1 and Sig2 are alternately arranged every alternate pixel in a horizontal direction.

Figure 9:
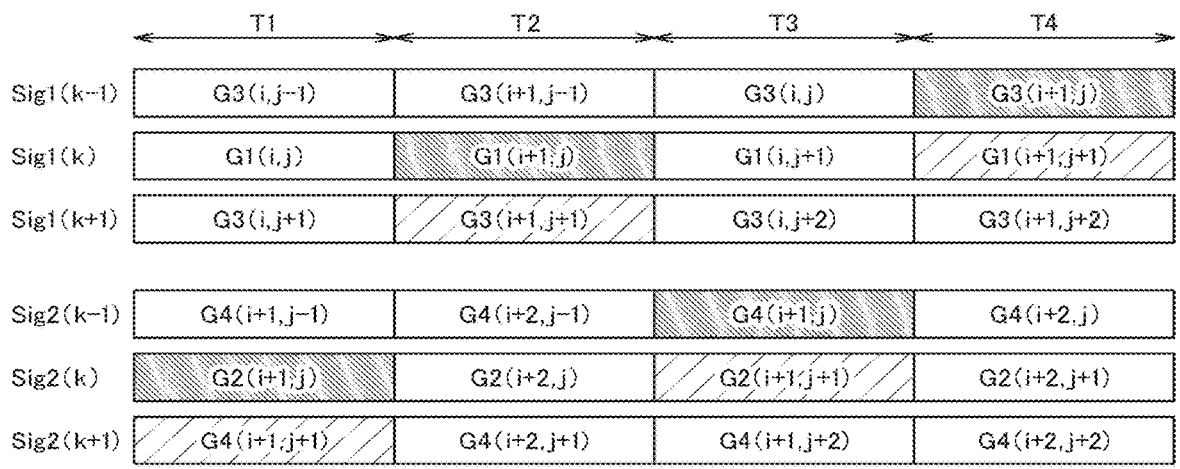
FIG. 9 is a timing chart explaining a cyclic-readout mode of signals from discrete pixels in the solid-state imaging device pertaining to the first embodiment.

In the two-dimensional pixel-array in the solid-state imaging device pertaining to the first embodiment illustrated in FIGS. 4, 5 and 8, FIG. 9 illustrates timing charts of the output-signal lines Sig1 and Sig2, at a mode by which the signals from the pixels of all of the virtual-pixel units $X_{i,j}$ are read out independently and sequentially, without executing simultaneous summation. Here, FIG. 9 illustrates a case in which readout lines are located at a (k−1)-th row, a k-th row and a (k+1)-th row. However, the readout lines are similarly repeated even at the other rows. FIG. 9 illustrates an example in which the signals from the pixels of the virtual-pixel unit $X_{(i+1),(j+1)}$ and the virtual-pixel unit $X_{(i+1),j}$ are distinguished by right-rising diagonal lines. Although the signals corresponding to the transfer-control elements G1 to G4 of the virtual-pixel unit $X_{(i+1),(j+1)}$ and the virtual-pixel unit $X_{(i+1),j}$ are diverged in the double signal lines and quadruple time-slot cells, the signals are controlled in a regular pattern in timings. Then, because it is possible to obtain the regular signals from the pixels of the particular virtual-pixel unit $X_{i,j}$, corresponding to the quadruple transfer-control elements G1 to G4, the above regular signals can be integrally processed at the later portion of the circuit so as to acquire the range information.

FIG. 10 illustrates timing charts of the output-signal lines Sig1 and Sig2, at a mode by which the signals from the pixels assigned in the unit cell, wrapping up the quadruple intersection-shared sites in two-by-two grids, are simultaneously summed, and the summed signals are read out, according to the two-dimensional pixel-array pertaining to the first embodiment of the present invention illustrated in FIGS. 4, 5 and 8. Here, FIG. 10 illustrates a case in which the readout lines are located at a (k−1)-th row, a k-th row and a (k+1)-th row. However, the readout lines are similarly repeated even at the other rows. As to the signals from the pixels assigned in the unit cell, which includes the two-by-two intersection-shared sites, the signals of the transfer-control elements G1 and G3 are fed from the first output-signal line Sig1, and the signals of the transfer-control elements G2 and G4 are fed through the second output-signal line Sig2, among the signals corresponding to the quadruple transfer-control elements G1 to G4. In addition-readout scheme, as illustrated in FIG. 8, the subject area of simultaneous summations is different depending upon the class, or the ordinal number of the transfer-control element.

As illustrated in FIG. 8, for example, when focusing to the PD (i+1, j+1) of the particular virtual-pixel unit $X_{(i+1, j+1)}$, the extent of the simultaneous-summation area is confined in the district of three by three (3×3) pixels, because the first transfer-control element G1 controls a first addition region 81, the second transfer-control element G2 controls a second addition region 3, the third transfer-control element G3 controls a third addition region 82, and the fourth transfer-control element G4 controls a fourth addition region 84. Thus, the above extent of the simultaneous-summation area is within the allowable span for the range calculation.

Second Embodiment

Figure 11:
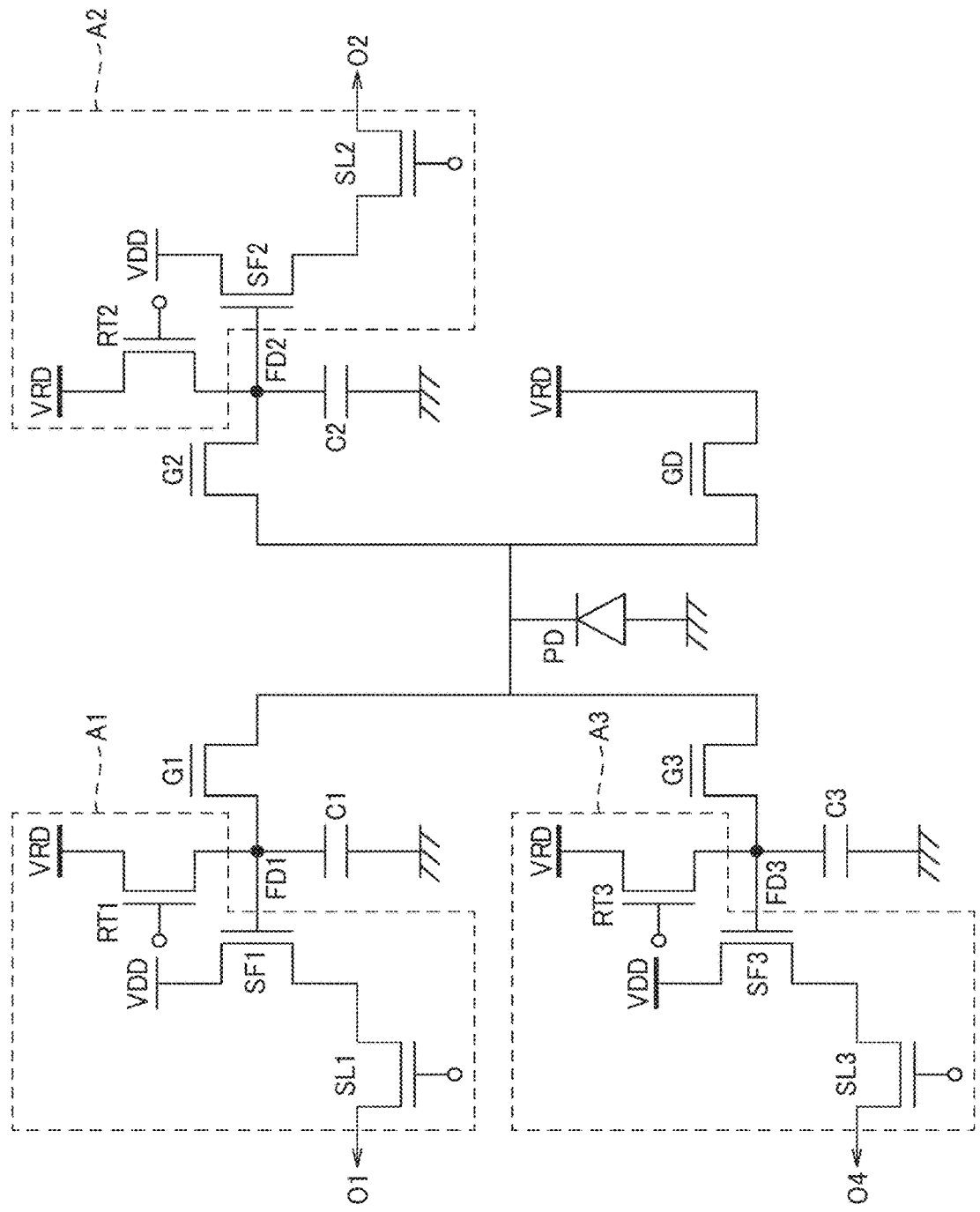
FIG. 11 is a circuit diagram illustrating an example of a pixel in a solid-state imaging device pertaining to a second embodiment.

FIG. 11 illustrates a circuit configuration of a pixel of transfer-route controlling-scheme according to a solid-state imaging device pertaining to a second embodiment of the present invention. When a virtual-pixel unit $X_{i,j}$ including each TOF pixel of triple-tap and single-charge-exhaust-element (SCEE) architecture illustrated in FIG. 11 is compared with the virtual-pixel unit $X_{i,j}$ including the quadruple-tap TOF pixel illustrated in FIG. 3, the fourth transfer-control element G4, the fourth charge detector FD4, the fourth detector capacitor C4, the fourth reset transistor RT4, the fourth source-follower transistor SF4 and the fourth select transistor SL4, which are connected to the photodiode PD in FIG. 3, are not connected to the photodiode PD in FIG. 11, and a charge-exhaust element GD is connected instead of the fourth transfer-control element G4. The charge-exhaust element GD exhausts charges other than signal charges, which are generated by background light, or by environment light, to a power supply.

As already described in the explanation of FIG. 4, all of the rectangular two-by-two (2×2) virtual-pixel units are confined in the range of the district defining the unit cell 49. In FIG. 4, it was supposed that the periodic pattern defined by the two-by-two matrix of the first intersection-shared site 41 to the fourth intersection-shared site 44 implements the unit cell 49 of the quadruple-tap architecture, and then, the arrangement of the unit cells 49 establishes a topology of repetition. However, in FIG. 12, between adjacent column of unit cells 122, each of positions of the adjacent unit cells 122 are displaced in a column direction, by a length corresponding to a side length of the virtual-pixel unit, and the unit cells 122 are repeatedly arranged. That is, in the solid-state imaging device pertaining to the second embodiment illustrated in FIG. 12, between adjacent unit cells 122, each having a set of two-by-two pixels with triple-tap architecture, each of the unit cells 122 encompassing the first intersection-shared site 41 whose quadruple vertices are surrounded by the same first transfer-control elements G1, respectively, the second intersection-shared site 42 whose quadruple vertices are surrounded by the same second transfer-control elements G2, respectively, the third intersection-shared site 43 whose quadruple vertices are surrounded by the same third transfer-control elements G3, respectively, and an exhaust site (fourth intersection-shared site) 121 whose quadruple vertices are surrounded by the same charge-exhaust element GD, respectively, are repeatedly arranged, being displaced from each other by the side length of one virtual-pixel unit, between the adjacent unit cells 122. By the way, respective positions of the first transfer-control element G1, the second transfer-control element G2 and the third transfer-control element G3 can be exchanged while periodicities are kept.

Figure 12:
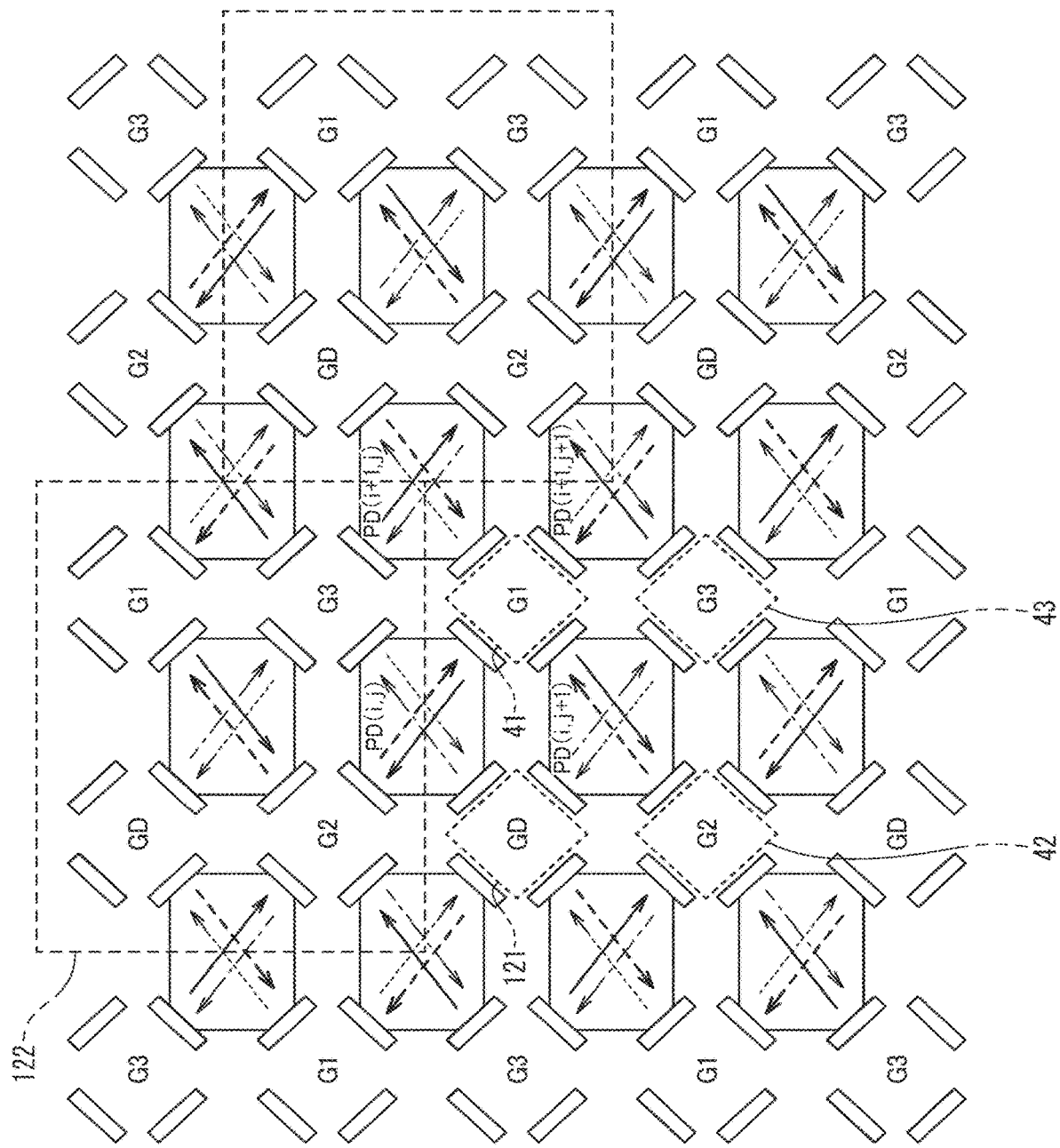
FIG. 12 is a schematic view illustrating the arrangement of photodiodes and transfer-control elements in the solid-state imaging device pertaining to the second embodiment.

Except for the above features, the virtual-pixel unit $X_{i,j}$ including the TOF pixel with the triple-tap-SCEE architecture illustrated in FIG. 12 is equal in configuration to the virtual-pixel unit $X_{i,j}$ including the quadruple-tap TOF pixel illustrated in FIG. 4. Thus, each of the first transfer-control element G1, the second transfer-control element G2, the third transfer-control element G3 and the charge-exhaust element GD, which are illustrated in FIG. 11, may be implemented by the transfer-control element of the insulated-gate structures, or alternatively, may be implemented by the transfer-control elements with the LEFM structures, similarly to the solid-state imaging device pertaining to the first embodiment. A charge-exhaust wiring VRD is connected to one main electrode (drain terminal) of the charge-exhaust element GD. Each potential of the first charge detector FD1, the second charge detector FD2 and the charge detector FD3 is reset, or is initialized, by each of the first reset transistor RT1, the second reset transistor RT2 and the third reset transistor RT3.

Reset potentials and signal potentials, after each of the signal transfer processes, of a charge detector FD1, a charge detector FD2 and a charge detector FD3, are amplified respectively by the corresponding first source-follower transistor SF1, second source-follower transistor SF2 and third source-follower transistor SF3. And after the amplification processes, output signals O1 to O3 are read out respectively through a first select transistor SL1, a second select transistor SL2 and a third select transistor SL3. The CDS processes, in which differences between the reset and signal potentials are calculated by the signal processor 24 illustrated in FIG. 2, are executed on the reset and signal potentials which are read out by the output signals O1 to O3, and net signals are acquired.

A scheme which uses the two-dimensional array of the virtual-pixel units $X_{i,j}$, each of which encompasses the TOF pixel with the triple-tap-SCEE architecture illustrated in FIG. 12, enables both of the cyclic-readout mode of the signals from each of the discrete pixels and the summed-readout mode of the signals from the pixels through intersection-shared sites assigned in the grid of two-by-two, which are explained in the first embodiment, can be performed by replacing the fourth transfer-control element G4 illustrated in FIG. 4 with the charge-exhaust element GD.

Figure 13A:
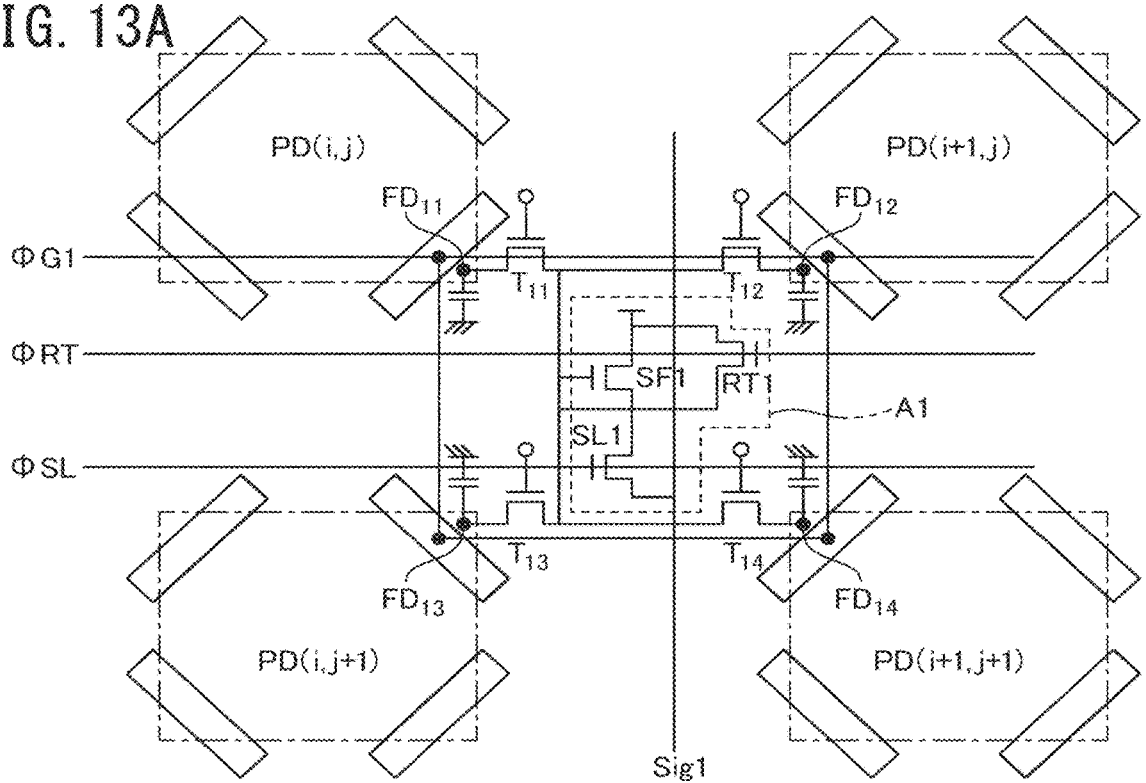
FIGS. 13A and 13B are schematic views illustrating configurations of intersection-shared sites in the solid-state imaging device pertaining to the second embodiment.
Figure 13B:
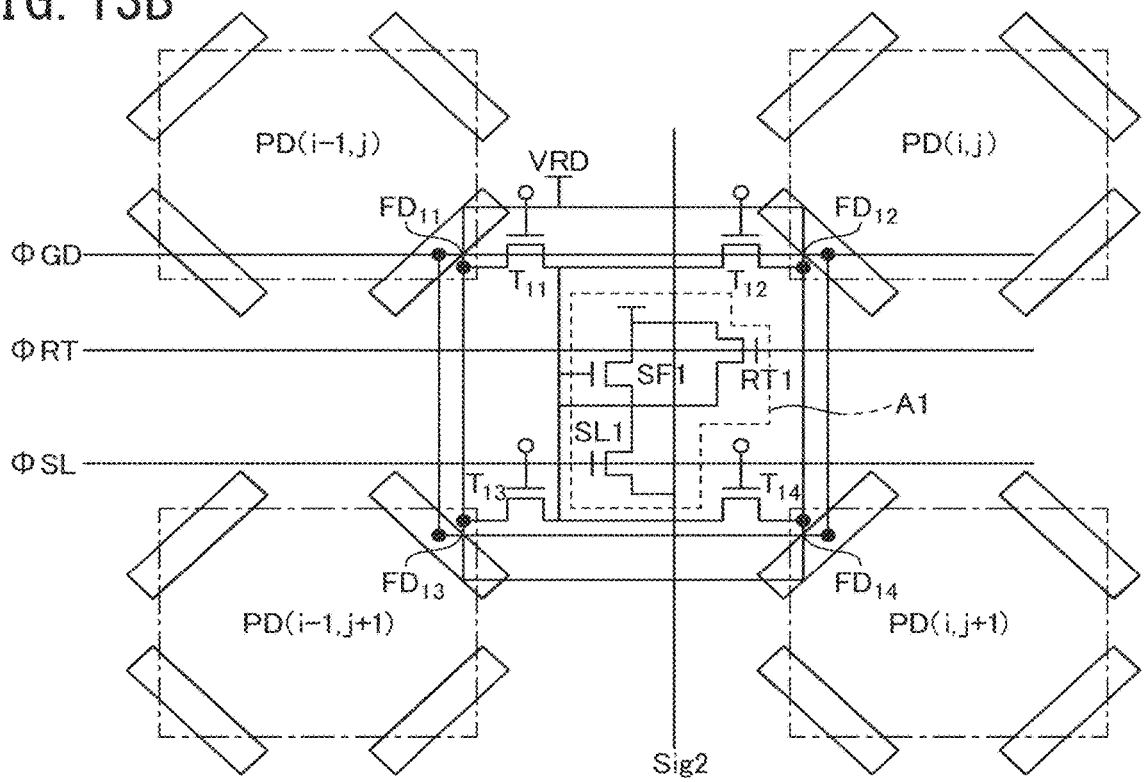

FIGS. 13A and 13B illustrate the details of the mode-switching circuits arranged in the intersection-shared sites. Here, the triple transfer-control elements G1 to G3 are similar to the elements explained with reference to FIG. 5, as illustrated in FIG. 13A. Regarding the charge-exhaust element GD, as illustrated in FIG. 13B, the charge detectors are directly connected to the charge-exhaust wiring VRD, and capacitors connected to the charge-exhaust wiring VRD are omitted. The following circuit configurations extending after the ports of the capacitors are like the topology already explained with reference to FIG. 13A.

FIGS. 14A, 14B and 14C illustrate the timing charts of drive operations for the triple-tap-SCEE architecture in the configuration of the virtual-pixel units $X_{i,j}$ illustrated in FIGS. 13A and 13B. In operations of the solid-state imaging device pertaining to the second embodiment, at first, in a former half of a frame period, all of the virtual-pixel units $X_{i,j}$ operate at the same time in global mode, synchronously with light-emission pulses. Namely, as illustrated in FIG. 14A, charges are sorted respectively to each of the first charge detector FD1, the second charge detector FD2 and the third charge detector FD3, which implement the triple taps, and charges are exhausted to the charge-exhaust element, synchronously with the light-emission pulses. Then, a global accumulation period is defined, in which the triple taps accumulate the charges, and the charge-exhaust element exhausts the charges. The triple transfer-control elements G1 to G3 and the charge-exhaust element GD are repeatedly operated so that the on-states of the pulses in a repetition period To do not overlap with each other. To each of the transfer-control elements G1 to G3, short pulses width Tw are applied. When the accumulation period has ended, a readout operation is executed in a row sequence mode, or rolling mode so that charges can be read out from the pixels of the respective virtual-pixel unit $X_{i,j}$.

At first, FIG. 14B illustrates an operation mode of the solid-state imaging device pertaining to the second embodiment at which the signals from the pixels in all of the virtual-pixel units $X_{i,j}$ are read out independently and sequentially, without executing simultaneous summation. Namely, w % ben the select transistor SL is turned on, the switching elements $T_{11}$ to $T_{14}$ are sequentially turned on by the switching signals T1 to T4 for driving the switching elements $T_{11}$ to $T_{14}$. And then, the signals of the first low-resistivity region $FD_{11}$ corresponding to the first charge detector FD1, the signals of the second low-resistivity region $FD_{12}$ corresponding to the second charge detector FD2, the signals of the third low-resistivity region $FD_{13}$ corresponding to the third charge detector FD3, and the signals of the low-resistivity region $FD_{14}$ corresponding to the to the fourth charge detector FD4 are sequentially read out.

Here, the on-periods of the respective switching elements are desired not to overlap with each other. In the middles of the on-periods of the respective switching elements $T_{11}$ to $T_{14}$, the first reset transistors RT1 are turned on and off, thereby acquiring the reset signals of the respective detectors. That is, on a single signal line, quadruple sets of signals and reset signals are transferred in temporal order. If the CDS operations are executed at operations in the subsequent circuit stage associated with the signal line, the quadruple kinds of net signals can be acquired as mentioned above.

Next, FIG. 14C illustrates an operation mode of the solid-state imaging device pertaining to the second embodiment, at which signals are simultaneously summed in the unit cell spanning over the quadruple intersection-shared sites in two-by-two grids, and the simultaneously summed signals are read out. By turning on the select transistor SL and turning on the switching elements $T_{11}$ to $T_{14}$ at the same time, the signals of the charge detectors FD1 to FD4 are simultaneously summed, and then, the simultaneously summed signals are read out. In the middles of the simultaneous on-states of the switching elements $T_{11}$ to $T_{14}$, the first reset transistor RT1 is turned on and off, thereby acquiring the reset signals of the detectors after the simultaneous summation. That is, a single set of the simultaneously summed signals and the reset signals is transferred on the single signal line. If the CDS operation is executed at operations in the subsequent circuit stage associated with the signal line, it is possible to obtain the net signals after the simultaneous summation.

Figure 15:
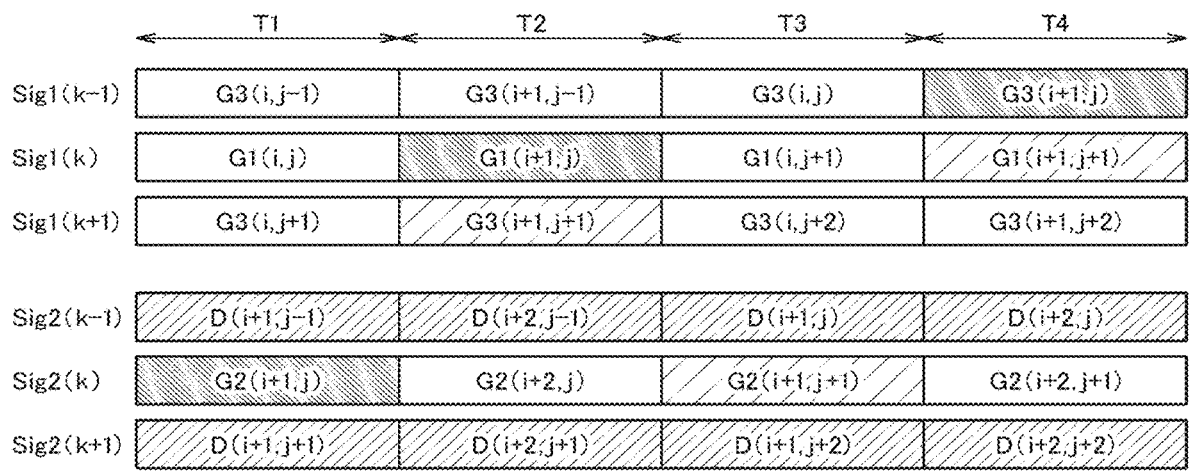
FIG. 15 is a timing chart explaining a cyclic-readout mode of signals from discrete pixels in the solid-state imaging device pertaining to the second embodiment.

FIG. 15 illustrates timing charts of the output-signal lines Sig1 and Sig2 at a mode by which the signals from the pixels in all of the virtual-pixel units $X_{i,j}$ are read out independently and sequentially, without executing simultaneous summation, in the two-dimensional pixel-array according to the solid-state imaging device pertaining to the second embodiment, which is illustrated in FIGS. 12 and 13. Here, FIG. 15 illustrates a case in which readout lines are located at a (k−1)-th row, a k-th row and a (k+1)-th row. However, the readout lines are similarly repeated even at the other rows. FIG. 15 illustrates an example in which the signals from the pixels in the virtual-pixel unit $X_{(i+1),(j+1)}$ and the virtual-pixel unit $X_{(i+1),j}$ are distinguished by right-rising diagonal lines. Regarding the signals from the pixels in the virtual-pixel unit $X_{(i+1),(j+1)}$ and the virtual-pixel unit $X_{(i+1),j}$, the signals corresponding to the triple transfer-control elements G1 to G3 are regularly arranged in timings, although the signals corresponding to the triple transfer-control elements G1 to G3 are diverged in double signal lines and quadruple time-slot cells.

In this way, regarding the signals from the pixels in the particular virtual-pixel unit $X_{i,j}$, it is possible to regularly obtain the signals corresponding to the triple transfer-control elements G1 to G3 according to the solid-state imaging device pertaining to the second embodiment. Thus, at operations in the subsequent circuit stage, the regularly obtained signals can be integrally processed, thereby acquiring the range information. However, as compared with the timings illustrated in FIG. 9, on the side of the second output-signal line Sig2, the signal becomes a dummy signal D (i,j) on every other line. Moreover, as illustrated in FIG. 12, because the virtual-pixel units $X_{i,j}$ are repeatedly arranged, while being displaced by every alternate pixel unit, in the arrangement of the unit cells 122, which include respectively the two-by-two intersection-shared sites, the signal lines of the dummy signals D (i,j) are displaced by a space of a single signal line. Namely, dummy signals D (i,j) appear in the Sig2 lines with G2 signals alternately and the D (i,j) in double Sig2 lines which sandwich Sig1 line are apart by one horizontal scan period.

That is, in contrast to the layout of the second output-signal lines Sig2 illustrated in FIG. 15, in a topology that the second output-signal lines Sig2 lie adjacent to the first output-signal lines Sig1, such that the second output-signal lines Sig2 sandwich the first output-signal lines Sig1 in between, each of the second output-signal line Sig2 (k−1) and the second output-signal line Sig2 (k+1) becomes signal lines for supplying second transfer-control element G2 signals, and the second output-signal line Sig2 (k) becomes a signal line for supplying the dummy signal D. Consequently, in all of the row signals, the dummy signals D are included at every alternate pixel, and the dummy signal can be used as reference signals for row-correlated noises. Thus, row noises can be suppressed by acquiring differences between intra-row average values of the dummy signals and the respective pixel signals.

Figure 16:
FIG. 16 is a timing chart explaining a summed-readout mode of the signals from the pixels in the solid-state imaging device pertaining to the second embodiment.

FIG. 16 illustrates timing charts of the first output-signal line Sig1 and the second output-signal line Sig2, in a mode by which the signals from the pixels in the unit cell 122, which includes the intersection-shared sites in the grid of two-by-two pixels, are simultaneously summed, and the simultaneously summed signals are read out in the two-dimensional pixel arrays of the solid-state imaging device pertaining to the second embodiment, which are illustrated in FIGS. 12 and 13. Here, FIG. 16 illustrates timings of the signals when the readout lines are located at the (k−1)-th row, the k-th row and the (k+1)-th row. However, the readout lines are similarly repeated even at the other rows. Regarding the signals from the pixels assigned in the unit cell 122 including the two-by-two intersection-shared sites, for the signals corresponding to the triple transfer-control elements G1 to G3, the signals from the first transfer-control element G1 and the third transfer-control element G3 are acquired through the first output-signal line Sig1, and the signals from the second transfer-control element G2 and the dummy signal are acquired through the second output-signal line Sig2. By the way, in contrast to the layout of the second output-signal lines Sig2 illustrated in FIG. 16, in a topology such that the second output-signal lines Sig2 sandwich the first output-signal line Sig1 in between, each of the second output-signal line Sig2 (k−1) and the second output-signal line Sig2 (k+1) supply second transfer-control element G2 signals, and the second output-signal line Sig2 (k) supplies a dummy signal D.

A combination of the summing operations in the unit cell 122 implements a topology in which only the fourth transfer-control element G4 is removed from the configuration illustrated in FIG. 8. Then, for example, when focusing to the PD (i+1, j+1) of the particular virtual-pixel unit $X_{(i+1),(j+1)}$, the extent of the subject summing-operation area covers an district of three by three pixels, because the first transfer-control element G1 covers a first summing-operation site, the second transfer-control element G2 covers a second summing-operation site, and the third transfer-control element G3 covers a third summing-operation site. Thus, the above subject summing-operation area is within the allowable span for the range calculation. Also, similarly to the case when the signals from the pixels in entire district of the virtual-pixel units $X_{i,j}$ are read out independently and sequentially, without executing simultaneous summation, the dummy signals D can be acquired for all of the rows through the second output-signal line Sig2. Thus, the dummy signals D can be used as the reference signals of the row-correlated noises. Hence, the row noises can be suppressed by acquiring the differences between the intra-row average values of the dummy signals D and the respective pixel signals.

Third Embodiment

Figure 17:
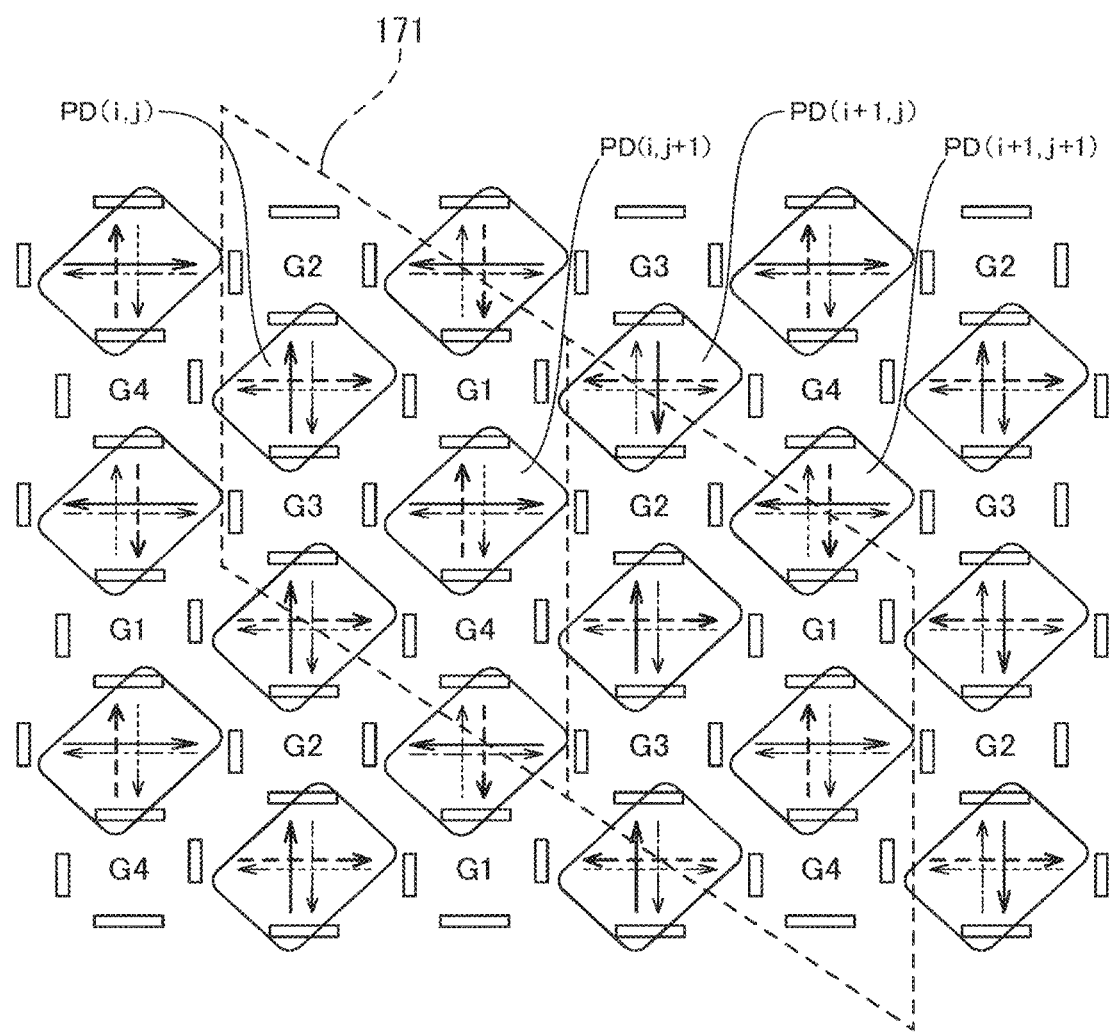
FIG. 17 is a schematic view illustrating an arrangement of photodiodes and transfer-control elements in a solid-state imaging device pertaining to a third embodiment.

As to the scheme that enables both a mode by which the signals from each of the discrete pixels are cyclically read out and a mode by which the signals from the pixels through intersection-shared sites assigned in the grid of two-by-two are summed, and the summed signals are read out, FIG. 17 illustrates another planar shape of the two-dimensional array differing from the topology illustrated in FIG. 4. In a solid-state imaging device pertaining to a third embodiment, each of the planar shapes of unit cells, spanning over the quadruple intersection-shared sites in two-by-two grids, is not constructed in a rectangular topology, and is designed in a parallelogram topology, which is perturbed by a length corresponding to half of the side length of the virtual-pixel unit along an upper-lower direction (row direction), in between the left and right adjacent virtual-pixel units $X_{i,j}$. Each of the first transfer-control element G1, the second transfer-control element G2, the third transfer-control element G3 and the fourth transfer-control element G4 which are illustrated in FIG. 17 may be implemented by the transfer-control element of the insulated-gate structures, or alternatively, may be implemented by the transfer-control elements with the LEFM structures, similarly to the solid-state imaging devices pertaining to the first and second embodiments.

When the district which covers an area of two-by-two intersection-shared sites in the topology of parallelogram array is defined as "a single unit cell 171", the single unit cell 171 shall include two-by-two virtual-pixel units. Therefore, the periodically repeated topology illustrated in FIG. 17 exhibits an array in which the left and right adjacent unit cells 171 are displaced from each other by a length corresponding to one side length of the virtual-pixel unit. The virtual-pixel units $X_{i,j}$ are arranged so that, in each transfer-control elements of the adjacent two virtual-pixel units $X_{i,j}$, the transfer-control elements classified with the same ordinal number are allocated closely to each other. Thus, by defining a space, in which a mode-switching circuit with respect to the virtual-pixel units $X_{i,j}$ is surrounded by the transfer-control elements of the same ordinal number, the repeating topology of the two-by-two sets of the sites as units is similar to the architecture already explained with reference to FIG. 4. A mode by which the signals from each of the discrete pixels are cyclically read out and a mode by which the signals from the pixels surrounding the intersection-shared site in the grid of two-by-two pixels are summed, and the summed signals are read out will be described below. The performance of the array illustrated in FIG. 17 differs in a spatial resolution from the configuration illustrated in FIG. 4.

Figure 18:
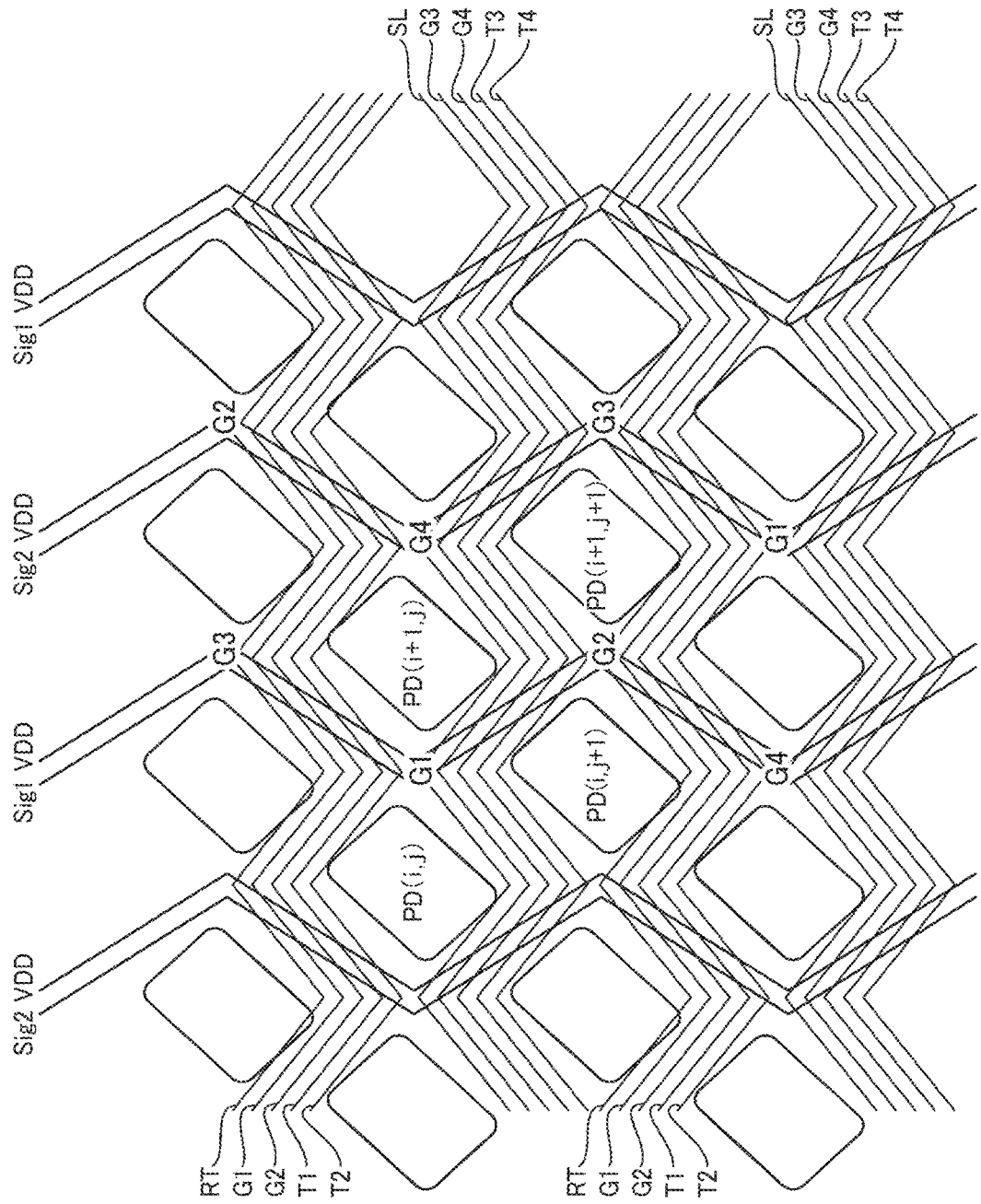
FIG. 18 is a schematic view illustrating an arrangement example of signal lines in the solid-state imaging device pertaining to the third embodiment.

FIG. 18 represents an example of wiring configuration for the solid-state imaging device pertaining to the third embodiment in the array of pixels illustrated in FIG. 17. The wiring configuration exhibits geometrical shapes such that global wirings running laterally (horizontally) meander in shapes of triangle between the upper and lower virtual-pixel units $X_{i,j}$. Here, the global wirings encompass various interconnections for controlling the transfer-control elements G1 to G4, the corresponding drive-signal lines RT of the reset transistors, the corresponding drive-signal lines SL of the select transistors and the corresponding drive-signal lines $T_1$ to $T_4$ of the switching elements $T_{c1}$ to $T_{c4}$. As to a single row, it is possible to construct a geometrical layout such that all laterally running interconnections are divided into two groups, which are assigned respectively to the upper and lower virtual-pixel units $X_{i,j}$, because the meandering wirings in the shapes of triangle can provide corresponding interconnections to each of the intersection-shared site of the virtual-pixel unit $X_{i,j}$ from the upper and lower virtual-pixel units $X_{i,j}$. That is, a total of decuple wiring patterns, which encompass interconnections for controlling the elements of RT, SL, G1 to G4 and T1 to T4, can be divided into two groups, each embracing quintuple wiring patterns per row. Vertically running interconnections meander in the shapes of triangle, between the left and right virtual-pixel units $X_{i,j}$. Here, the vertically running interconnections include a first output-signal line Sig1, a second output-signal line Sig2 and a power wiring VDD. By the way, the first output-signal line Sig1 and the second output-signal line Sig2 are arranged alternately at every alternate pixel in a horizontal direction.

Figure 19:
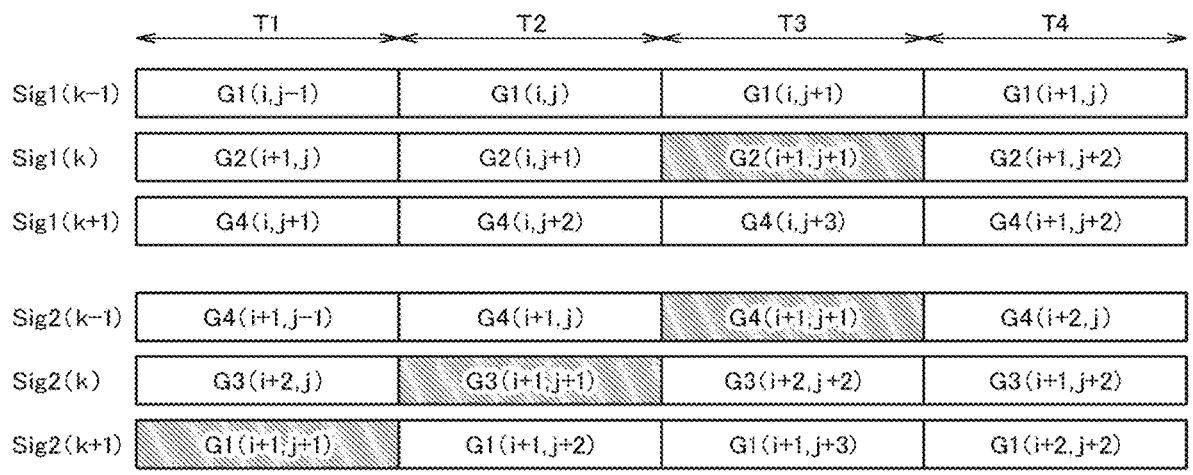
FIG. 19 is a timing chart explaining a cyclic-readout mode of signals from discrete pixels in the solid-state imaging device pertaining to the third embodiment.

FIG. 19 illustrates timing charts of the operations with the first output-signal line Sig1 and the second output-signal line Sig2, in the solid-state imaging device pertaining to the third embodiment, in which the wirings in FIG. 18 are allocated on the array of pixels illustrated in FIG. 17, and the signals from the pixels in all of the virtual-pixel units $X_{i,j}$ are read out independently and sequentially, without executing simultaneous summation. Although FIG. 19 illustrates a case in which readout lines are located at the (k−1)-th row, the k-th row and the (k+1)-th row, the readout lines are similarly repeated even at the other rows. As an example, time-slot cells of specific signals corresponding to the quadruple transfer-control elements G1 to G4 in the virtual-pixel unit $X_{(i+1),(j+1)}$ are represented by left-rising diagonal lines in FIG. 19. Although the timing charts of signals are divided and assigned respectively to each of the double signal lines, and furthermore, the timings are assigned into quadruple time-slot cells, respectively, the timings of respective signals are regular. Then, at operations in the subsequent circuit stage, above signals can be integrally processed so that the range with geometrical shape can be obtained.

Figure 20:
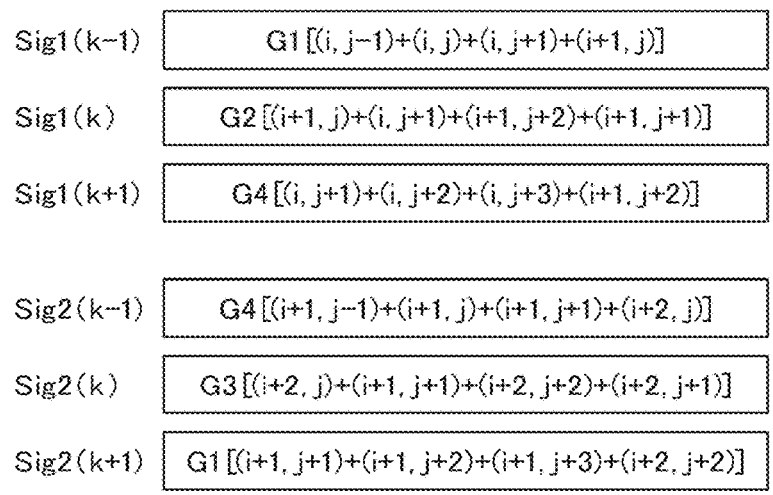
FIG. 20 is a timing chart explaining a summed-readout mode of the signals from the pixels in the solid-state imaging device pertaining to the third embodiment.

FIG. 20 illustrates timing charts of the operations with the first output-signal line Sig1 and the second output-signal line Sig2, in the operation mode of the solid-state imaging device pertaining to the third embodiment in which the wirings in FIG. 18 are allocated on the array in FIG. 17, and the signals from the pixels assigned in the unit cell 171, which includes the intersection-shared sites in the grid of two-by-two, are simultaneously summed, and the summed signals are read out. Although FIG. 20 illustrates a topology in which readout lines are located at the (k−1)-th row, the k-th row and the (k+1)-th row, the readout lines are similarly repeated even at the other rows. Regarding the signals corresponding to the quadruple transfer-control elements G1 to G4 from the pixels assigned in the unit cell 171, all signals from the quadruple transfer-control elements G1 to G4 are acquired through the first output-signal line Sig1 and the second output-signal line Sig2, in orders differing from each other.

Fourth Embodiment

Figure 21:
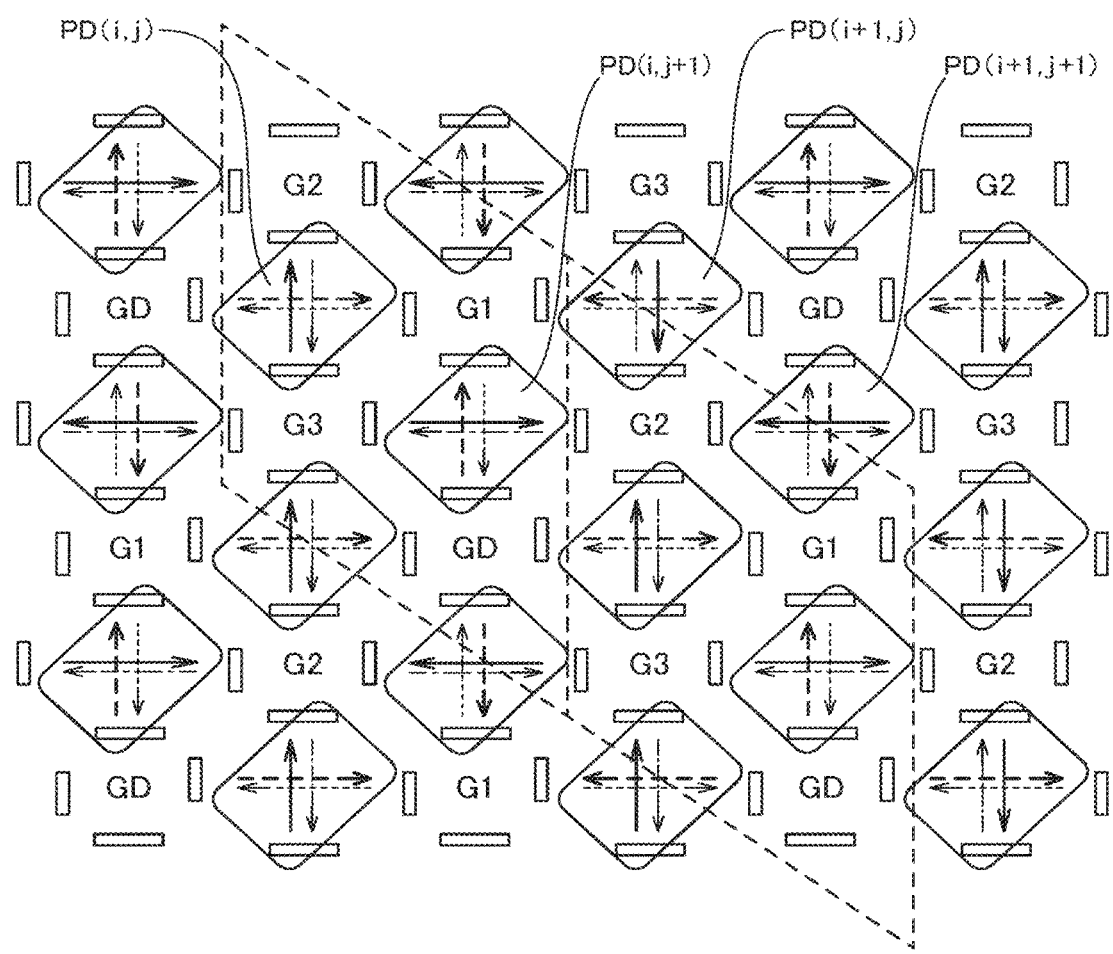
FIG. 21 is a schematic view illustrating the arrangement of photodiodes and transfer-control elements in a solid-state imaging device pertaining to a fourth embodiment.

The scheme, which enables both of the cyclic-readout mode of the signals from each of the discrete pixels pertaining to the first embodiment and the summed-readout mode of the signals from the intersection-shared sites in the grid of two-by-two pixels in the two-dimensional array of the virtual-pixel units $X_{i,j}$, each of which encompasses TOF pixels for triple-tap-SCEE architecture, has already been explained with reference to FIG. 17. However, both of the cyclic-readout mode and the summed-readout mode can be carried out, by replacing the fourth transfer-control element G4 with a charge-exhaust element GD, which is provided for exhausting charges other than signal charges to the power supply. Each scheme of the cyclic-readout mode of the signals from each of the discrete pixels and the summed-readout mode of the signals from the pixels through intersection-shared sites assigned in the grid of two-by-two in the solid-state imaging device pertaining to a fourth embodiment illustrated in FIG. 21 are similar to the scheme already explained with reference to FIG. 17. Thus, the explanations are omitted. Each of the first transfer-control element G1, the second transfer-control element G2, the third transfer-control element G3 and the charge-exhaust element GD, which are illustrated in FIG. 21, may be implemented by the transfer-control element of the insulated-gate structures, or alternatively, may be implemented by the transfer-control elements with the LEFM structures, similarly to the solid-state imaging devices pertaining to the first to third embodiments.

Also, according to the solid-state imaging device pertaining to the fourth embodiment, when the wiring layout illustrated in FIG. 18 is applied to the geometrical configuration of FIG. 21, because the dummy signals corresponding to the charge-exhaust element GD are included in all rows, the dummy signals can be used as the reference signals of the row-correlated noise, similarly to the schemes illustrated in FIGS. 12, 15 and 16. Hence, the row noises can be suppressed, by acquiring the difference between the intra-row average values of the dummy signals and the respective pixel signals.

Other Embodiments

As mentioned above, the present invention has been described by the first to fourth embodiments. However, the descriptions and drawings that implement a part of the first to fourth embodiments should not be understood to limit the technical scope of the present invention. From the disclosure, the miscellaneous variations of the embodiments, configurations and operational techniques will be clearly understood by one skilled in the art. For example, referring to FIG. 22B, the tetragonal (rhombic) topology of the first intersection-shared site 41 illustrated in FIG. 22B has been explained such that each of 45 degree-tilted lines is defined by chamfering the respective vertices (apexes) of the virtual-pixel units $X_{i,j}$, $X_{i,(j+1)}$, $X_{(i+1),j}$, $X_{(i+1),(j+1)}$ illustrated in FIG. 22A. Furthermore, it has been explained that each of the quadruple 45 degree-tilted lines implementing the rhombic topology of the second intersection-shared site 42 was defined by chamfering the respective vertices of the virtual-pixel units $X_{(i-1),j}$, $X_{(i-1),(j+1)}$, $X_{i,j}$, $X_{i,(j+1)}$. Similarly, it has been explained that the third intersection-shared site 43 was defined by chamfering the respective vertices of the virtual-pixel units $X_{i,(j+1)}$, $X_{i,(j+2)}$, $X_{(i+1),(j+1)}$, $X_{(i+1),(j+2)}$, and the fourth intersection-shared site 44 was defined by chamfering the respective vertices of the virtual-pixel units $X_{(i-1),(j+1)}$, $X_{(i-1),(j+2)}$, $X_{i,(j+1)}$, $X_{i,(j+2)}$. However, the description of the rhombic topologies referring to FIGS. 22A and 22B is merely one example.

Figure 25:
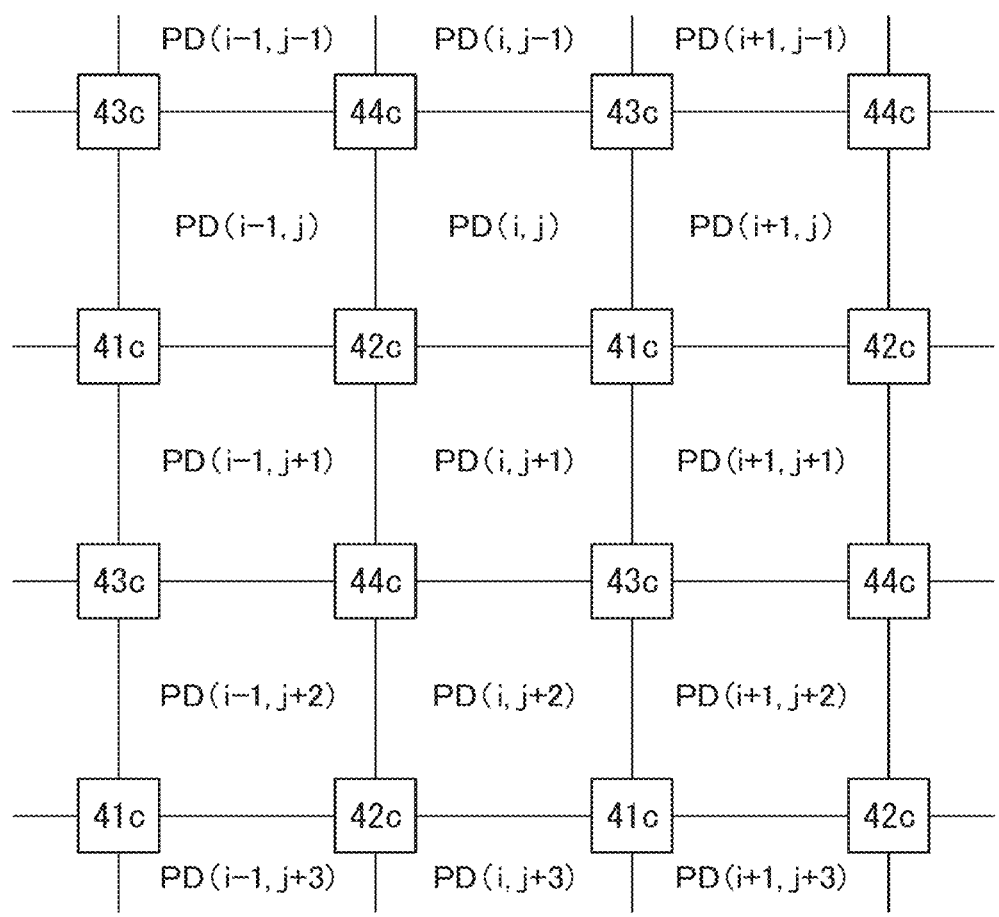
FIG. 25 is a view explaining another topology in which the two shapes of the tiles illustrated in FIG. 22B are arranged to fill a plane.

For example, as illustrated in FIG. 25, a tetragonal first intersection-shared site 41c can be defined by cutting away, or by recessing each of the vertices of the virtual-pixel units $X_{i,j}$, $X_{i,(j+1)}$, $X_{(i+1),j}$, $X_{(i+1),(j+1)}$ illustrated in FIG. 22A so as to establish a right-angle stepped concave. Similarly, the peripheral shape of a tetragonal second intersection-shared site 42c may be generated by recessing each of the vertices of the virtual-pixel unit $X_{(i-1),j}$, $X_{(i-1),(j+1)}$, $X_{i,j}$, $X_{i,(j+1)}$ into the right-angle stepped concave, the peripheral shape of a tetragonal third intersection-shared site 43c may be generated by recessing each of the vertices of the virtual-pixel units $X_{i,(j+1)}$, $X_{i,(j+2)}$, $X_{(i+1),(j+1)}$, $X_{(i+1),(j+2)}$ into the right-angle stepped concave, and the peripheral shape of a tetragonal fourth intersection-shared site 44c may be generated by recessing each of the vertices of the virtual-pixel unit $X_{(i-1),(j+1)}$, $X_{(i-1),(j+2)}$, $X_{i,(j+1)}$, $X_{i,(j+2)}$ into the right-angle stepped concave.

Figure 26:
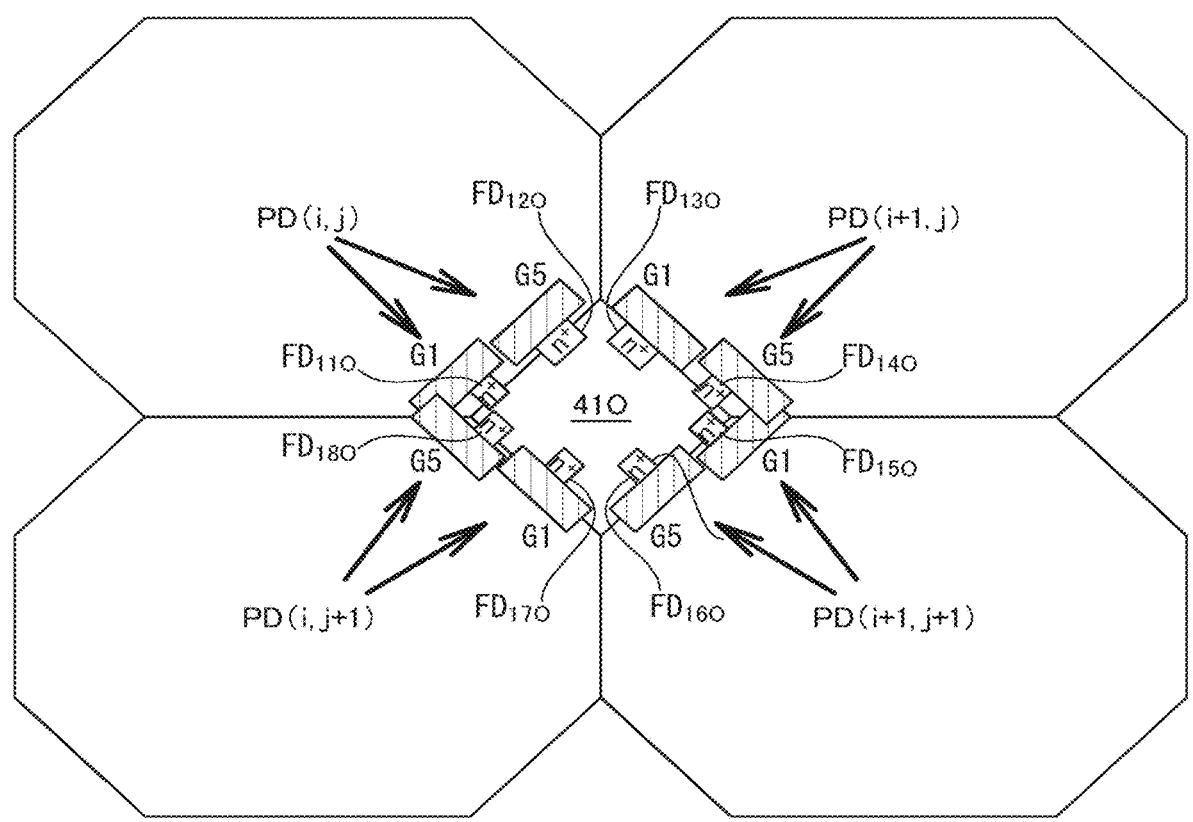
FIG. 26 is a schematic plan view explaining rough structures of intersection-shared sites, focusing to one of the intersection-shared sites constructing a pixel-array area composed of octuple-tap architecture pixels, as an example of a solid-state imaging device pertaining to another embodiment.

Moreover, referring to FIG. 5, an example in which the quadruple low-resistivity regions $FD_{11}$ to $FD_{41}$ are arranged on the quadruple chamfering lines to create the pattern for the quadruple-tap architecture has been explained. Namely, each of the quadruple chamfering lines is defined as a line cutting away respectively each apex of the virtual-pixel units at 45 degrees, and the first low-resistivity region $FD_{11}$, the second low-resistivity region $FD_{12}$, the third low-resistivity region $FD_{13}$ and the fourth low-resistivity region $FD_{14}$ are arranged on the quadruple chamfering lines, respectively. However, because the topologies of the pixels arranged by the quadruple-tap architecture or triple-tap-SCEE architecture explained in the first to fourth embodiments are merely examples, an octuple-tap architecture as illustrated in FIG. 26 is allowable. In FIG. 26, the octuple-tap architecture is constructed by octuple low-resistivity regions, such that each set of double low-resistivity regions is disposed respectively on quadruple chamfering lines, which cut away each of the apexes of the virtual-pixel units at 45 degrees. In the octuple-tap architecture, the unit cell is defined in a district which occupies two-by-two intersection-shared sites.

FIG. 26 focuses on a topology associated with the first intersection-shared site 41o. That is, in FIG. 26, a first low-resistivity region $FD_{11o}$, a third low-resistivity region $FD_{13o}$, a fifth low-resistivity region $FD_{15o}$ and a seventh low-resistivity region $FD_{17o}$ are respectively connected to corresponding first transfer-control elements G1 of the quadruple photodiodes PD (i, j), PD (i+1, j), PD (i, j+1) and PD (i+1, j+1). Each of charge-detect signals delivered from the quadruple low-resistivity regions $FD_{11o}$ to $FD_{17o}$ are entered to a common first signal-readout circuit through each of first to fourth switching elements whose illustrations are omitted. A second low-resistivity region $FD_{12o}$, a fourth low-resistivity region $FD_{14o}$, a sixth low-resistivity region $FD_{16o}$ and an eighth low-resistivity region $FD_{18o}$ are respectively connected to corresponding fifth transfer-control elements G5 of the quadruple photodiodes PD (i, j), PD (i+1, j), PD (i, j+1) and PD (i+1, j+1), which surround the first intersection-shared site 41 c. Each of charge-detect signals delivered from the quadruple low-resistivity regions $FD_{12o}$ to $FD_{18o}$ are entered to a common fifth signal-readout circuit through each of fifth to eighth switching elements whose illustrations are omitted.

Furthermore, the second to fourth intersection-shared sites, whose illustrations are omitted, have the similar topology and circuit configuration. Namely, similarly to the first to fourth embodiments, the binning operation is possible by arranging each of the sets of octuple switching elements in all of the first to fourth intersection-shared sites so that each of the sets of octuple switching elements can execute the binning operation, respectively. Also, under the condition that each of the apexes of the virtual-pixel units is recessed into the right-angle stepped concave as illustrated in FIG. 25, when a pattern of the low-resistivity region is arranged respectively on a one side constructing the right-angle steps provided in each of the right-angle stepped concaves, which are assigned to each apex of the virtual-pixel units, the arrangement of the low-resistivity regions can achieve a topology such that each of the sets of double low-resistivity regions is respectively assigned in each of the recessed vertices. Thus, even in a topology illustrated in FIG. 25, it is possible to achieve the octuple-tap solid-state imaging device. Even in the octuple-tap solid-state imaging device, the unit cells are assigned respectively to the summing-operation areas, each of which covers the district of the two-by-two intersection-shared sites.

Figure 27:
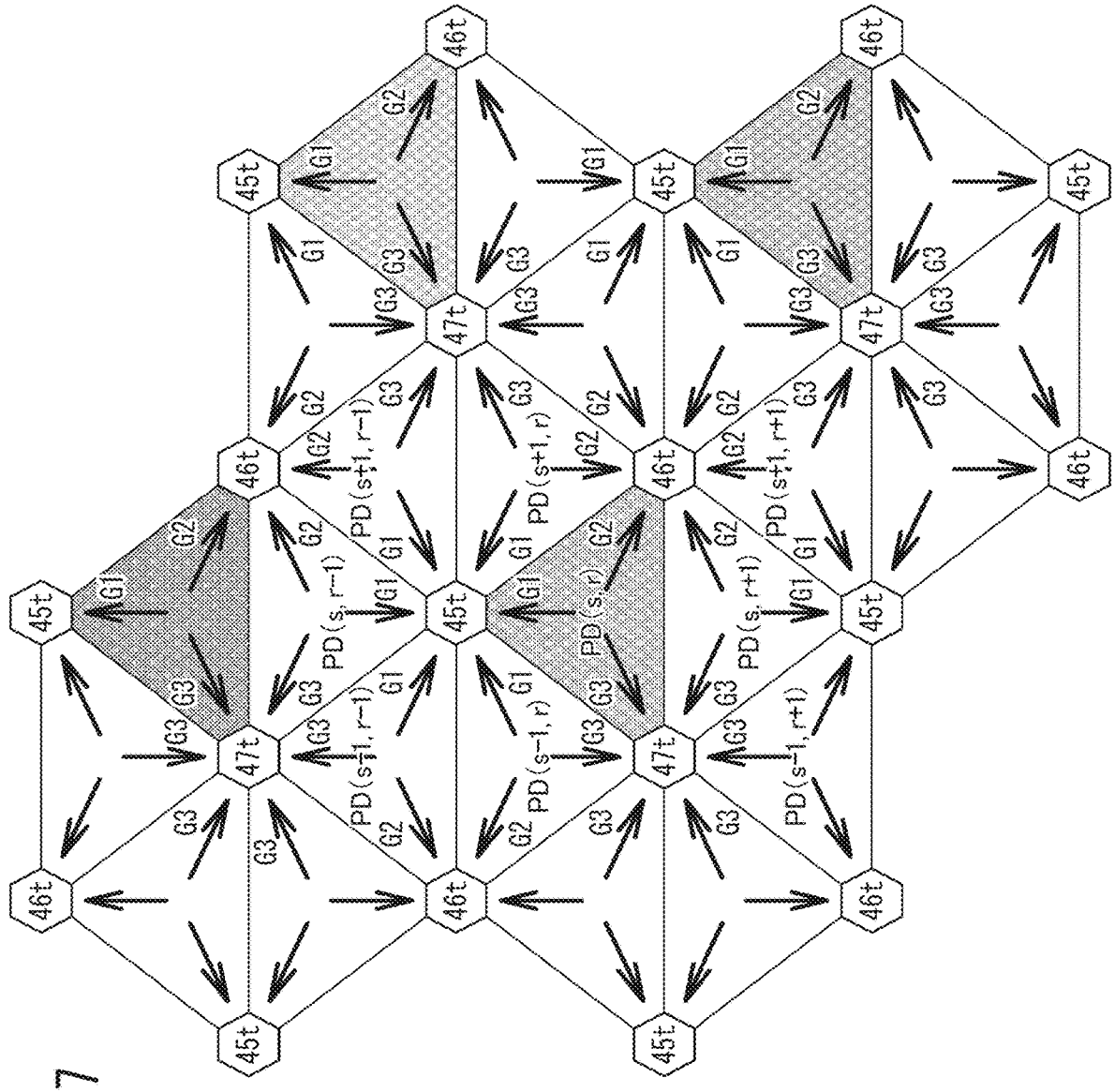
FIG. 27 is a schematic plan view explaining a broad and rough topology in a part of a pixel-array area, in which triangular virtual-pixel units are tiled, as another example of a solid-state imaging device pertaining to another embodiment.
Figure 28:
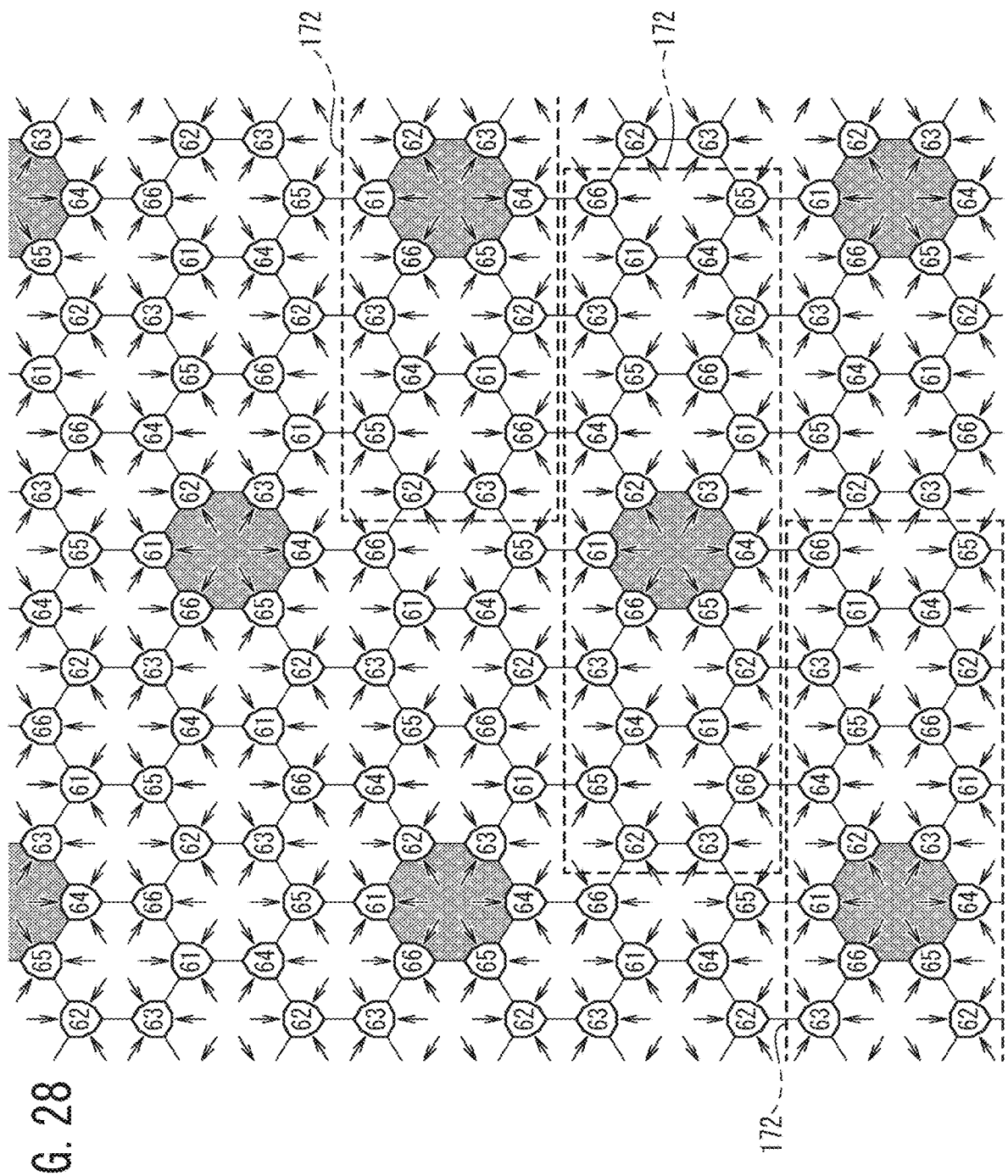
FIG. 28 is a schematic plan view explaining a broad and rough topology in a part of a pixel-array area, in which hexagonal virtual-pixel units are tiled, as a still another example of a solid-state imaging device pertaining to a still another embodiment, and illustrates a periodic array of unit cells.

In the light of "the regular tessellation shape of Pythagoras", the shape of the photodiode PD may be triangle illustrated in FIG. 27 or hexagon illustrated in FIG. 28, although the cases of tetragon are explained as the planar patterns of the photodiodes $PD_{i,j}$, each of which constructs the constituent element in the pixel of the virtual-pixel unit $X_{i,j}$ for transfer-route controlling-scheme. FIG. 27 illustrates a tessellated topology of the virtual-pixel units with regular triangles, the regular triangle is one kind of "tessellating shape" in geometric mathematics. Each pixel encompasses single photodiode PD and triple transfer-control elements connected to the photodiode PD. In each triangle of the virtual-pixel unit, first to third ordinal numbers (ordinal numerals) are labeled respectively to the triple transfer-control elements, which are classified into the first transfer-control element G1, the second transfer-control element G2 and the third transfer-control element G3, respectively, so that the pixel for triple-tap architecture can be implemented. The first transfer-control element G1, the second transfer-control element G2 and the third transfer-control element G3 control the transfer routes and the transfer directions of the signal charges corresponding to the triple taps, independently of each other.

In the central portion in FIG. 27, a same-ordinal-number encircled-space of regular hexagon, which is surrounded by each of sextuple adjacent first transfer-control elements G1, is re-assigned as "a first intersection-shared site 45t". The first intersection-shared site 45t is a space whose center is allocated at an intersection point of meshes defined by outlines of sextuple virtual-pixel units, and the intersection point is shared. In an arrangement of regular triangles, sextuple vertices of triangles contact with one intersection point, as illustrated in FIG. 27. The first intersection-shared site 45t is a space having a shape of regular hexagon, the outline of which is defined by lines chamfering the vertices of sextuple triangles. Here, the corresponding first transfer-control elements G1 of the sextuple virtual-pixel units are assigned to each of the vertices of sextuple triangles, as illustrated in FIG. 27. The first intersection-shared site 45t is surrounded by a photodiode PD (s, r), a photodiode PD (s+1, r), a photodiode PD (s+1, r−1), a photodiode PD (s, r−1), a photodiode PD (s−1, r−1) and a photodiode PD (s−1, r) (r=1 to $m_3$ and s=1 to $n_3$: each of the $m_3$ and the $n_3$ is positive integers of two or more).

Similarly, a same-ordinal-number encircled-space of a regular hexagon surrounded by sextuple adjacent second transfer-control elements G2 is re-assigned as "a second intersection-shared site 46t". The second intersection-shared site 46t is a space whose center is allocated at an intersection point of meshes defined by outlines of sextuple virtual-pixel units, and the intersection point is shared. The second intersection-shared site 46t is a space having a shape of regular hexagon, which is delineated by lines chamfering the vertices of sextuple triangles, at each of vertices respective second transfer-control elements G2 of the sextuple virtual-pixel units are mating toward the intersection point of the meshes illustrated in FIG. 27. Moreover, a same-ordinal-number encircled-space of a regular hexagon surrounded by the sextuple adjacent third transfer-control elements G3 is re-assigned as "a third intersection-shared site 47t". The third intersection-shared site 47t is a space whose center is allocated at an intersection point of meshes defined by outlines of sextuple virtual-pixel units, and the intersection point is shared. The third intersection-shared site 47t is a space having a shape of regular hexagon, which is delineated by lines chamfering the vertices of sextuple triangles, at each of vertices respective third transfer-control elements G3 of the sextuple virtual-pixel units are mating toward the intersection point of the meshes illustrated in FIG. 27.

Because the triple vertices, at each of which the first transfer-control element G1, the second transfer-control element G2 and the third transfer-control element G3 are assigned respectively, are chamfered and cut away, respectively, each of the outer shapes of the photodiodes PD (s, r), PD (s+1, r) and PD (s+1, r+1) . . . is defined as irregular hexagon. As can be understood from FIG. 27, there are two topologies of tessellations, which encompass first tiles of irregular hexagons occupied by the photodiode PD (s, r) (s=1 to $m_3$ and r=1 to $n_3$: each of the $m_3$ and the $n_3$ is positive integers of two or more) and second tiles of regular hexagons occupied by the first intersection-shared site 45t, the second intersection-shared site 46t and the third intersection-shared site 47t. As illustrated in FIG. 27, even in a topology of the virtual-pixel unit constructing regular triangles, similarly to the first to fourth embodiments, the sextuple switching elements are arranged in all of the first intersection-shared site 45t, the second intersection-shared site 46t and the third intersection-shared site 47t, respectively, and the sextuple switching elements are operated so as to facilitate the binning performances in the first intersection-shared site 45t, the second intersection-shared site 46t and the third intersection-shared site 47t. By the way, in the above explanations, the virtual-pixel unit is not limited to the regular triangle and may be an isosceles triangle. In the topology of isosceles triangle, the entire pixel area shall be enlarged or miniaturized along left-right direction or upper-lower direction in FIG. 27.

Figure 29:
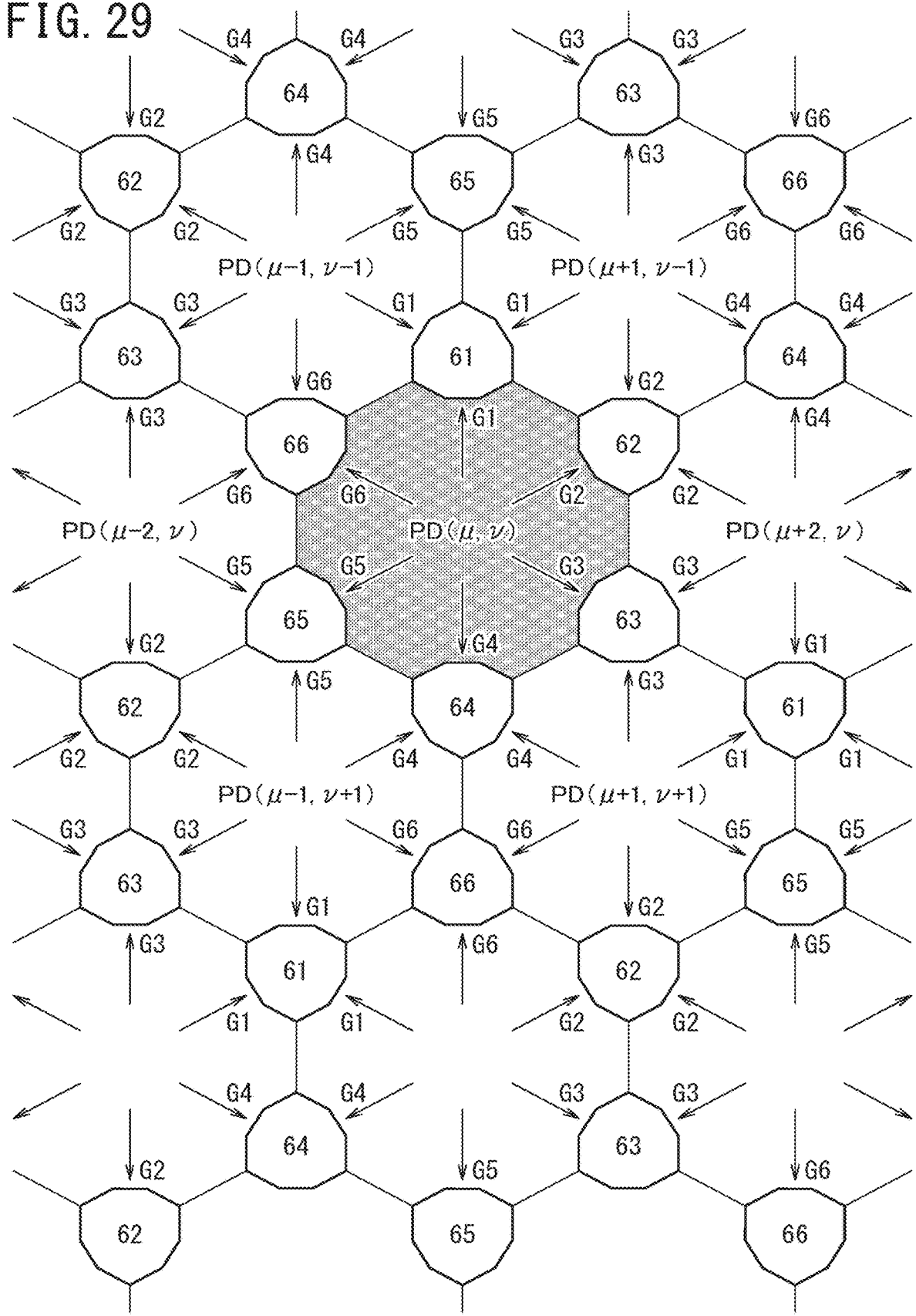
FIG. 29 is a schematic plan view illustrating a part of FIG. 28, which is enlarged.

FIG. 28 and FIG. 29 illustrate tessellation topologies of the arrangements of the virtual-pixel units implemented by regular hexagons, the regular hexagon is one kind of "tessellating shape" in geometric mathematics. As illustrated in FIG. 29, which is the enlarged view of FIG. 28, each pixel encompasses single photodiode PD and sextuple transfer-control elements connected to the photodiode PD. The first to sixth ordinal numbers (ordinal numerals) are labeled respectively to the sextuple transfer-control elements, which are classified into the first transfer-control element G1, the second transfer-control element G2, the third transfer-control element G3, . . . , the sixth transfer-control element G6. Consequently, the sextuple-tap pixel is implemented. The first transfer-control element G1 to the sixth transfer-control element G6 control the transfer routes and the transfer directions of the signal charges corresponding to the sextuple taps, independently of each other.

On an upper side around the center in FIG. 29, a same-ordinal-number encircled-space of an irregular nonagon surrounded by adjacent triple first transfer-control elements G1 is re-assigned as "a first intersection-shared site 61". The first intersection-shared site 61 is a space whose center is allocated at an intersection point of meshes defined by outlines of triple virtual-pixel units, and the intersection point is shared. The first intersection-shared site 61 is a space of the irregular nonagon re-assigned by lines chamfering respectively the vertices of triple virtual-pixel units with triple lines, as illustrated in FIG. 29. At each of the vertices of the triple virtual-pixel units, the first transfer-control elements G1 of the triple virtual-pixel units are located, respectively. The first intersection-shared site 61 is surrounded by a photodiode PD (μ, ν), a photodiode PD (μ+1, ν−1) and a photodiode PD (μ−1, ν−1) (μ=1 to $m_4$ and ν=1 to $n_4$: each of the $m_4$ and the $n_4$ is positive integers of two or more).

Similarly, a same-ordinal-number encircled-space of an irregular nonagon surrounded by adjacent triple second transfer-control elements G2 is re-assigned as "a second intersection-shared site 62" in a lower-right direction of the first intersection-shared site 61. The second intersection-shared site 62 is a space whose center is allocated at an intersection point of meshes defined by outlines of triple virtual-pixel units, and the intersection point is shared. The second intersection-shared site 62 is a space of the irregular nonagon re-assigned by lines, which chamfer respectively the vertices of triple virtual-pixel units with triple lines, at each of vertices of the virtual-pixel units, the second transfer-control element G2 of the triple virtual-pixel units are mating, respectively, toward the intersection point of the meshes illustrated in FIG. 29. The second intersection-shared site 62 is surrounded by a photodiode PD (μ, ν), a photodiode PD (μ+2, ν) and a photodiode PD (μ+1, ν−1).

Moreover, a same-ordinal-number encircled-space of an irregular nonagon surrounded by adjacent triple third transfer-control elements G3 is re-assigned as "a third intersection-shared site 63" at a location under the second intersection-shared site 62. The third intersection-shared site 63 is a space whose center is allocated at an intersection point of meshes defined by outlines of the triple virtual-pixel units, and the intersection point is shared. The third intersection-shared site 63 is a space of the irregular nonagon re-assigned by lines, which chamfer respectively the vertices of triple virtual-pixel units with triple lines, at each of vertices of the virtual-pixel units, third transfer-control element G3 of the triple virtual-pixel units are mating, respectively, toward the intersection point of the meshes illustrated in FIG. 29. The third intersection-shared site 63 is surrounded by a photodiode PD (μ, ν), a photodiode PD (μ+1, ν+1) and a photodiode PD (y+2, v).

Similarly, "a fourth intersection-shared site 64" of an irregular nonagon surrounded by adjacent triple fourth transfer-control elements G4, "a fifth intersection-shared site 65" of an irregular nonagon surrounded by adjacent triple fifth transfer-control elements G5, and "a sixth intersection-shared site 66" of an irregular nonagon surrounded by adjacent triple sixth transfer-control elements G6 are defined. Since triple vertex points at which the first transfer-control element G1 to the sixth transfer-control element G6 are located are chamfered and cut away with triple lines, respectively, an outer shape of a photodiode PD (μ, ν) formed by an irregular tetraicosagon is defined (μ=1 to $m_4$ and ν=1 to $n_4$: each of the $m_4$ and the $n_4$ is positive integers of two or more).

As can be understood from FIG. 29, there are two topologies of tessellation which encompass a first tiling shape of the irregular tetraicosagon occupied by the photodiode PD (μ, ν) and a second tiling shape of an irregular nonagon occupied by the first intersection-shared site 61 to the sixth intersection-shared site 66. As can be understood from FIG. 28, in a topology of the virtual-pixel units of regular hexagon, a unit cell 172, which includes 12×2=24 pieces of intersection-shared sites, is defined as a unit of a periodic pattern, and the unit cells 172 are deployed in the pixel-array area 1 illustrated in FIG. 2, in which the respective virtual-pixel units are repeatedly arranged. As illustrated in FIG. 29, even in the topology of the virtual-pixel unit constructed by regular hexagon, similarly to the first to fourth embodiments, the binning operation is possible in all the first intersection-shared site 61 to the sixth intersection-shared site 66, by arranging the switching elements in all of the first intersection-shared site 61 to the sixth intersection-shared site 66 and driving the switching elements.

The tessellation is possible even in Penrose tiling using two-shapes of rhombuses. However, a periodic pattern does not appear in the Penrose tiling. In a topology of non-periodic tessellation such as the Penrose tiling, because logical circuits for driving and reading out cannot be implemented, and signal lines cannot be routed, two-dimensional solid-state imaging device cannot be constructed practically. However, even with shapes other than the regular tessellation shape, in a topology by which a periodic pattern appears with the edge-to-edge tiling, and if the required number of taps corresponding to the periodic pattern can be assigned, the construction of the two-dimensional solid-state imaging device can be achieved.

Figure 30:
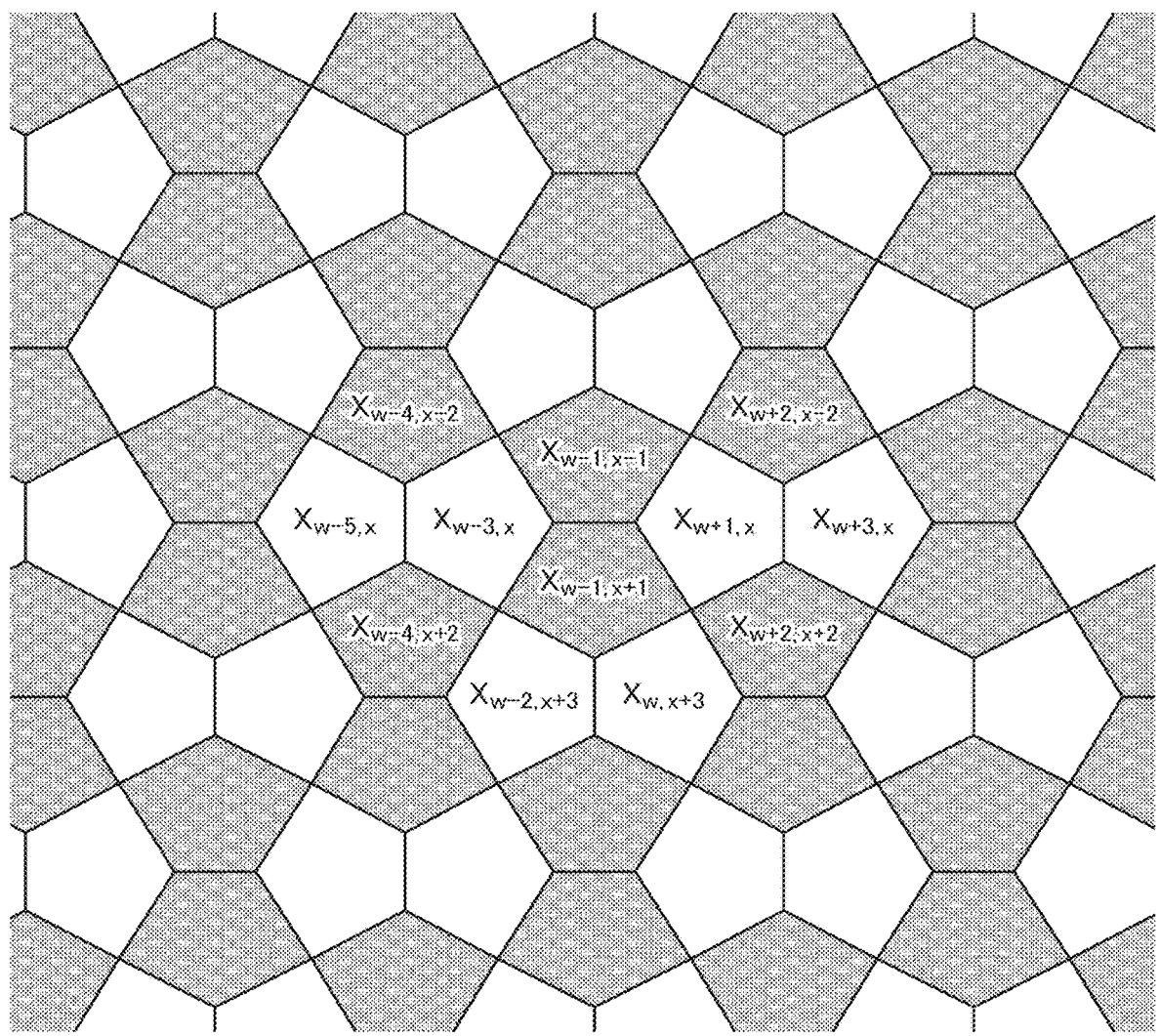
FIG. 30 is a schematic plan view explaining a broad and rough topology in a part of a pixel-array area, in which pentagonal virtual-pixel units are tiled, as a yet still another example of a solid-state imaging device pertaining to a yet still another embodiment.
Figure 31:
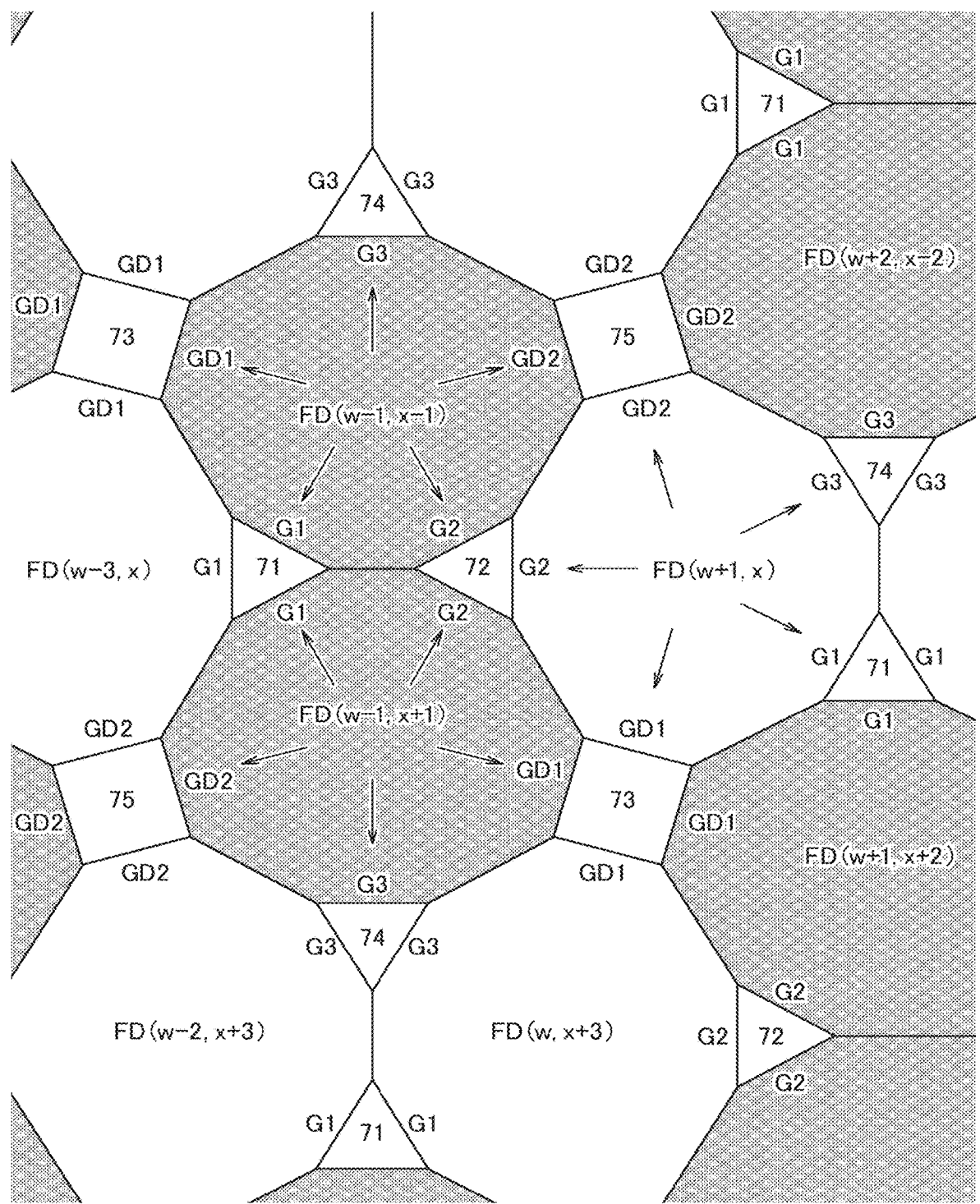
FIG. 31 is a schematic plan view illustrating a part of FIG. 30, which is enlarged.

Regarding a convex pentagon that enables the tessellation, fifteenth pentagonal tiling was discovered for the first time in 30 years, in 2015. A research paper proving that nothing exists except for the fifteenth pentagonal tiling shape is also submitted. FIGS. 30 and 31 illustrate topologies of pentagonal tessellation as one of the examples in fifteen shapes of the pentagonal tiling.

Each of FIG. 30 and FIG. 31 illustrates a topology of tessellation with the virtual-pixel units shaped by irregular pentagon. As illustrated in FIG. 31, which is the enlarged view of FIG. 30, each pixel encompasses single photodiode PD and quintuple transfer-control elements connected to the photodiode PD. In the quintuple transfer-control elements, first to third ordinal numbers are classified and labeled to triple transfer-control elements, and another first and second ordinal numbers are classified and labeled to double charge-exhaust elements, respectively. Namely, a group of a first transfer-control element G1, a second transfer-control element G2 and a third transfer-control element G3, and another group of a first charge-exhaust element GD1 and a second charge-exhaust element GD2 are classified to implement a triple-tap and double-charge-exhaust-element (DCEE) pixel. The first transfer-control element G1 to the third transfer-control element G3 control the transfer routes and the transfer directions of the signal charges corresponding to the triple taps, independently of each other, and the first charge-exhaust element GD1 and the second charge-exhaust element GD2 exhaust the charges other than signal charges, which are generated by background light or by environment light, to the power supply.

A same-ordinal-number encircled-space having a shape of triangle, which is surrounded by adjacent triple first transfer-control elements G1, is re-assigned as "a first intersection-shared site 71" on a left side around the center in FIG. 31. The first intersection-shared site 71 is a space whose center is allocated at an intersection point of meshes defined by outlines of triple virtual-pixel units, and the intersection point is shared. The first intersection-shared site 71 is a space having shape of triangle, a space for the triangle is re-assigned by triple lines, which chamfer respectively the vertices of triple virtual-pixel units, at each of vertices of the virtual-pixel units, first transfer-control elements G1 of the triple virtual-pixel units are located as illustrated in FIG. 31. The first intersection-shared site 71 is surrounded by a photodiode PD (w−1, x+1), a photodiode PD (w−1, x−1) and a photodiode PD (w−3, x) (w=1 to $m_5$ and x=1 to $n_5$: each of the $m_5$ and the $n_5$ is positive integers of two or more).

Similarly, a same-ordinal-number encircled-space having a shape of triangle, which is surrounded by adjacent triple second transfer-control elements G2, is re-assigned as "a second intersection-shared site 72". The second intersection-shared site 72 is a space whose center is allocated at an intersection point of meshes defined by outlines of triple virtual-pixel units, and the intersection point is shared. The second intersection-shared site 72 is a space having shape of triangle, a space for the triangle is re-assigned by triple lines, which chamfer respectively the vertices of triple virtual-pixel units, at each of vertices of the virtual-pixel units, second transfer-control elements G2 of the triple virtual-pixel units are located toward the intersection point of the meshes illustrated in FIG. 31. The second intersection-shared site 72 is surrounded by a photodiode PD (w−1, x+1), a photodiode PD (w+1, x) and a photodiode PD (w−1, x−1).

Next, "a third intersection-shared site 73" of a tetragon surrounded by quadruple adjacent first transfer-control elements GD1 is defined as "a first exhaust site". The third intersection-shared site 73 is a space whose center is allocated at an intersection point of meshes defined by quadruple outlines of quadruple virtual-pixel units, and the intersection point is shared. The third intersection-shared site 73 is the space of the tetragon re-assigned by lines, which chamfer respectively the vertices of quadruple virtual-pixel units, at each of vertices of the virtual-pixel units, first charge-exhaust element GD1 of the quadruple virtual-pixel units are located toward the intersection point of the meshes illustrated in FIG. 31. The third intersection-shared site 73 is surrounded by a photodiode PD (w−1, x+1), a photodiode PD (w+1, x), a photodiode PD (w+1, x+2) and a photodiode PD (w, x+3).

Moreover, a same-ordinal-number encircled-space having a shape of triangle, which is surrounded by adjacent triple third transfer-control elements G3 is re-assigned as "a fourth intersection-shared site 74". The fourth intersection-shared site 74 is a space whose center is allocated at an intersection point of meshes defined by outlines of triple virtual-pixel units, and the intersection point is shared. The fourth intersection-shared site 74 is a space having shape of triangle, a space for the triangle is re-assigned by triple lines, which chamfer respectively the vertices of triple virtual-pixel units, at each of vertices of the virtual-pixel units, third transfer-control element G3 of the quadruple virtual-pixel units are mating, respectively, toward the intersection point of the meshes illustrated in FIG. 31. The fourth intersection-shared site 74 is surrounded by a photodiode PD (w−1, x+1), a photodiode PD (w, x+3) and a photodiode PD (w−2,x+3).

Moreover, "a fifth intersection-shared site 75" of a tetragon, which is surrounded by quadruple adjacent second transfer-control elements GD2, is defined as "a second exhaust site". The fifth intersection-shared site 75 is a space whose center is allocated at an intersection point of meshes defined by quadruple outlines of quadruple virtual-pixel units, and the intersection point is shared. The fifth intersection-shared site 75 is the space of the tetragon re-assigned by lines, which chamfer respectively the vertices of quadruple virtual-pixel units, at each of vertices of the virtual-pixel units, second charge-exhaust elements GD2 of the quadruple virtual-pixel units are mating, respectively, toward the intersection point of the meshes illustrated in FIG. 31. The fifth intersection-shared site 75 is surrounded by a photodiode PD (w−1, x+1), a photodiode PD (w+1, x), a photodiode PD (w−2, x+3), a photodiode PD (w−4, x+2) and a photodiode (w−3, x), as can be understood from FIG. 30.

Since the quintuple vertex points at which the first transfer-control element G1, the second transfer-control element G2 and the third transfer-control element G3 and the first charge-exhaust element GD1 and the second charge-exhaust element GD2 are located are chamfered and cut away, respectively, an outer shape of a photodiode PD (w, x) formed by an irregular decagon is defined (w=1 to $m_5$ and x=1 to $n_5$: each of the $m_5$ and the $n_5$ is positive integers of two or more). As can be understood from FIG. 31, there are triple tessellation topologies which encompass a first tiling shape of the irregular decagon occupied by the photodiode PD (w, x), a second tiling shape of a triangle occupied by the first intersection-shared site 71, the second intersection-shared site 72 and the fourth intersection-shared site 74, and a third tiling shape of a tetragon occupied by the third intersection-shared site 73 and the fifth intersection-shared site 75.

As illustrated in FIG. 31, even in the topology of the virtual-pixel unit constructing the irregular pentagon, similarly to the first to fourth embodiments, the binning operation is possible in all of the first intersection-shared site 71, the second intersection-shared site 72 and the fourth intersection-shared site 74, by arranging the switching elements in all of the first intersection-shared site 71, the second intersection-shared site 72 and the fourth intersection-shared site 74 and then driving the switching elements.

In the explanation in FIG. 31, the charge-exhaust mechanisms are arranged in the first charge-exhaust element GD1 and the second charge-exhaust element GD2, which are surrounded by the quadruple virtual-pixel units. However, the first charge-exhaust element GD1 and the second charge-exhaust element GD2 can be used for individual and binning readouts of the charges from the corresponding quadruple virtual-pixel units. If the first charge-exhaust element GD1 and the second charge-exhaust element GD2 are applied to the individual readout operation and the binning readout operation from the quadruple virtual-pixel units, in order to match the amounts of pixel-summed signals from the quadruple virtual-pixel units with the pixel-summed signals from the triple virtual-pixel units, the amount of signals from the quadruple virtual-pixel units may be multiplied by ¾.

In the present specification, explanations are omitted for the pentagonal tessellations with other fourteen tiling shapes other than the pentagon illustrated in FIGS. 30 and 31. However, similarly to the example illustrated in FIG. 31, pixel topologies for triple-pixel summing operation and pixel topologies for quadruple-pixel summing operation can be made to have the periodicity of patterns by the pentagonal tessellations. Thus, the pentagons of the other fourteen tiling shapes can be used to build up the two-dimensional arrays of the solid-state imaging devices.

Regarding the periodicities in the patterns of mathematically possible fifteen pentagonal tessellations, a repetition of units, each unit encompassing quadruple sets of triple virtual-pixel units, can be selected as understood from FIGS. 30 and 31, the triple virtual-pixel units are gathered to intersection-shared site so that triple vertices of the triple virtual-pixel units can contact to the intersection-shared site. Alternatively, another repetition of units, each unit encompassing a set of quadruple virtual-pixel units, can be selected, the quadruple virtual-pixel units are gathered to intersection-shared site so that quadruple vertices of the quadruple virtual-pixel units can contact to the intersection-shared site.

In a pattern, in which a repetition period is long and an array direction is diagonal, that makes the signal-driving and reading-out interconnections complicated, by devising and creating a layout in which the pattern is rotated by 45 degrees, it is possible to select the array in which the wirings are substantially horizontal and vertical. When a drop in an area occupation efficiency is allowed, and the perfect tessellation for the two-dimensional array of pixels is not always required, by installing a small vacant lot, with various arrays of wirings running along horizontal and vertical direction, various topologies may be created for building up various solid-state imaging devices.

As mentioned above, in the pentagon and the hexagon, there is the type enabling the tessellation in which no gap is generated. However, tessellation does not exist for convex polygons equal to or more than a heptagon is known in the geometric mathematics. Regarding the convex hexagon in which the tessellation is possible so as not to generate any gap such as a small triangle and others, the mathematician Karl August Reinhardt presented only three types of convex hexagons can be tiled in 1918, and he has proved that no other hexagon did not exist in monohedral tessellation with the convex hexagons.

On the other hand, in all shapes of parallelograms, the monohedral tessellation is possible even by a single fixed shape and size of tile. Also, in all shapes of triangles, a combination of two congruent triangles can form a parallelogram. Thus, in all triangles, the monohedral tessellation is possible in such a way that sextuple vertices contact with intersections. When the monohedral tessellation is possible so as not to generate any gap, the intersection-shared site can be defined, which enables the binning in the intersection-shared site similarly to the first to fourth embodiments.

A parallel hexagon can be divided into two congruent pentagons by a straight line passing through a center. Therefore, with the divided pentagons, the monohedral tessellation is possible, as can be understood from FIG. 30. Thus, as to the structures of the pixels, triple-tap-DCEE architecture, quintuple-tap-SCEE architecture, or sextuple-tap architecture or the like can be used, although the explanations are focused to the examples of pixels for quadruple-tap architecture or triple-tap-SCEE architecture in the first to fourth embodiments.

When "L" is defined as positive integers of three or more, let's consider a case in which L pieces of vertices of virtual-pixel units contact with each other at an intersection point of tessellated meshes, which are implemented by outer shapes of the virtual-pixel units, as more general example. In the monohedral tessellation of the virtual-pixel units each of which has the L pieces of vertices, triple or quadruple vertices contact at the intersection point of the tessellated meshes. When M=L pieces of low-resistivity regions are arranged respectively at each of the L pieces of intersection-shared sites, the shape of intersection-shared sites is defined by a pattern recessing each of the L pieces of vertices, respectively, as explained in the first to fourth embodiments, it is possible to provide a solid-state imaging device of M=L-tap architecture. When a single charge-exhaust element is disposed at one of the L pieces of vertices, it is possible to provide a solid-state range-imaging device of M=(L−1)-tap architecture. Thus, "M" shall be positive integers of two or more.

However, when M=2L pieces of low-resistivity regions are arranged in each of the L pieces of intersection-shared sites, it is possible to provide a solid-state range-imaging device of 2L-tap architecture, and when one charge-exhaust element is disposed at one of the L pieces of vertices, it is possible to provide a solid-state range-imaging device of (2L−1)-tap T) architecture. As illustrated in FIG. 31, when double charge-exhaust elements are disposed in each pixel, it is possible to provide a solid-state range-imaging device of M=2 (L−2)-tap architecture. Similarly, when 3L pieces of low-resistivity regions are arranged in each of the L pieces of intersection-shared sites, it is possible to provide a solid-state range-imaging device of 3L-tap architecture, (3L−1)-tap architecture or 3(L−2)-tap architecture.

For example, when each of the apexes of the virtual-pixel units in FIG. 25 is recessed into a concave portion having triple sides intersecting at an angle of 135 degrees and a single low-resistivity region constructing the charge detector is arranged on each of the triple sides implemented by the recessed concave, triple low-resistivity regions can be arranged at each of the recessed vertices. However, even in a case that each pixel is implemented by M=3-tap architecture as illustrated in FIG. 27, N=2M=6 pieces of charge detectors are arranged in each of the intersection-shared sites 45t, 46t and 47t. On the other hand, even in a case that each pixel is M=6-tap architecture as illustrated in FIG. 29, N=3 pieces of charge detectors are arranged in each of the intersection-shared sites 61 to 66. Thus, the "N" are positive integers of three or more. Hence, the number L of the vertices of the polygon constructing the virtual-pixel units establishing the tessellating shape, the piece number M of the taps and the piece number N of the charge detectors arranged in the intersection-shared sites are not required to coincide with each other.

Moreover, in the explanations of the first embodiments and the like as already described, the first conductivity type is explained as p-type, and the second conductivity type is explained as n-type. However, even if the first conductivity type is assumed to be n-type and the second conductivity is assumed to be p-type, it may be easily understood that the similar effectiveness can be achieved by making the electric polarities opposite to each other.

In this way, naturally, the present invention encompasses various embodiments and the like that are not described here. Thus, the technical scopes of the present invention should be determined only by the technical features specifying the invention prescribed by following Claims, conceivable and reasonable from the above explanations.

REFERENCE SIGNS LIST

1 . . . pixel-array area, 11 . . . imaging system, 12 . . . light source, 13 . . . image-generating optical-system, 14 . . . TOF solid-state imaging device, 15 . . . image processor, 16 . . . object, 17 . . . irradiated light, 18 . . . reflection light, 22 . . . vertical scanner, 23 . . . horizontal scanner, 24 . . . signals processor, 25 . . . controller

The invention claimed is:

1. A solid-state imaging device including a plurality of virtual pixels implemented by pixels of transfer-route controlling-scheme, each of the virtual pixels having a shape of polygon, polygons being tessellated in a pixel-array area, each of the virtual pixels comprising:
a photoelectric-conversion region;
a plurality of charge detectors to which ordinal numbers are labeled in order, configured to accumulate signal charges transferred from the photoelectric-conversion region; and
a plurality of transfer-control circuits configured to control movement of signal charges from the photoelectric-conversion region to one of the charge detectors,
wherein arrangement of polygons further comprising a plurality of intersection-shared sites, each of the intersection-shared sites is surrounded by the charge detectors, which have a same ordinal number and are disposed respectively at vertices of the polygons, such that respective vertices of the polygons are in contact with an intersection point of meshes implemented by outer shapes of the virtual pixels, the intersection point is allocated in a center of each of the intersection-shared sites, a space of each of the intersection-shared sites is provided to a cut-away space generated by cutting away each of the vertices mating toward the intersection point, the plurality of intersection-shared sites are periodically arranged, and a plurality of photodiodes, each of which includes the photoelectric-conversion region, are arranged in a remaining space of the cut-away space in the virtual pixels so that a tessellation topology of the polygons is divided and re-assigned to the cut-away space and the remaining space,
wherein, when "N" is a positive integer of three or more, N pieces of the charge detectors of a same ordinal number are arranged in each boundary between the photodiodes and the intersection-shared sites, and
each of the intersection-shared sites includes:
N switching circuits, each having first main electrode being connected to the charge detectors, respectively in order, and
a common signal-readout circuit having input terminals connected to a second main electrode of each of the switching circuits.

2. The solid-state imaging device of claim 1, wherein a planar two-dimensional pattern which includes a plurality of the intersection-shared sites, each of the included intersection-shared sites is assigned with a different ordinal number, is defined as a unit cell, and a plurality of the unit cells is periodically arranged in the pixel-array area.

3. The solid-state imaging device of claim 2, wherein columns in arrays of unit cells are repeatedly displaced from each other in a column direction, by a length corresponding to a side length of a virtual pixel, with respect to adjacent columns.

4. The solid-state imaging device of claim 2,
wherein the unit cell includes a set of two-by-two intersection-shared sites, and
an array of the intersection-shared sites, included in the unit cell, is an array of parallelograms, each of shapes of the parallelograms has been generated by perturbation of topology with displacement by a length corresponding to a half of side length of a virtual pixel along an upper-lower direction, between left and right adjacent virtual pixels.

5. The solid-state imaging device of claim 1, wherein each of the virtual pixels further comprises a low-resistivity region operating as a charge-exhaust element for exhausting charges other than the signal charges, in addition to low-resistivity regions operating as the charge detectors, respectively,
each of low-resistivity regions including the low-resistivity region operating as the charge-exhaust element and the low-resistivity regions, operating as the charge detectors, is labeled with increasing ordinal numbers, such that a number corresponding to increased piece of the charge-exhaust element is added to already labeled ordinal numbers to the charge detectors,
wherein the increasing ordinal numbers are arranged to surround a periphery of the intersection-shared sites, in each of boundaries between the photodiodes and the intersection-shared sites, so that each of the low-resistivity regions can be arranged on each of the boundaries, and
the switching circuits are prepared with numbers corresponding to the increasing ordinal numbers so that each of the switching circuits are connectable to the low-resistivity regions, respectively.

6. The solid-state imaging device of claim 5, wherein a planar two-dimensional pattern, which includes a specific number of the intersection-shared sites, is defined as a unit cell,
wherein the specific number corresponds to the increasing ordinal number, each of the included intersection-shared sites, prepared with the specific number, is arranged adjacently at a position labeled by the increasing ordinal number, and
a plurality of the unit cells is periodically arranged in the pixel-array area.

7. The solid-state imaging device of claim 1, further comprising:
a horizontal scanner disposed around the pixel-array area, configured to drive the switching circuits and the common signal-readout circuit, respectively, and
a controller circuit disposed around the pixel-array area, configured to drive the horizontal scanner by switching between a mode by which signals from the plurality of charge detectors arranged in the respective intersection-shared sites are read out individually in turn, and a mode for reading out signals from the plurality of charge detectors at a same time.

8. An imaging system comprising:
a light source configured to project irradiated light onto an object; and
a solid-state imaging device including a plurality of virtual pixels implemented by pixels of transfer-route controlling-scheme, each of the virtual pixels having a shape of polygon, the polygons are tessellated in a pixel-array area, each of the virtual pixels including:
a photoelectric-conversion region into which a reflection light is directed, the reflection light is ascribable to the irradiation light reflected by the object;
a plurality of charge detectors to which ordinal numbers are labeled in order, configured to accumulate signal charges transferred from the photoelectric-conversion region; and
a plurality of transfer-control circuits configured to control movement of signal charges from the photoelectric-conversion region to one of the charge detectors,
wherein arrangement of polygons includes a plurality of intersection-shared sites, each of the intersection-shared sites is surrounded by the charge detectors, which have a same ordinal number and are disposed respectively at vertices of the polygons, such that respective vertices of the polygons are in contact with an intersection point of meshes implemented by outer shapes of the virtual pixels, the intersection point is allocated in a center of each of the intersection-shared sites, a space of each of the intersection-shared sites is provided to a cut-away space generated by cutting away each of the vertices mating toward the intersection point, the plurality of intersection-shared sites are periodically arranged, and a plurality of photodiodes, each of which includes the photoelectric-conversion region, are arranged in a remaining space of the cut-away space in the virtual pixels so that a tessellation topology of the polygons is divided and re-assigned to the cut-away space and the remaining space,
wherein, when "N" is positive integer of three or more, N pieces of the charge detectors of the same ordinal number are arranged in each boundary between the photodiodes and the intersection-shared sites, and
each of the intersection-shared sites includes:
N switching circuits, each having first main electrode being connected to the charge detectors, respectively in order, and
a common signal-readout circuit having input terminals connected to a second main electrode of each of the switching circuits.

9. An imaging method with a solid-state imaging device having a tessellation topology with an array of polygons, each of the polygons is defined as a virtual pixel, which has a pixels of transfer-route controlling-scheme, the tessellation topology of the polygons is re-assigned to a cut-away space for intersection-shared sites having an intersection point of meshes implemented by outer shapes of the virtual pixels at a center, and a remaining space of the cut-away space for photodiodes, each of the intersection-shared sites is provided in cut-away space generated by cutting away each vertices of the polygons mating toward the intersection point, the method including:
switching, in each of the intersection-shared sites, where "N" is positive integers of three or more, between:
a mode of sequentially reading out N sets of individual signals from N pieces of charge detectors labeled with same ordinal number, each of the charge detectors is arranged in a boundary between the photodiodes and the intersection-shared sites, and a mode of simultaneously reading out N sets of individual signals.

10. The method of the claim 9, further including:
irradiating light from a light source to an object, and
before the mode of sequentially reading out, accumulating signal charges in the charge detectors respectively at timings differing from each other, by using transfer-control circuits independent of each other, the signal charges are generated in the photodiode by reflection light, which is the irradiation light reflected by the object.

11. The solid-state imaging device of claim 2, further comprising:
a horizontal scanner disposed around the pixel-array area, configured to drive the switching circuits and the common signal-readout circuit, respectively, and
a controller circuit disposed around the pixel-array area, configured to drive the horizontal scanner by switching between a mode by which signals from the plurality of charge detectors arranged in the respective intersection-shared sites are read out individually in turn, and a mode for reading out signals from the plurality of charge detectors at a same time.

12. The solid-state imaging device of claim 3, further comprising:
a horizontal scanner disposed around the pixel-array area, configured to drive the switching circuits and the common signal-readout circuit, respectively, and
a controller circuit disposed around the pixel-array area, configured to drive the horizontal scanner by switching between a mode by which signals from the plurality of charge detectors arranged in the respective intersection-shared sites are read out individually in turn, and a mode for reading out signals from the plurality of charge detectors at a same time.

13. The solid-state imaging device of claim 4, further comprising:
a horizontal scanner disposed around the pixel-array area, configured to drive the switching circuits and the common signal-readout circuit, respectively, and
a controller circuit disposed around the pixel-array area, configured to drive the horizontal scanner by switching between a mode by which signals from the plurality of charge detectors arranged in the respective intersection-shared sites are read out individually in turn, and a mode for reading out signals from the plurality of charge detectors at a same time.

14. The imaging system of claim 8, wherein a planar two-dimensional pattern which includes a plurality of the intersection-shared sites, each of the included intersection-shared sites is assigned with a different ordinal number, is defined as a unit cell, and a plurality of unit cells is periodically arranged in the pixel-array area.

15. The imaging system of claim 14, wherein columns in arrays of the unit cells are repeatedly displaced from each other in a column direction, by a length corresponding to a side length of a virtual pixel, with respect to adjacent columns.

16. The imaging system of claim 14,
wherein the unit cell includes a set of two-by-two intersection-shared sites, and
an array of the intersection-shared sites, included in the unit cell, is an array of parallelograms, each of shapes of the parallelograms has been generated by perturbation of topology with displacement by a length corresponding to a half of side length of a virtual pixel along an upper-lower direction, between left and right adjacent virtual pixels.

17. The imaging system of claim 8, wherein each of the virtual pixels further comprises a low-resistivity region operating as a charge-exhaust element for exhausting charges other than the signal charges, in addition to low-resistivity regions operating as the charge detectors, respectively,
each of low-resistivity regions including the low-resistivity region operating as the charge-exhaust element and the low-resistivity regions, operating as the charge detectors, is labeled with increasing ordinal numbers, such that a number corresponding to increased piece of the charge-exhaust element is added to already labeled ordinal numbers to the charge detectors,
wherein the increasing ordinal numbers are arranged to surround a periphery of the intersection-shared sites, in each of boundaries between the photodiodes and the intersection-shared sites, so that each of the low-resistivity regions can be arranged on each of the boundaries, and
the switching circuits are prepared with numbers corresponding to the increasing ordinal numbers so that each of the switching circuits are connectable to the low-resistivity regions, respectively.

18. The imaging system of claim 17, wherein a planar two-dimensional pattern, which includes a specific number of the intersection-shared sites, is defined as a unit cell,
wherein the specific number corresponds to the increasing ordinal number, each of the included intersection-shared sites, prepared with the specific number, is arranged adjacently at a position labeled by the increasing ordinal number, and
a plurality of the unit cells is periodically arranged in the pixel-array area.

19. The imaging system of claim 8, further comprising:
a horizontal scanner disposed around the pixel-array area, configured to drive the switching circuits and the common signal-readout circuit, respectively, and
a controller circuit disposed around the pixel-array area, configured to drive the horizontal scanner by switching between a mode by which signals from the plurality of charge detectors arranged in the respective intersection-shared sites are read out individually in turn, and a mode for reading out signals from the plurality of charge detectors at a same time.

* * * * *